United States Patent
Shitagaki et al.

(10) Patent No.: US 11,038,135 B2
(45) Date of Patent: Jun. 15, 2021

(54) LIGHT-EMITTING ELEMENT

(71) Applicant: SEMICONDUCTOR ENERGY LABORATORY CO., LTD., Atsugi-shi, Kanagawa-ken (JP)

(72) Inventors: Satoko Shitagaki, Kanagawa (JP); Satoshi Seo, Kanagawa (JP); Nobuharu Ohsawa, Kanagawa (JP); Hideko Inoue, Kanagawa (JP); Masahiro Takahashi, Kanagawa (JP); Kunihiko Suzuki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/283,962

(22) Filed: Feb. 25, 2019

(65) Prior Publication Data
US 2019/0189949 A1 Jun. 20, 2019

Related U.S. Application Data

(63) Continuation of application No. 15/339,016, filed on Oct. 31, 2016, now Pat. No. 10,403,839, which is a
(Continued)

(30) Foreign Application Priority Data

Feb. 16, 2011 (JP) .................... 2011-031426

(51) Int. Cl.
*H05B 33/14* (2006.01)
*H01L 51/50* (2006.01)
(Continued)

(52) U.S. Cl.
CPC ........ *H01L 51/5016* (2013.01); *C09K 11/025* (2013.01); *C09K 11/06* (2013.01);
(Continued)

(58) Field of Classification Search
CPC .................................................. H01L 51/0085
See application file for complete search history.

(56) References Cited

U.S. PATENT DOCUMENTS 5,409,783 A   4/1995   Tang et al.
5,420,288 A   5/1995   Ohta et al.
(Continued)

FOREIGN PATENT DOCUMENTS

CN   001374315 A   10/2002
CN   001413426 A   4/2003
(Continued)

OTHER PUBLICATIONS

Jeon.S et al., "100% internal quantum efficiency and stable efficiency roll-off in phosphorescent light-emitting diodes using a high triplet energy hole transport material", Appl. Phys. Lett. (Applied Physics Letters), Jun. 17, 2008, vol. 93, pp. 063306-1-063306-3.
(Continued)

*Primary Examiner* — Andrew J Coughlin
(74) *Attorney, Agent, or Firm* — Fish & Richardson P.C.

(57) ABSTRACT

Provided is a light-emitting element with high external quantum efficiency, or a light-emitting element with a long lifetime. The light-emitting element includes, between a pair of electrodes, a light-emitting layer including a guest material and a host material, in which an emission spectrum of the host material overlaps with an absorption spectrum of the guest material, and phosphorescence is emitted by conversion of an excitation energy of the host material into an excitation energy of the guest material. By using the overlap between the emission spectrum of the host material and the absorption spectrum of the guest material, the energy smoothly transfers from the host material to the guest material, so that the energy transfer efficiency of the light-
(Continued)

emitting element is high. Accordingly, a light-emitting element with high external quantum efficiency can be achieved.

55 Claims, 38 Drawing Sheets

Related U.S. Application Data continuation of application No. 14/669,599, filed on Mar. 26, 2015, now Pat. No. 9,538,607, which is a continuation of application No. 13/370,676, filed on Feb. 10, 2012, now Pat. No. 8,994,263.

(51) Int. Cl.
*H01L 51/00* (2006.01)
*C09K 11/02* (2006.01)
*C09K 11/06* (2006.01)
*H01L 51/52* (2006.01)

(52) U.S. Cl.
CPC ...... *H01L 51/0072* (2013.01); *H01L 51/0074* (2013.01); *H01L 51/5056* (2013.01); *H01L 51/5072* (2013.01); *H01L 51/5088* (2013.01); *H01L 51/5092* (2013.01); *H01L 51/5218* (2013.01); *H01L 51/5234* (2013.01); *H05B 33/14* (2013.01); *C09K 2211/1007* (2013.01); *C09K 2211/1044* (2013.01); *C09K 2211/185* (2013.01); *H01L 51/006* (2013.01); *H01L 51/0052* (2013.01); *H01L 51/0056* (2013.01); *H01L 51/0058* (2013.01); *H01L 51/0061* (2013.01); *H01L 51/0085* (2013.01); *H01L 2251/55* (2013.01)

(56) References Cited

U.S. PATENT DOCUMENTS

| | | |
|---|---|---|
| 5,597,925 A | 1/1997 | Ohta et al. |
| 5,610,309 A | 3/1997 | Ohta et al. |
| 5,656,401 A | 8/1997 | Ohta et al. |
| 5,709,492 A | 1/1998 | Yasunaga et al. |
| 6,097,147 A | 8/2000 | Baldo et al. |
| 6,451,461 B2 | 9/2002 | Lee et al. |
| 6,515,314 B1 | 2/2003 | Duggal et al. |
| 6,830,828 B2 | 12/2004 | Thompson et al. |
| 6,863,997 B2 | 3/2005 | Thompson et al. |
| 6,869,695 B2 | 3/2005 | Thompson et al. |
| 6,902,830 B2 | 6/2005 | Thompson et al. |
| 6,911,271 B1 | 6/2005 | Lamansky et al. |
| 6,921,915 B2 | 7/2005 | Takiguchi et al. |
| 6,939,624 B2 | 9/2005 | Lamansky et al. |
| 6,951,694 B2 | 10/2005 | Thompson et al. |
| 6,955,856 B2 | 10/2005 | Lee et al. |
| 7,001,536 B2 | 2/2006 | Thompson et al. |
| 7,041,390 B2 | 5/2006 | Seo et al. |
| 7,175,922 B2 | 2/2007 | Jarikov et al. |
| 7,176,307 B2 | 2/2007 | Seo et al. |
| 7,183,010 B2 | 2/2007 | Jarikov |
| 7,238,806 B2 | 7/2007 | Inoue et al. |
| 7,291,406 B2 | 11/2007 | Thompson et al. |
| 7,332,857 B2 | 2/2008 | Seo et al. |
| 7,381,479 B2 | 6/2008 | Lamansky et al. |
| 7,537,844 B2 | 5/2009 | Thompson et al. |
| 7,553,557 B2 | 6/2009 | Thompson et al. |
| 7,553,560 B2 | 6/2009 | Lamansky et al. |
| 7,572,522 B2 | 8/2009 | Seo et al. |
| 7,579,090 B2 | 8/2009 | Brown et al. |
| 7,597,967 B2 | 10/2009 | Kondakova et al. |
| 7,683,363 B2 | 3/2010 | Miteva et al. |
| 7,767,316 B2 | 8/2010 | Deaton et al. |
| 7,771,844 B2 | 8/2010 | Inoue et al. |
| 7,803,468 B2 | 9/2010 | Nariyuki et al. |
| 7,883,787 B2 | 2/2011 | Thompson et al. |
| 7,915,409 B2 | 3/2011 | Inoue et al. |
| 7,943,925 B2 | 5/2011 | Yamazaki |
| 7,993,760 B2 | 8/2011 | Komori et al. |
| 8,008,652 B2 | 8/2011 | Kumaki et al. |
| 8,034,465 B2 | 10/2011 | Liao et al. |
| 8,048,540 B2 | 11/2011 | Inoue et al. |
| 8,053,092 B2 | 11/2011 | Miki et al. |
| 8,084,145 B2 | 12/2011 | Inoue et al. |
| 8,247,086 B2 | 8/2012 | Inoue et al. |
| 8,274,214 B2 | 9/2012 | Ikeda et al. |
| 8,278,444 B2 | 10/2012 | Inoue et al. |
| 8,557,402 B2 | 10/2013 | Thompson et al. |
| 8,569,486 B2 | 10/2013 | Inoue et al. |
| 8,574,726 B2 | 11/2013 | Thompson et al. |
| 8,603,644 B2 | 12/2013 | Osaka et al. |
| 8,643,003 B2 | 2/2014 | Kumaki et al. |
| 8,853,680 B2 | 10/2014 | Yamazaki et al. |
| 8,877,351 B2 | 11/2014 | Inoue et al. |
| 8,911,881 B2 | 12/2014 | Lee et al. |
| 8,951,647 B2 | 2/2015 | Parham et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,040,170 B2 | 5/2015 | Deaton et al. |
| 9,054,317 B2 | 6/2015 | Monkman et al. |
| 9,070,883 B2 | 6/2015 | Osaka et al. |
| 9,126,970 B2 | 9/2015 | Pflumm et al. |
| 9,159,930 B2 | 10/2015 | Anemian et al. |
| 9,159,942 B2 | 10/2015 | Seo et al. |
| 9,175,213 B2 | 11/2015 | Seo et al. |
| 9,187,456 B2 | 11/2015 | Franz et al. |
| 9,196,856 B2 | 11/2015 | Qiu et al. |
| 9,199,972 B2 | 12/2015 | Parham et al. |
| 9,212,198 B2 | 12/2015 | Franz et al. |
| 9,214,632 B2 | 12/2015 | Yamazaki |
| 9,219,236 B2 | 12/2015 | Inoue et al. |
| 9,273,080 B2 | 3/2016 | Stoessel et al. |
| 9,356,250 B2 | 5/2016 | Ohsawa et al. |
| 9,444,064 B2 | 9/2016 | Kaiser et al. |
| 9,537,105 B2 | 1/2017 | Pflumm et al. |
| 9,604,928 B2 | 3/2017 | Shitagaki et al. |
| 9,666,806 B2 | 5/2017 | Anemian et al. |
| 9,882,135 B2 | 1/2018 | Anemian et al. |
| 9,972,790 B2 | 5/2018 | Osaka et al. |
| 10,233,159 B2 | 3/2019 | Franz et al. |
| 10,490,747 B2 | 11/2019 | Anemian et al. |
| 2001/0046612 A1 | 11/2001 | Lee et al. |
| 2002/0028519 A1 | 3/2002 | Yguerabide et al. |
| 2002/0034656 A1 | 3/2002 | Thompson et al. |
| 2002/0182441 A1 | 12/2002 | Lamansky et al. |
| 2003/0124381 A1 | 7/2003 | Thompson et al. |
| 2003/0175553 A1 | 9/2003 | Thompson et al. |
| 2003/0205696 A1 | 11/2003 | Thoms et al. |
| 2004/0076853 A1 | 4/2004 | Jarikov |
| 2004/0214040 A1 | 10/2004 | Lee et al. |
| 2005/0048310 A1 | 3/2005 | Cocchi et al. |
| 2005/0056815 A1 | 3/2005 | Miteva et al. |
| 2005/0077817 A1 | 4/2005 | Yamazaki et al. |
| 2005/0106415 A1 | 5/2005 | Jarikov et al. |
| 2005/0196775 A1 | 9/2005 | Swager et al. |
| 2005/0214576 A1 | 9/2005 | Lamansky et al. |
| 2005/0221116 A1 | 10/2005 | Cocchi et al. |
| 2005/0287393 A1 | 12/2005 | Lee et al. |
| 2006/0024526 A1 | 2/2006 | Thompson et al. |
| 2006/0134464 A1 | 6/2006 | Nariyuki |
| 2006/0159955 A1 | 7/2006 | Inoue et al. |
| 2006/0180806 A1 | 8/2006 | Arakane et al. |
| 2006/0194076 A1 | 8/2006 | Nariyuki |
| 2006/0228577 A1 | 10/2006 | Nagara |
| 2006/0232198 A1 | 10/2006 | Kawamura et al. |
| 2007/0013294 A1 | 1/2007 | Jen et al. |
| 2007/0048544 A1 | 3/2007 | Brown et al. |
| 2007/0090756 A1 | 4/2007 | Okada et al. |
| 2007/0222374 A1 | 9/2007 | Egawa et al. |
| 2007/0244320 A1 | 10/2007 | Inoue et al. |
| 2008/0160345 A1 | 7/2008 | Inoue et al. |
| 2008/0258615 A1 | 10/2008 | Begley et al. |
| 2008/0281098 A1 | 11/2008 | Lamansky et al. |

(56) References Cited

U.S. PATENT DOCUMENTS

| | | |
|---|---|---|
| 2008/0286604 A1 | 11/2008 | Inoue et al. |
| 2008/0305361 A1 | 12/2008 | Inoue et al. |
| 2008/0315753 A1 | 12/2008 | Liao et al. |
| 2009/0072732 A1 | 3/2009 | Arakane et al. |
| 2009/0104721 A1 | 4/2009 | Hirakata et al. |
| 2009/0123720 A1 | 5/2009 | Chen et al. |
| 2009/0160323 A1 | 6/2009 | Nomura et al. |
| 2010/0052527 A1 | 3/2010 | Ikeda et al. |
| 2010/0059741 A1 | 3/2010 | Ohsawa et al. |
| 2010/0145044 A1 | 6/2010 | Inoue et al. |
| 2010/0184942 A1 | 7/2010 | Chen et al. |
| 2010/0187977 A1 | 7/2010 | Kai et al. |
| 2010/0207517 A1 | 8/2010 | Nomura et al. |
| 2011/0001146 A1 | 1/2011 | Yamazaki et al. |
| 2011/0101328 A1 | 5/2011 | Kaiser et al. |
| 2011/0204353 A1 | 8/2011 | Yamazaki |
| 2011/0210316 A1 | 9/2011 | Kadoma et al. |
| 2011/0215714 A1 | 9/2011 | Seo et al. |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0217486 A1 | 8/2012 | Takemura et al. |
| 2012/0217487 A1 | 8/2012 | Yamazaki et al. |
| 2012/0242219 A1 | 9/2012 | Seo et al. |
| 2012/0248421 A1 | 10/2012 | Yamazaki et al. |
| 2012/0256535 A1 | 10/2012 | Seo et al. |
| 2012/0267618 A1 | 10/2012 | Monkman et al. |
| 2013/0048964 A1 | 2/2013 | Takeda et al. |
| 2014/0008639 A1 | 1/2014 | Thompson et al. |
| 2015/0069352 A1 | 3/2015 | Kim et al. |
| 2015/0221880 A1 | 8/2015 | Deaton et al. |
| 2016/0043324 A1 | 2/2016 | Qiu et al. |
| 2017/0125676 A1 | 5/2017 | Anemian et al. |
| 2018/0009751 A1 | 1/2018 | Nomura et al. |
| 2019/0040009 A1 | 2/2019 | Nomura et al. |
| 2019/0169139 A1 | 6/2019 | Franz et al. |

FOREIGN PATENT DOCUMENTS

| | | |
|---|---|---|
| CN | 001454448 A | 11/2003 |
| CN | 001550540 A | 12/2004 |
| CN | 001656853 A | 8/2005 |
| CN | 001728908 A | 2/2006 |
| CN | 001751055 A | 3/2006 |
| CN | 001762182 A | 4/2006 |
| CN | 001781912 A | 6/2006 |
| CN | 001890255 A | 1/2007 |
| CN | 101096592 A | 1/2008 |
| CN | 101096593 A | 1/2008 |
| CN | 101442107 A | 5/2009 |
| CN | 101812057 A | 8/2010 |
| CN | 101822846 A | 9/2010 |
| CN | 101924190 A | 12/2010 |
| CN | 101952250 A | 1/2011 |
| CN | 102041001 A | 5/2011 |
| CN | 102190653 A | 9/2011 |
| CN | 102217419 A | 10/2011 |
| DE | 102009023155 | 12/2010 |
| EP | 0669387 A | 8/1995 |
| EP | 1202608 A | 5/2002 |
| EP | 1238981 A | 9/2002 |
| EP | 1325671 A | 7/2003 |
| EP | 1359790 A | 11/2003 |
| EP | 1484379 A | 12/2004 |
| EP | 1589789 A | 10/2005 |
| EP | 1598361 | 11/2005 |
| EP | 1610398 A | 12/2005 |
| EP | 1656000 A | 5/2006 |
| EP | 1690866 A | 8/2006 |
| EP | 1729327 A | 12/2006 |
| EP | 1933395 A | 6/2008 |
| EP | 1939208 A | 7/2008 |
| EP | 1961741 A | 8/2008 |
| EP | 2086032 A | 8/2009 |
| EP | 2230703 A | 9/2010 |
| EP | 2270895 A | 1/2011 |
| EP | 2278637 A | 1/2011 |
| EP | 2306495 A | 4/2011 |
| EP | 2336143 A | 6/2011 |
| EP | 2363398 A | 9/2011 |
| EP | 2366753 A | 9/2011 |
| EP | 2493269 A | 8/2012 |
| EP | 2505582 A | 10/2012 |
| EP | 2566302 A | 3/2013 |
| EP | 2757094 A | 7/2014 |
| EP | 2911211 A | 8/2015 |
| EP | 3038434 A | 6/2016 |
| EP | 3076759 A | 10/2016 |
| EP | 3321954 A | 5/2018 |
| EP | 3379591 A | 9/2018 |
| JP | 06-065569 A | 3/1994 |
| JP | 06-092947 A | 4/1994 |
| JP | 06-107648 A | 4/1994 |
| JP | 06-145658 A | 5/1994 |
| JP | 07-085972 A | 3/1995 |
| JP | 07-288184 A | 10/1995 |
| JP | 2001-118683 A | 4/2001 |
| JP | 2001-220380 A | 8/2001 |
| JP | 2002-203683 A | 7/2002 |
| JP | 2003-317966 A | 11/2003 |
| JP | 2003-347058 A | 12/2003 |
| JP | 2004-063277 A | 2/2004 |
| JP | 2004-506305 | 2/2004 |
| JP | 2004-210785 A | 7/2004 |
| JP | 2004-281274 A | 10/2004 |
| JP | 2005-514754 | 5/2005 |
| JP | 2005-314414 A | 11/2005 |
| JP | 2005-344124 A | 12/2005 |
| JP | 2006-013482 A | 1/2006 |
| JP | 2006-066562 A | 3/2006 |
| JP | 2006-128636 A | 5/2006 |
| JP | 2006-135295 A | 5/2006 |
| JP | 2006-182775 A | 7/2006 |
| JP | 2006-203172 A | 8/2006 |
| JP | 2006-265172 A | 10/2006 |
| JP | 2006-270053 A | 10/2006 |
| JP | 2006-352046 A | 12/2006 |
| JP | 2007-001895 A | 1/2007 |
| JP | 2007-073620 A | 3/2007 |
| JP | 2008-508727 | 3/2008 |
| JP | 2008-179607 A | 8/2008 |
| JP | 2008-531684 | 8/2008 |
| JP | 2008-247810 A | 10/2008 |
| JP | 2008-288344 A | 11/2008 |
| JP | 2009-013167 A | 1/2009 |
| JP | 2009-108249 A | 5/2009 |
| JP | 2009-167175 A | 7/2009 |
| JP | 2009-182322 A | 8/2009 |
| JP | 2010-030996 A | 2/2010 |
| JP | 2010-080435 A | 4/2010 |
| JP | 2010-086952 A | 4/2010 |
| JP | 2010-135689 A | 6/2010 |
| JP | 2010-215613 A | 9/2010 |
| JP | 2010-222331 A | 10/2010 |
| JP | 2010-235511 A | 10/2010 |
| JP | 2010-258197 A | 11/2010 |
| JP | 2011-016837 A | 1/2011 |
| JP | 2011-081240 A | 4/2011 |
| JP | 2011-153269 A | 8/2011 |
| JP | 2011-201869 A | 10/2011 |
| JP | 2011-204673 A | 10/2011 |
| JP | 2011-216628 A | 10/2011 |
| JP | 2012-004526 A | 1/2012 |
| JP | 2012-044125 A | 3/2012 |
| JP | 2013-509670 | 3/2013 |
| KR | 2001-0077773 A | 8/2001 |
| KR | 2003-0041972 A | 5/2003 |
| KR | 2005-0098259 A | 10/2005 |
| KR | 2005-0123409 A | 12/2005 |
| KR | 10-0624406 | 9/2006 |
| KR | 10-0689124 | 3/2007 |
| KR | 2007-0058623 A | 6/2007 |
| KR | 10-0794975 | 1/2008 |
| KR | 10-0884039 | 2/2009 |

(56) References Cited

FOREIGN PATENT DOCUMENTS

| | | |
|---|---|---|
| KR | 2010-0018036 A | 2/2010 |
| KR | 2010-0027073 A | 3/2010 |
| KR | 2011-0065507 A | 6/2011 |
| KR | 2011-0099173 A | 9/2011 |
| KR | 2011-0099645 A | 9/2011 |
| TW | 200417279 | 9/2004 |
| TW | 200932930 | 8/2009 |
| TW | 201022401 | 6/2010 |
| TW | 201028037 | 7/2010 |
| TW | 201043085 | 12/2010 |
| WO | WO-2000/016593 | 3/2000 |
| WO | WO-2000/057676 | 9/2000 |
| WO | WO-2000/070655 | 11/2000 |
| WO | WO-2001/041512 | 6/2001 |
| WO | WO-2002/015645 | 2/2002 |
| WO | WO-2003/059015 | 7/2003 |
| WO | WO-2004/066685 | 8/2004 |
| WO | WO-2004/081019 | 9/2004 |
| WO | WO-2006/015004 | 2/2006 |
| WO | WO-2006/033285 | 3/2006 |
| WO | WO-2006/033831 | 3/2006 |
| WO | WO-2006/033857 | 3/2006 |
| WO | WO-2006/093466 | 9/2006 |
| WO | WO-2007/027433 | 3/2007 |
| WO | WO-2007/064479 | 6/2007 |
| WO | WO-2007/069607 | 6/2007 |
| WO | WO-2008/149828 | 12/2008 |
| WO | WO-2009/072587 | 6/2009 |
| WO | WO-2009/081800 | 7/2009 |
| WO | WO-2009/157498 | 12/2009 |
| WO | WO-2010/026859 | 3/2010 |
| WO | WO-2010/069444 | 6/2010 |
| WO | WO-2010/085676 | 7/2010 |
| WO | WO-2010/108579 | 9/2010 |
| WO | WO-2011/042443 | 4/2011 |

OTHER PUBLICATIONS

Liu.Z et al., "Highly efficient, orange?red organic light-emitting diodes using a series of green-emission iridium complexes as hosts", Organic Electronics, Dec. 6, 2008, vol. 10, No. 2, pp. 247-255.

Lee.S et al., "Synthesis and Characterization of Red-Emitting Iridium(III) Complexes for Solution-Processable Phosphorescent Organic Light-Emitting Diodes", Adv. Funct. Mater. (Advanced Functional Materials), Jul. 1, 2009, vol. 19, No. 14, pp. 2205-2212.

Jiang.X et al., "Red-emitting electroluminescent devices based on osmium-complexes-doped blend of poly(vinylnaphthalene) and 1,3,4-oxadiazole derivative", Appl. Phys. Lett. (Applied Physics Letters), Oct. 15, 2002, vol. 81, No. 17, pp. 3125-3127.

Yang.X et al., "Highly Efficient Single-Layer Polymer Electrophosphorescent Devices", Adv. Mater. (Advanced Materials), 2004, vol. 16, No. 2, pp. 161-166.

Yang.X et al., "Polymer electrophosphorescence devices with high power conversion efficiencies", Appl. Phys. Lett. (Applied Physics Letters), Apr. 1, 2004, vol. 84, No. 14, pp. 2476-2478.

Shimizu.T et al., "Highly Efficient and Stable Phosphorescent Organic Light-Emitting Diodes Utilizing Reverse Intersystem Crossing ofthe Host Material", Adv. Optical Mater. (Advanced Optical Materials), Aug. 4, 2014, vol. 2, No. 11, pp. 1070-1075.

Cocchi.M et al., "Efficient exciplex emitting organic electroluminescent devices", Appl. Phys. Lett. (Applied Physics Letters), Mar. 26, 2002, vol. 80, No. 13, pp. 2401-2403.

Goushi.K et al., "Organic light-emitting diodes employing efficient reverse intersystem crossing for triplet-to-singlet state conversion", Nature Photonics, Mar. 11, 2012, vol. 6, pp. 253-258.

Hay.P, "Theoretical Studies of the Ground and Excited Electronic States in Cyclometalated Phenylpyridine Ir(III) Complexes Using Density Functional Theory", The Journal of Physical Chemistry A, Jan. 29, 2002, vol. 106, No. 8, pp. 1634-1641.

Tsuboi.T et al., "Optical characteristics of PtOEP and Ir(ppy)3 triplet-exciton materials for organic electroluminescence devices", Thin Solid Films, Aug. 1, 2003, vol. 438-439, pp. 301-307.

Baek.H et al., "Efficient co-host exciplex emission for white organic light-emitting diodes", J. Phys. Chem. Solids (Journal of Physics and Chemistry of Solids), Aug. 1, 2018, vol. 119, pp. 276-280.

Zhang.D et al., "Exciplex emission and Auger process assistant green organic electrophosphorescence devices with very low doped level of iridium complex", J. Phys. D: Appl. Phys. (Journal of Physics D: Applied Physics), Nov. 25, 2008, vol. 41, No. 24, pp. 245102-1-245102-4.

Sun.D et al., "Efficient triplet utilization in conventional solution-processed phosphorescent organic light emitting diodes using a thermal activated delayed fluorescence polymer as an assistant host", J. Mater. Chem. C(Journal of Materials Chemistry C), Apr. 6, 2018, vol. 6, pp. 4800-4806.

Finkenzeller.W et al., "Triplet State Properties of the OLED Emitter Ir(btp)2(acac): Characterization by Site-Selective Spectroscopy and Application of High Magnetic Fields", Inorg. Chem. (Inorganic Chemistry), May 9, 2007, vol. 46, No. 12, pp. 5076-5083.

Wang.Q et al., "Harvesting Excitons Via Two Parallel Channels for Efficient White Organic LEDs with Nearly 100% Internal Quantum Efficiency: Fabrication and Emission-Mechanism Analysis", Adv. Funct. Mater. (Advanced Functional Materials), 2009, vol. 19, No. 1, pp. 84-95.

Wu.M et al., "The Quest for High-Performance Host Materials for Electrophosphorescent Blue Dopants", Adv. Funct. Mater. (Advanced Functional Materials), Aug. 1, 2007, vol. 17, No. 12, pp. 1887-1895.

Leung.M et al., "The Unusual Electrochemical and Photophysical Behavior of 2,2'-Bis(1,3,4-Oxadiazol-2-yl)Biphenyls,Effective Electron Transport Hosts for Phosphorescent Organic Light Emitting Diodes", Organic Letters, 2007, vol. 9, No. 2, pp. 235-238.

Chinese Office Action (Application No. 201710017343.2) dated Mar. 21, 2019.

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

International Search Report (Application No. PCT/JP2012/053202) dated May 22, 2012.

Written Opinion (Application No. PCT/JP2012/053202) dated May 22, 2012.

Baldo.M et al., "Highly Efficient Phosphorescent Emission From Organic Electroluminescent Devices", Nature, Sep. 10, 1998, vol. 395, pp. 151-154.

Gu.G et al., "Transparent Organic Light Emitting Devices", Appl. Phys. Lett. (Applied Physics Letters), May 6, 1996, vol. 68, No. 19, pp. 2606-2608.

Adachi.C et al., "Nearly 100% Internal Phosphorescence Efficiency in an Organic Light Emitting Device", J. Appl. Phys. (Journal of Applied Physics), Nov. 15, 2001, vol. 90, No. 10, pp. 5048-5051.

Baldo.M et al., "Prospects for Electrically Pumped Organic Lasers", Phys. Rev. B. (Physical Review. B), Jul. 19, 2002, vol. 66, pp. 035321-1-035321-16.

King.K et al., "Excited-state properties of a triply ortho-metalated iridium(III) complex", J. Am. Chem. Soc. (Journal of the American Chemical Society), Mar. 1, 1985, vol. 107, No. 5, pp. 1431-1432, ACS(American Chemical Society).

Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

(56) References Cited

OTHER PUBLICATIONS

Seo.J et al., "Efficient blue-green organic light-emitting diodes based on heteroleptic tris-cyclometalated iridium(III) complexes", Thin Solid Films, Sep. 25, 2008, vol. 517, No. 5, pp. 1807-1810.
Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 48, pp. 2790-2794.
Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.
Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.
Chinese Office Action (Application No. 201280009003.0) dated Mar. 3, 2016.
Gong.X et al., "Phosphorescence from iridium complexes doped into polymer blends", J. Appl. Phys. (Journal of Applied Physics), Feb. 1, 2004, vol. 95, No. 3, pp. 948-953.
Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.
German Office Action (Application No. 112012000831.6) dated Oct. 27, 2016.
Korean Office Action (Application No. 2017-7006766) dated Mar. 17, 2017.
Yersin.H et al., Highly Efficient OLEDs with Phosphorescent Materials, 2008, pp. 1-97,283-309.
Tokito.S et al., "Improvement in performance by doping", Organic EL Display, Aug. 20, 2004, pp. 67-99, Ohmsha.
Jeon.W et al., "Ideal host and guest system in phosphorescent OLEDs", Organic Electronics, 2009, vol. 10, pp. 240-246, Elsevier.
Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.
Rausch.A et al., "Matrix Effects on the Triplet State of the OLED Emitter Ir(4,6-dFppy)2(pic)(FIrpic):Investigations by High-Resolution Optical Spectroscopy", Inorg. Chem. (Inorganic Chemistry), 2009, vol. 48, No. 5, pp. 1928-1937.
Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.
Written Opposition to the Grant of Patent (Patent number. Japanese Patent No. 5981726) dated Feb. 28, 2017.
Lee.J et al., "Stabilizing the efficiency of phosphorescent organic light-emitting diodes", SPIE Newsroom, Apr. 21, 2008, pp. 1-3.
Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.
Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.
Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.
Tamayo.A et al., "Synthesis and Characterization of Facial and Meridional Tris-cyclometalated Iridium (III) Complexes", J. Am. Chem. Soc. (Journal of the American Chemical Society), Jun. 18, 2003, vol. 125, No. 24, pp. 7377-7387.
Chinese Office Action (Application No. 201710017343.2) dated Oct. 24, 2017.

Xu.Y et al., "Efficient polymer white-light-emitting diodes with a phosphorescent dopant", Semicond. Sci. Technol.(Semiconductor Science and Technology), Aug. 14, 2006, vol. 21, No. 10, pp. 1373-1376.
Williams.J et al., "Light-emitting iridium complexes with tridentate ligands", Dalton Transactions, Feb. 19, 2008, No. 16, pp. 2081-2099.
Misra.A et al., "White organic LEDs and their recent advancements", Semicond. Sci. Technol.(Semiconductor Science and Technology), Apr. 25, 2006, vol. 21, No. 7, pp. R35-R47.
Korean Office Action (Application No. 2018-7003792) dated May 8, 2018.
Seo.S et al., "Exciplex-triplet energy transfer: A new method to achieve extremely efficient organic light-emitting diode with external quantum efficiency over 30% and drive voltage below 3V", Jpn. J. Appl. Phys. (Japanese Journal of Applied Physics), Mar. 17, 2014, vol. 53, No. 4, pp. 042102-1-042102-8.
Song.W et al., "Light emission mechanism of mixed host organic light-emitting diodes", Appl. Phys. Lett. (Applied Physics Letters), Mar. 1, 2015, vol. 106, No. 12, pp. 123306-1-123306-4.
Tris[2-phenylpyridinato-C2,N]iridium(III), https://www.sigmaaldrich.com/catalog/product/aldrich/688096?lang=de&region=DE.
Taiwanese Office Action (Application No. 106137197) dated Jun. 28, 2018.
Tanaka.I et al., "Energy-Transfer Processes between Phosphorescent Guest and Fluorescent Host Molecules in Phosphorescent OLEDs", Highly Efficient OLEDs with Phosphorescent Materials, 2008, pp. 283-309.
Organic Light-emitting Materials and Devices, 2007, pp. 330-334, Taylor & Francis Group.
Experimental data—absorption and emission spectrums of Alq3 and Ir(piq)3.
Rho.H et al., "Synthesis and Photophysical Studies of Iridium Complexes Having Different Ligands", Jpn. J. Appl. Phys. (Japanese Journal of Applied Physics), Jan. 20, 2006, vol. 45, No. 1B, pp. 568-573.
Petition for Cancellation of Patent (Patent number. Korean Patent No. 10-1793880-00-00) dated May 24, 2018.
Notice of Opposition (Patent number. German Patent No. 112012000831) dated Jun. 4, 2018.
Negres.R et al., "Origin of efficient light emission from a phosphorescent polymer/organometallic guest-host system", Phys. Rev. B (Physical Review. B), Sep. 29, 2003, vol. 68, No. 11, pp. 115209-1-115209-8.
Gong.X et al., "High-Efficiency Polymer-Based Electrophosphorescent Devices", Adv. Mater. (Advanced Materials), Apr. 18, 2002, vol. 14, No. 8, pp. 581-585.
Hamed.Z et al., "Fluorescence quenching in PVK:ZnSe nanocomposite structure", Synthetic Metals, Jun. 12, 2014, vol. 195, pp. 102-109.
Holzer.W et al., "Absorption and emission spectroscopic characterization of Ir(ppy)3", Chemical Physics, 2005, vol. 308, No. 1-2, pp. 93-102.
Okada.S et al., "Substituent effects of indium complexes for highly efficient red OLEDs", Dalton Transactions, May 5, 2005, No. 9, pp. 1583-1590.
Notice of Opposition (Patent number. German Patent No. 112012000828) dated Jun. 8, 2018.
Notice of Opposition (Patent number. German Patent No. 112012001364) dated Jun. 27, 2018.
Petition for Cancellation of Patent (Patent number. Korean Patent No. 10-1812673-00-00) dated Jul. 6, 2018.
Lee.Y et al., "P-142: Synthesis and Electroluminescent Properties of Various Carbazole Derivatives as HTL Layer", SID Digest '05 : SID International Symposium Digest of Technical Papers, 2005, vol. 36 pp. 843-845.
Lamansky.S et al., "Highly Phosphorescent Bis-Cyclometalated Iridium Complexes: Synthesis, Photophysical Characterization, and Use in Organic Light Emitting Diodes", J. Am. Chem. Soc. (Journal of the American Chemical Society), May 9, 2001, vol. 123, No. 18, pp. 4304-4312.
Korean Office Action (Application No. 2020-7017030) dated Jul. 27, 2020.

(56) References Cited

OTHER PUBLICATIONS

"Statement of Grounds of Appeal(Test Report) (Application No. 112012000831.6) dated Jun. 8, 2020", pp. 45-50.
Kalinowski.J, "Excimers and exciplexes in organic electroluminescence", Materials Science—Poland, 2009, vol. 27, No. 3, pp. 735-756.
Statement of Grounds of Appeal(Application No. 112012000831.6) dated Jun. 8, 2020, pp. 1-45.
Kappaun.S et al., "Phosphorescent Organic Light-Emitting Devices: Working Principle and Iridium Based Emitter Materials", Int. J. Mol. Sci.(International Journal of Molecular Sciences), Aug. 1, 2008, vol. 9, No. 8, pp. 1527-1547.
Yang.X et al., "Chapter 11. Polymer Electrophosphorescence Devices", Organic Light Emitting Devices: Synthesis, Properties and Applications, Dec. 16, 2005, pp. 333-367.
Tanaka.D et al., "Ultra High Efficiency Green Organic Light-Emitting Devices", Jpn. J. Appl. Phys. (Japanese Journal of Applied Physics), Dec. 22, 2006, vol. 46, No. 1, pp. L10-L12, JSAP.

LIGHT-EMITTING ELEMENT

CROSS-REFERENCE TO RELATED APPLICATIONS

This application is a continuation of U.S. application Ser. No. 15/339,016, filed Oct. 31, 2016, now pending, which is a continuation of U.S. application Ser. No. 14/669,599, filed Mar. 26, 2015, now U.S. Pat. No. 9,538,607, which is a continuation of U.S. application Ser. No. 13/370,676, filed Feb. 10, 2012, now U.S. Pat. No. 8,994,263, which claims the benefit of a foreign priority application filed in Japan as Serial No. 2011-031426 on Feb. 16, 2011, all of which are incorporated by reference.

TECHNICAL FIELD

The present invention relates to light-emitting elements using an organic electroluminescence (EL) phenomenon (hereinafter such light-emitting elements are also referred to as organic EL elements).

BACKGROUND ART

An organic EL element has been actively researched and developed. In a fundamental structure of the organic EL element, a layer including a luminescent organic compound (hereinafter also referred to as light-emitting layer) is interposed between a pair of electrodes. The organic EL element has attracted attention as a next-generation flat panel display element owing to characteristics such as feasibility of being thinner and lighter, high speed response to input signals, and capability of direct current low voltage driving. In addition, a display using such a light-emitting element has a feature that it is excellent in contrast and image quality, and has a wide viewing angle. Further, being a plane light source, the organic EL element has been attempted to be applied as a light source such as a backlight of a liquid crystal display and an illumination device.

The emission mechanism of the organic EL element is of a carrier-injection type. That is, by application of voltage with a light-emitting layer interposed between electrodes, electrons and holes injected from the electrodes are recombined to make a light-emitting substance excited, and light is emitted when the excited state relaxes to the ground state. There can be two types of the excited states: a singlet excited state ($S^*$) and a triplet excited state ($T^*$). The statistical generation ratio of the excited states in a light-emitting element is considered to be $S^*:T^*=1:3$.

In general, the ground state of a light-emitting organic compound is a singlet state. Therefore, light emission from the singlet excited state ($S^*$) is referred to as fluorescence because it is caused by electron transition between the same spin multiplicities. On the other hand, light emission from the triplet excited state ($T^*$) is referred to as phosphorescence where electron transition occurs between different spin multiplicities. Here, in a compound emitting fluorescence (hereinafter referred to as fluorescent compound), in general, phosphorescence is not observed at room temperature, and only fluorescence is observed. Accordingly, the internal quantum efficiency (the ratio of generated photons to injected carriers) in a light-emitting element including a fluorescent compound is assumed to have a theoretical limit of 25% based on $S^*:T^*=1:3$.

On the other hand, when a compound emitting phosphorescence (hereinafter referred to as phosphorescent compound) is used, an internal quantum efficiency of 100% can be theoretically achieved. That is, higher emission efficiency can be obtained than using a fluorescent compound. For these reasons, a light-emitting element including a phosphorescent compound has been actively developed in recent years in order to achieve a high-efficiency light-emitting element. As the phosphorescent compound, an organometallic complex that has iridium or the like as a central metal has particularly attracted attention owing to their high phosphorescence quantum yield; for example, an organometallic complex that has iridium as a central metal is disclosed as a phosphorescent material in Patent Document 1.

When a light-emitting layer of a light-emitting element is formed using a phosphorescent compound described above, in order to suppress concentration quenching or quenching due to triplet-triplet annihilation in the phosphorescent compound, the light-emitting layer is often formed such that the phosphorescent compound is dispersed in a matrix of another compound. Here, the compound serving as the matrix is called host material, and the compound dispersed in the matrix, such as a phosphorescent compound, is called guest material.

REFERENCE

Patent Document

[Patent Document 1] International Publication WO 00/70655 pamphlet

DISCLOSURE OF INVENTION

However, it is generally said that the light extraction efficiency of an organic EL element is approximately 20% to 30%. Accordingly, considering light absorption by a reflective electrode and a transparent electrode, the external quantum efficiency of a light-emitting element including a phosphorescent compound has a limit of approximately 25% at most.

An object of one embodiment of the present invention is to provide a light-emitting element with high external quantum efficiency. Another object of one embodiment of the present invention is to provide a light-emitting element with a long lifetime.

One embodiment of the present invention is a light-emitting element which includes, between a pair of electrodes, a light-emitting layer including a guest material and a host material, in which an emission spectrum of the host material overlaps with an absorption spectrum of the guest material, and phosphorescence is emitted by conversion of an excitation energy of the host material into an excitation energy of the guest material.

Another embodiment of the present invention is a light-emitting element which includes, between a pair of electrodes, a light-emitting layer including a guest material and a host material, in which an emission spectrum of the host material overlaps with a longest-wavelength-side (lowest-energy-side) absorption band in an absorption spectrum of the guest material, and phosphorescence is emitted by conversion of an excitation energy of the host material into an excitation energy of the guest material.

In the above light-emitting element, it is preferable that the longest-wavelength-side absorption band includes an absorption based on a triplet MLCT (metal to ligand charge transfer) transition.

In the above light-emitting element, the emission spectrum of the host material is preferably a fluorescent spectrum.

In the above light-emitting element, the guest material is preferably an organometallic complex, more preferably an iridium complex.

In the above light-emitting element, the difference between the energy value of a peak of the emission spectrum and the energy value of a peak of the lowest-energy-side absorption band in the absorption spectrum is preferably 0.3 eV or less.

In the above light-emitting element, the molar absorption coefficient of the longest-wavelength-side absorption band in the absorption spectrum is preferably 5000 $M^{-1} \cdot cm^{-1}$ or higher.

According to one embodiment of the present invention, a light-emitting element with high external quantum efficiency can be provided. According to another embodiment of the present invention, a light-emitting element with a long lifetime can be provided.

BEST MODE FOR CARRYING OUT THE INVENTION

Figure 1A:
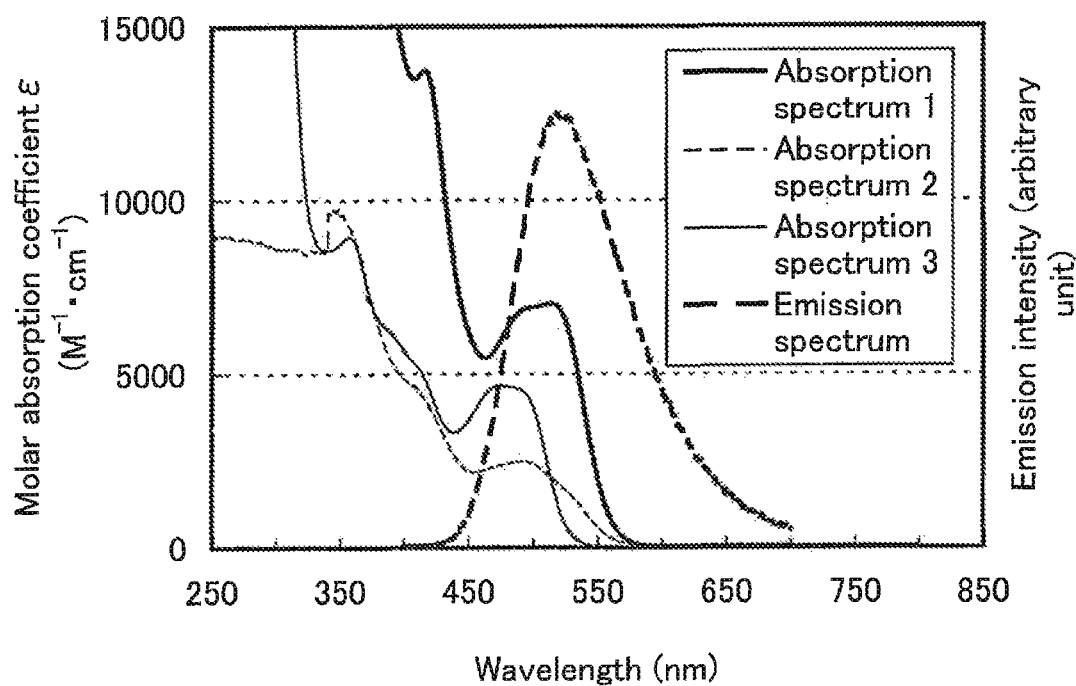
FIGS. 1A and 1B show absorption spectra and emission spectra according to Example 1.

Embodiments will be described with reference to drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

Embodiment 1 shows a light-emitting element of one embodiment of the present invention.

The light-emitting element of this embodiment includes a light-emitting layer including a guest material as a light-emitting substance and a host material in which the guest material is dispersed. As the guest material, a phosphorescent compound is used. As the host material, one or more types of organic compounds can be used.

The structure in which the guest material is dispersed in the host material can prevent the light-emitting layer from crystallizing. Further, it is possible to suppress concentration quenching due to high concentration of the guest material, and thus the light-emitting element can have higher emission efficiency.

According to this embodiment, it is preferable that the level of a triplet excitation energy ($T_1$ level) of the organic compound used as the host material be higher than that of the guest material. This is because, when the $T_1$ level of the host material is lower than that of the guest material, the triplet excitation energy of the guest material, which is to contribute to light emission, is quenched by the host material and accordingly the emission efficiency is decreased.

(Elementary Processes of Light Emission)

First, a description is given of general elementary processes of light emission in a light-emitting element using a phosphorescent compound as a guest material.

(1) The case where an electron and a hole are recombined in a guest molecule, and the guest molecule is excited (direct recombination process).

(1-1) When the excited state of the guest molecule is a triplet excited state, the guest molecule emits phosphorescence.

(1-2) When the excited state of the guest molecule is a singlet excited state, the guest molecule in the singlet excited state undergoes intersystem crossing to a triplet excited state and emits phosphorescence.

In other words, in the direct recombination process in (1), as long as the efficiency of intersystem crossing and the phosphorescence quantum yield of the guest molecule are high, high emission efficiency can be obtained. As described above, it is preferable that the $T_1$ level of the host molecule be higher than that of the guest molecule.

(2) The case where an electron and a hole are recombined in a host molecule and the host molecule is put in an excited state (energy transfer process).

(2-1) When the excited state of the host molecule is a triplet excited state and the $T_1$ level of the host molecule is higher than that of the guest molecule, an excitation energy transfers from the host molecule to the guest molecule, and thus, the guest molecule is put in a triplet excited state. The guest molecule in the triplet excited state emits phosphorescence. Note that the energy can transfer to a singlet excitation energy level ($S_1$ level) of the guest molecule in theory; however, since the $S_1$ level of the guest molecule has a higher energy than the $T_1$ level of the host molecule in many cases, energy transfer to the $S_1$ level of the guest molecule is barely likely to be a main energy transfer process; therefore, a description thereof is not given here.

(2-2) When the excited state of the host molecule is a singlet excited state and the $S_1$ level of the host molecule is higher than the $S_1$ level and $T_1$ level of the guest molecule, an excitation energy transfers from the host molecule to the guest molecule, and thus, the guest molecule is put in a singlet excited state or a triplet excited state. The guest molecule in the triplet excited state emits phosphorescence. In addition, the guest molecule in the singlet excited state undergoes intersystem crossing to a triplet excited state and emits phosphorescence.

In other words, in the energy transfer process in (2), it is important how efficiently both the triplet excitation energy and the singlet excitation energy of the host molecule can transfer to the guest molecule.

(Energy Transfer Process)

The following describes energy transfer processes between molecules in detail.

First, as a mechanism of energy transfer between molecules, the following two mechanisms are proposed. A molecule donating an excitation energy is referred to as host molecule, while a molecule accepting the excitation energy is referred to as guest molecule.

(Förster Mechanism (Dipole-Dipole Interaction))

In Förster mechanism (also referred to as Förster resonance energy transfer), direct intermolecular contact is not necessary for energy transfer. Through a resonant phenomenon of dipolar oscillation between a host molecule and a guest molecule, energy transfer occurs. The resonant phenomenon of dipolar oscillation causes the host molecule to donate an energy to the guest molecule; thus, the host molecule relaxes to a ground state and the guest molecule is put in an excited state. The rate constant $k_{h^* \to g}$ of Förster mechanism is expressed by a formula (1).

[Formula (1)]

$$k_{h^* \to g} = \frac{9000 c^4 K^2 \phi \ln 10}{128 \pi^5 n^4 N \tau R^6} \int \frac{f'_h(v) \varepsilon_g(v)}{v^4} dv \qquad (1)$$

In the formula (1), $v$ denotes a frequency, $f'_h(v)$ denotes a normalized emission spectrum of a host molecule (a fluorescent spectrum in energy transfer from a singlet excited state, and a phosphorescent spectrum in energy transfer from a triplet excited state), $\varepsilon_g(v)$ denotes a molar absorption coefficient of a guest molecule, N denotes Avogadro's number, n denotes a refractive index of a medium, R denotes an intermolecular distance between the host molecule and the guest molecule, $\tau$ denotes a measured lifetime of an excited state (fluorescence lifetime or phosphorescence lifetime), c denotes the speed of light, φ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host molecule and the guest molecule. Note that $K^2=2/3$ in random orientation.

(Dexter Mechanism (Electron Exchange Interaction))

In Dexter mechanism (also referred to as Dexter electron transfer), a host molecule and a guest molecule are close to a contact effective range where their orbitals overlap, and the host molecule in an excited state and the guest molecule in a ground state exchange their electrons, which leads to energy transfer. The rate constant $k_{h^* \to g}$ of Dexter mechanism is expressed by a formula (2).

[Formula (2)]

$$k_{h^* \to g} = \left(\frac{2\pi}{h}\right) K^2 \exp\left(-\frac{2R}{L}\right) \int f'_h(v) \varepsilon'_g(v) dv \quad (2)$$

In the formula (2), h denotes a Planck constant, K denotes a constant having an energy dimension, ν denotes a frequency, $f'_h(v)$ denotes a normalized emission spectrum of a host molecule (a fluorescence spectrum in energy transfer from a singlet excited state, and a phosphorescence spectrum in energy transfer from a triplet excited state), $\varepsilon'_g(v)$ denotes a normalized absorption spectrum of a guest molecule, L denotes an effective molecular radius, and R denotes an intermolecular distance between the host molecule and the guest molecule.

Here, the efficiency of energy transfer from the host molecule to the guest molecule (energy transfer efficiency $\Phi_{ET}$) is thought to be expressed by a formula (3). In the formula, $k_r$ denotes a rate constant of a light-emission process (fluorescence in energy transfer from a singlet excited state, and phosphorescence in energy transfer from a triplet excited state) of the host molecule, $k_n$ denotes a rate constant of a non-light-emission process (thermal deactivation or intersystem crossing) of the host molecule, and τ denotes a measured lifetime of the excited state of the host molecule.

[Formula (3)]

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

First, according to the formula (3), in order to increase the energy transfer efficiency $\Phi_{ET}$, the rate constant $k_{h^* \to g}$ of energy transfer may be further increased as compared with another competing rate constant $k_r + k_n (=1/\tau)$. Then, in order to increase the rate constant $k_{h^* \to g}$ of energy transfer, based on the formulas (1) and (2), in Förster mechanism and Dexter mechanism, it is preferable that an emission spectrum of a host molecule (a fluorescence spectrum in energy transfer from a singlet excited state largely overlap with a phosphorescence spectrum in energy transfer from a triplet excited state) and an absorption spectrum of a guest molecule.

Here, one embodiment of the present invention is a light-emitting element which includes, between a pair of electrodes, a light-emitting layer including a guest material and a host material, in which an emission spectrum of the host material overlaps with an absorption spectrum of the guest material, and phosphorescence is emitted by conversion of an excitation energy of the host material into an excitation energy of the guest material.

According to one embodiment of the present invention, by using the overlap between the emission spectrum of the host material and the absorption spectrum of the guest material, the energy smoothly transfers from the host material to the guest material, so that the energy transfer efficiency is high. Thus, according to one embodiment of the present invention, a light-emitting element with high external quantum efficiency can be achieved.

In view of the above-described energy transfer processes, before the excitation energy of the host molecule transfers to the guest molecule, when the host molecule itself is deactivated by emitting the excitation energy as light or heat, the emission efficiency is decreased and the lifetime is shortened. According to one embodiment of the present invention, however, the energy smoothly transfers, so that the deactivation of the excitation energy can be suppressed. Thus, a light-emitting element with a long lifetime can be achieved.

Here, the present inventors have considered that the longest-wavelength-side (lowest-energy-side) absorption band in the absorption spectrum of the guest molecule is important in considering the overlap between the emission spectrum of the host molecule and the absorption spectrum of the guest molecule.

According to this embodiment, a phosphorescent compound is used as the guest material. In an absorption spectrum of the phosphorescent compound, an absorption band that is considered to contribute to light emission most greatly is an absorption wavelength corresponding to direct transition from a singlet ground state to a triplet excitation state and a vicinity of the absorption wavelength, which is on the longest wavelength side. Therefore, it is considered preferable that the emission spectrum (a fluorescence spectrum and a phosphorescence spectrum) of the host material overlaps with the longest-wavelength-side absorption band in the absorption spectrum of the phosphorescent compound.

For example, moat organometallic complexes, especially light-emitting iridium complexes, have a broad absorption band around 500 nm to 600 nm as the longest-wavelength-side absorption band (as a matter of fact, the broad absorption band can be on a shorter or longer wavelength side depending on emission wavelengths). This absorption band is mainly based on a triplet MLCT (metal to ligand charge transfer) transition. Note that it is considered that the absorption band also includes absorptions based on a triplet π-π* transition and a singlet MLCT transition, and that these absorptions overlap with one another to form a broad absorption band on the longest wavelength side in the absorption spectrum. Therefore, as described above, it is preferable that the broad absorption band on the longest wavelength side largely overlap with the emission spectrum of the host material when an organometallic complex (especially iridium complex) is used as the guest material.

Accordingly, another embodiment of the present invention is a light-emitting element which includes, between a pair of electrodes, a light-emitting layer including a guest material and a host material, in which an emission spectrum of the host material overlaps with a longest-wavelength-side absorption band in an absorption spectrum of the guest material, and phosphorescence is emitted by conversion of an excitation energy of the host material into an excitation energy of the guest material.

In the above light-emitting element, the absorption band preferably includes an absorption based on the triplet MLCT transition. A triplet MLCT excited state is the lowest triplet excited state of the phosphorescent compound which is the guest material, and thus, the phosphorescent compound emits phosphorescence therefrom. That is, phosphorescence from the triplet MLCT excited state involves few deactivation processes other than light emission, and thus, it is considered that high emission efficiency can be obtained by making a rate of the existence of this excited state as high as possible. For these reasons, there are preferably many energy transfer processes where energies directly transfer from the host material to the triplet MLCT excited state by using the absorption based on the triplet MLCT transition. In the above light-emitting element, the guest material is preferably an organometallic complex, more preferably an iridium complex.

The inventors have found out that when the host molecule is in a singlet excited state (the above (2-2)), the energy is barely likely to transfer to the guest molecule, i.e., the phosphorescent compound, and the emission efficiency is likely to be decreased as compared to when the host molecule is in a triplet excited state (the above (2-1)). Thus, the inventors have focused on that fact as an object.

As the host material, a fluorescent compound is generally used, but the fluorescence lifetime thereof (τ) is extremely short, which is on the order of nanosecond ($k_r+k_n$ is high). This is because a transition from the singlet excited state to the ground state (singlet) is an allowed transition. From the formula (3), this is unfavorable for the energy transfer efficiency $\Phi_{ET}$. Considering that, in general, the energy is barely likely to transfer from the host material in a singlet excited state to the guest material.

However, one embodiment of the present invention can overcome such a problem of the efficiency of the energy transfer from the host material in the singlet excited state to the guest material. That is, according to one embodiment of the present invention, a light-emitting element includes, between a pair of electrodes, a light-emitting layer including a guest material and a host material, a fluorescence spectrum of the host material preferably overlaps with a longest-wavelength-side absorption band in an absorption spectrum of the guest material, and by using the overlap, phosphorescence is emitted by conversion of an excitation energy of the host material into an excitation energy of the guest material.

That is, in a light-emitting element according to one embodiment of the present invention, the fluorescence spectrum of the host material overlaps with the longest-wavelength-side absorption band in the absorption spectrum of the guest material, and by using the overlap, phosphorescence is emitted by conversion of an excitation energy of the host material into an excitation energy of the guest material. Such a structure can suppress the deactivation of the singlet excitation energy. Accordingly, application of one embodiment of the present invention can suppress the deactivation of the singlet excitation energy of the host material that may affect not only the efficiency of an element but also the lifetime thereof, so that a light-emitting element with a long lifetime can be achieved. Here, it is preferable that a sufficient excitation energy of the host material transfer to the phosphorescent compound, and that fluorescence from the singlet excited state be not substantially observed.

To make the emission spectrum of the host material sufficiently overlap with the absorption spectrum of the guest material, the difference between the energy value of a peak of the emission spectrum and the energy value of a peak of the lowest-energy-side absorption band in the absorption spectrum is preferably 0.3 eV or less. The difference is more preferably 0.2 eV or less, even more preferably 0.1 eV or less.

Further, in the energy transfer from the host material in the singlet excited state, the Förster mechanism is considered to be important. Considering that, from the formula (1), the molar absorption coefficient of the longest-wavelength-side absorption band of the guest material is preferably 2000 $M^{-1}\cdot cm^{-1}$ or higher, more preferably 5000 $M^{-1}\cdot cm^{-1}$ or higher.

Note that this embodiment can be combined with the other embodiment as appropriate.

Embodiment 2

Figure 15A:
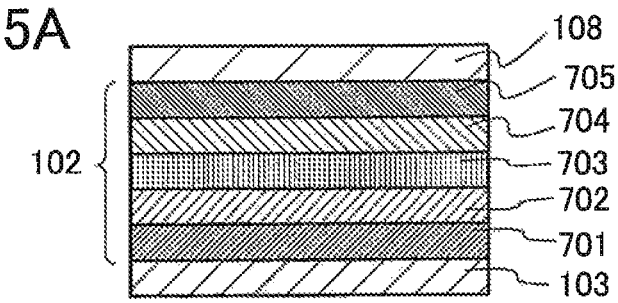
FIGS. 15A to 15C illustrate light-emitting elements of embodiments of the present invention.
Figure 15B:
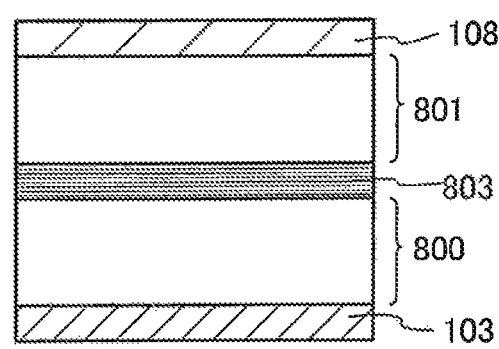
Figure 15C:
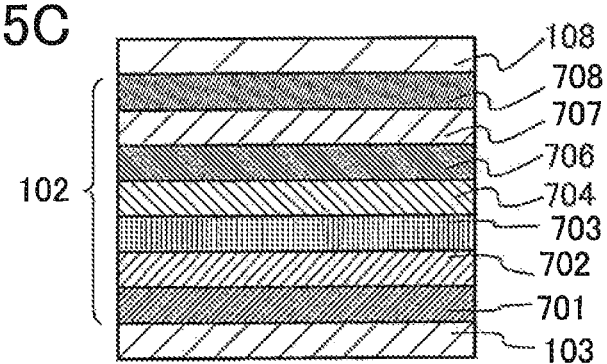

This embodiment shows a light-emitting element of one embodiment of the present invention with reference to FIGS. 15A to 15C.

FIG. 15A illustrates a light-emitting element including an EL layer 102 between a first electrode 103 and a second electrode 108. The light-emitting element in FIG. 15A includes a hole-injection layer 701, a hole-transport layer 702, a light-emitting layer 703, an electron-transport layer 704, and an electron-injection layer 705 which are stacked over the first electrode 103 in this order, and the second electrode 108 provided thereover.

The first electrode 103 is preferably formed using any of metals, alloys, conductive compounds, mixtures thereof, and the like which have a high work function (specifically, 4.0 eV or higher). Specific examples include indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide (IWZO), and the like. Films of these conductive metal oxides are usually formed by a sputtering method, but may be formed by application of a sol-gel method or the like. For example, an indium oxide-zinc oxide film can be formed by a sputtering method using a target in which zinc oxide is added to indium oxide at 1 wt % to 20 wt %. Further, an IWZO film can be formed by a sputtering method using a target in which tungsten oxide is added to indium oxide at 0.5 wt % to 5 wt % and zinc oxide is added to indium oxide at 0.1 wt % to 1 wt %. Other examples are graphene, gold, platinum, nickel, tungsten, chromium, molybdenum, iron, cobalt, copper, palladium, nitrides of metal materials (e.g., titanium nitride), and the like.

Note that when a layer included in the EL layer 102 and formed in contact with the first electrode 103 is formed using a later-described composite material formed by combining an organic compound and an electron acceptor (an acceptor), the first electrode 103 can be formed using any of a variety of metals, alloys, electrically conductive compounds, mixtures thereof, and the like regardless of the work function; for example, aluminum, silver, an alloy containing aluminum (e.g., Al—Si), or the like can also be used.

The first electrode 103 can be formed by, for example, a sputtering method, an evaporation method (including a vacuum evaporation method), or the like.

The second electrode 108 is preferably formed using any of metals, alloys, electrically conductive compounds, mixtures thereof, and the like which have a low work function (preferably, 3.8 eV or lower). Specific examples include elements that belong to Groups 1 and 2 in the periodic table, that is, alkali metals such as lithium and cesium, alkaline earth metals such as calcium and strontium, magnesium, alloys thereof (e.g., Mg—Ag and Al—Li), rare-earth metals such as europium and ytterbium, alloys thereof, aluminum, silver, and the like.

When a layer included in the EL layer 102 and formed in contact with the second electrode 108 is formed using a later-described composite material formed by combining an organic compound and an electron donor (a donor), the second electrode 108 can be formed using any of a variety of conductive materials, such as Al, Ag, ITO, and indium oxide-tin oxide containing silicon or silicon oxide, regardless of the work function.

Note that when the second electrode 108 is formed, a vacuum evaporation method or a sputtering method can be used. In the case of using a silver paste or the like, a coating method, an inkjet method, or the like can be used.

The EL layer 102 includes at least the light-emitting layer 703. For part of the EL layer 102, a known substance can be used, and either a low molecular compound or a high molecular compound can be used. Note that substances forming the EL layer 102 may consist of organic compounds or may include an inorganic compound as apart.

Further, as illustrated in FIG. 15A, the EL layer 102 includes not only the light-emitting layer 703 but also an appropriate combination of the following layers: the hole-injection layer 701 including a substance having a high hole-injection property, the hole-transport layer 702 including a substance having a high hole-transport property, the electron-transport layer 704 including a substance having a high electron-transport property, the electron-injection layer 705 including a substance having a high electron-injection property, and the like.

The hole-injection layer 701 is a layer that includes a substance having a high hole-injection property. Examples of the substance having a high hole-injection property include metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide. Alternatively, a phthalocyanine-based compound such as phthalocyanine (abbreviation: H$_2$Pc) or copper(II) phthalocyanine (abbreviation: CuPc) can be used.

Other examples include aromatic amine compounds and the like which are low molecular organic compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still other examples include high molecular compounds (e.g., oligomers, dendrimers, and polymers), such as poly (N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: Poly-TPD), and high molecular compounds to which acid is added, such as poly(3,4-ethylenedioxythiophene)/poly(styrenesulfonic acid) (PEDOT/PSS), and polyaniline/poly(styrenesulfonic acid) (PAni/PSS).

The hole-injection layer 701 can be formed using the composite material formed by combining an organic compound and an electron acceptor (an acceptor). Such a composite material has high hole-injection and hole-transport properties because holes are generated in the organic compound by the electron acceptor. In this case, the organic compound is preferably a material excellent in transporting the generated holes (a substance having a high hole-transport property).

Examples of the organic compound used for the composite material can be a variety of compounds, such as aromatic amine compounds, carbazole derivatives, aromatic hydrocarbons, and high molecular compounds (e.g., oligomers, dendrimers, and polymers). The organic compound used for the composite material is preferably an organic compound having a high hole-transport property, and is specifically preferably a substance having a hole mobility of $10^{-6}$ cm$^2$/V·s or more. Note that other than these substances, any substance that has a property of transporting more holes than electrons may be used. Organic compounds that can be used for the composite material are specifically described below.

Examples of the organic compound that can be used for the composite material are aromatic amine compounds, such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10-phenylanthracene (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl) anthracene (abbreviation: t-BuDBA), 9,10-di(2-naphthyl) anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Still other examples are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl) phenyl]anthracene (abbreviation: DPVPA).

Further, examples of the electron acceptor are organic compounds, such as 7,7,8,8-tetracyano-2,3,5,6-tetrafluoroquinodimethane (abbreviation: F$_4$-TCNQ) and chloranil, oxides of transition metals, oxides of metals that belong to Groups 4 to 8 in the periodic table, and the like. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable since it is stable in the air, has a low hygroscopic property, and is easy to handle.

The composite material may be formed using the above-described electron acceptor and the above-described high molecular compound such as PVK, PVTPA, PTPDMA, or Poly-TPD, and may be used for the hole-injection layer 701.

The hole-transport layer 702 is a layer that includes a substance having a high hole-transport property. Examples of the substance having a high hole-transport property are aromatic amine compounds such as NPB, TPD, BPAFLP, 4,4'-bis[N'-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ cm$^2$/V·s or more. Note that other than these substances, any substance that has a property of transporting more holes than electrons may be used. Note that the layer including a substance having a high hole-transport property is not limited to a single layer, and may be a stack of two or more layers including any of the above substances.

Alternatively, the hole-transport layer 702 may be formed using a carbazole derivative such as CBP, CzPA, or PCzPA or an anthracene derivative such as t-BuDNA, DNA, or DPAnth.

Further alternatively, the hole-transport layer 702 may be formed using a high molecular compound such as PVK, PVTPA, PTPDMA, or Poly-TPD.

The light-emitting layer 703 is a layer that includes a light-emitting substance. The light-emitting layer 703 of this embodiment includes a guest material and a host material. Plural kinds of materials can be used as the host material. Embodiment 1 can be referred to for specifics.

As the phosphorescent compound, an organometallic complex is preferable, and in particular, iridium complex is preferable. In consideration of energy transfer due to Förster mechanism described above, the molar absorption coefficient of the-longest-wavelength-side absorption band of phosphorescent compound is preferably 2000 M$^{-1}$·cm$^{-1}$ or higher, more preferably 5000 M$^{-1}$·cm$^{-1}$ or higher. Specific examples of a compound having such a high molar absorption coefficient include bis(3,5-dimethyl-2-phenylpyrazinato)(dipivaloylmethanato)iridium(III) (abbreviation: [Ir(mppr-Me)$_2$(dpm)]), (acetylacetonato)bis(4,6-diphenylpyrimidinato)iridium(III) (abbreviation: [Ir(dppm)$_2$(acac)]), bis(2,3,5-triphenylpyrazinato)(dipivaloylmethanato)iridium(III) (abbreviation: [Ir(tppr)$_2$(dpm)]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), and the like. In particular, a material having a molar absorption coefficient of 5000 M$^{-1}$·cm$^{-1}$ or higher, such as [Ir(dppm)$_2$(acac)], can provide a high-efficiency light-emitting element with an external quantum efficiency of about 30%.

It is preferable to use, as the host material, a mixed material of a compound that is likely to accept electrons (typically, a heterocyclic compound) and a compound that is likely to accept holes (typically, an aromatic amine compound or a carbazole compound). With such a structure, a light-emitting layer can have an excellent carrier balance between hole transport and electron transport, thereby increasing the emission efficiency and the lifetime. Specific examples of the host material include a mixed material of 2-[3-(dibenzothiophen-4-yl)phenyl]dibenzo[f,h]quinoxaline (abbreviation: 2mDBTPDBq-II) and 4-phenyl-4'-(9-phenyl-9H-carbazol-3-yl)triphenylamine (abbreviation: PCBA1BP), a composite material of 2mDBTPDBq-II and 4,4'-di(1-naphthyl)-4''-(9-phenyl-9H-carbazol-3-yl)-triphenylamine (abbreviation: PCBNBB), a composite material of 2-[4-(3,6-diphenyl-9H-carbazol-9-yl)phenyl]dibenzo[f,H]quinoxaline (abbreviation: 2CzPDBq-III) and PCBNBB, a composite material of 2-[4-(dibenzothiophen-4-yl)phenyl]-1-phenyl-1H-benzimidazole (abbreviation: DBTBIm-II) and 4,4',4''-tris[N-(1-naphthyl)-N-phenylamino]-triphenylamine (abbreviation: 1'-TNATA), and the like. Alternatively, as the host material, it is possible to use a mixed material of 2mDBTPDBq-II and any of the following: 4,4'-bis[N-(1-naphthyl)-N-phenylamino]biphenyl (abbreviation: NPB), 4-(1-naphthyl)-4'-phenyltriphenylamine (abbreviation: αNBA1BP), 2,7-bis[N-(diphenylaminophenyl)-N-phenylamino]-spiro-9,9'-bifluorene (abbreviation: DPA2SF), 9-phenyl-9H-3-(9-phenyl-9H-carbazol-3-yl)carbazole (abbreviation: PCCP) and 1'-TNATA. Note that any other known host material can also be used without limitation to the above substances.

Further, by providing a plurality of layers and making the emission colors thereof different, light emission of a desired color can be obtained from the light-emitting element as a whole. For example, the emission colors of first and second light-emitting layers are complementary in a light-emitting element having the two light-emitting layers, so that the light-emitting element can be made to emit white light as a whole. Note that the word "complementary" means color relationship in which an achromatic color is obtained when colors are mixed. That is, white light emission can be obtained by mixture of light from substances whose emission colors are complementary colors. This can be applied to a light-emitting element having three or more light-emitting layers.

The electron-transport layer 704 is a layer that includes a substance having a high electron-transport property. Examples of the substance having a high electron-transport property are metal complexes such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxyphenyl)benzothiazolato]zinc (abbreviation: Zn(BTZ)$_2$). Other examples are heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), 4,4'-bis(5-methylbenzoxazol-2-yl)stilbene (abbreviation: BzOs). Still other examples are high molecular compounds such as poly(2,5-pyridine-diyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy). The substances mentioned here are mainly substances having an electron mobility of $10^{-6}$ cm$^2$/V·s or more. Note that other than these substances, any substance that has a property of transporting more holes than electrons may be used for the electron-transport layer.

Further, the electron-transport layer is not limited to a single layer, and may be a stack of two or more layers including any of the above substances.

The electron-injection layer 705 is a layer that includes a substance having a high electron-injection property. Examples of the substance that can be used for the electron-injection layer 705 are alkali metals, alkaline earth metals, and compounds thereof, such as lithium, cesium, calcium, lithium fluoride, cesium fluoride, calcium fluoride, and lithium oxide, rare earth metal compounds, such as erbium fluoride, and the above-mentioned substances used for the electron-transport layer 704.

Alternatively, a composite material formed by combining an organic compound and an electron donor (a donor) may be used for the electron-injection layer 705. Such a composite material has high electron-injection and electron-transport properties because electrons are generated in the organic compound by the electron donor. The organic compound here is preferably a material excellent in transporting the generated electrons, and specifically any of the above substances (such as metal complexes and heteroaromatic compounds) for the electron-transport layer 704 can be used. As the electron donor, a substance showing an electron-donating property with respect to the organic compound may be used. Preferable specific examples of the electron donor are alkali metals, alkaline earth metals, and rare earth metals, such as lithium, cesium, magnesium, calcium, erbium, and ytterbium, and alkali metal oxides and alkaline earth metal oxides, such as lithium oxide, calcium oxide, and barium oxide. Further, a Lewis base such as magnesium oxide or an organic compound such as tetrathiafulvalene (abbreviation: TTF) can be used.

Note that the hole-injection layer 701, the hole-transport layer 702, the light-emitting layer 703, the electron-transport layer 704, and the electron-injection layer 705 which are mentioned above can each be formed by a method such as an evaporation method (including a vacuum evaporation method), an inkjet method, or a coating method.

A plurality of EL layers may be stacked between the first electrode 103 and the second electrode 108 as illustrated in FIG. 15B. In that case, a charge-generation layer 803 is preferably provided between a first EL layer 800 and a second EL layer 801 which are stacked. The charge-generation layer 803 can be formed using the above-described composite material. Further, the charge-generation layer 803 may have a stacked structure of a layer including the composite material and a layer including another material. In that case, as the layer including another material, a layer including an electron-donating substance and a substance having a high electron-transport property, a layer formed of a transparent conductive film, or the like can be used. As for a light-emitting element having such a structure, problems of energy transfer and quenching hardly occur, and a light-emitting element which has both high emission efficiency and a long lifetime can be easily obtained owing to a wider choice of materials. Moreover, a light-emitting element which provides phosphorescence from one of the EL layers and fluorescence from the other of the EL layers can be readily obtained. This structure can be combined with any of the above-described structures of the EL layer.

Furthermore, by making emission colors of EL layers different, light emission of a desired color can be obtained from the light-emitting element as a whole. For example, the emission colors of first and second EL layers are complementary in a light-emitting element having the two EL layers, so that the light-emitting element can be made to emit white light as a whole. Further, the same applies to a light-emitting element having three or more EL layers.

As illustrated in FIG. 15C, the EL layer 102 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 108, between the first electrode 103 and the second electrode 108.

It is preferable to provide the composite material layer 708 which is in contact with the second electrode 108, in which case damage caused to the EL layer 102 particularly when the second electrode 108 is formed by a sputtering method can be reduced. The composite material layer 708 can be formed using the above-described composite material in which an organic compound having a high hole-transport property contains an acceptor substance.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

The electron-injection buffer layer 706 can be formed using a substance having a high electron-injection property, such as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate).

Further, in the case where the electron-injection buffer layer 706 contains a substance having a high electron-transport property and a donor substance, the donor substance is preferably added so that the mass ratio of the donor substance to the substance having a high electron-transport property is in the range from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate). Note that as the substance having a high electron-transport property, a material similar to the material for the electron-transport layer 704 described above can be used.

Furthermore, it is preferable that the electron-relay layer 707 be formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

In the structure in which the electron-relay layer 707 is sandwiched between the composite material layer 708 and the electron-injection buffer layer 706, the acceptor substance included in the composite material layer 708 and the donor substance included in the electron-injection buffer layer 706 are less likely to interact with each other, and thus their functions hardly interfere with each other. Therefore, an increase in drive voltage can be prevented.

The electron-relay layer 707 includes a substance having a high electron-transport property and is formed so that the LUMO level of the substance having a high electron-transport property is located between the LUMO level of the acceptor substance included in the composite material layer 708 and the LUMO level of the substance having a high electron-transport property included in the electron-transport layer 704. In the case where the electron-relay layer 707 includes a donor substance, the donor level of the donor substance is also controlled so as to be located between the LUMO level of the acceptor substance included in the composite material layer 708 and the LUMO level of the substance having a high electron-transport property included in the electron-transport layer 704. As a specific value of the energy level, the LUMO level of the substance having a high electron-transport property included in the electron-relay layer 707 is preferably higher than or equal to −5.0 eV, more preferably higher than or equal to −5.0 eV and lower than or equal to −3.0 eV.

As the substance having a high electron-transport property included in the electron-relay layer 707, a phthalocyanine-based material or a metal complex having a metal-oxygen bond and an aromatic ligand is preferably used.

As the phthalocyanine-based material included in the electron-relay layer 707, specifically it is preferable to use any of CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is included in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond enables the light-emitting element to be driven more stably at a low voltage.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is likely to act on another molecule in terms of a molecular structure and an acceptor property is high.

Note that as the phthalocyanine-based materials mentioned above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent and therefore has the advantage of being easy to handle during formation of a light-emitting element and the advantage of facilitating maintenance of an apparatus used for film formation.

The electron-relay layer 707 may further include a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is included in the electron-relay layer 707, electrons can be transferred easily and the light-emitting element can be driven at a lower voltage.

In the case where a donor substance is included in the electron-relay layer 707, other than the materials given above as the substance having a high electron-transport property, a substance having a LUMO level higher than the acceptor level of the acceptor substance included in the composite material layer 708 can be used. Specifically, it is preferable to use a substance having a LUMO level higher than or equal to −5.0 eV, preferably higher than or equal to −5.0 eV and lower than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 707 because of its high stability.

Specific examples of the perylene derivative are 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

Specific examples of the nitrogen-containing condensed aromatic compound are pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, it is possible to use 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPe), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene (abbreviation: DCMT), methanofullerenes (e.g., [6,6]-phenyl C$_{61}$ butyric acid methyl ester), or the like.

Note that in the case where a donor substance is included in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may each be formed using the above-described materials.

As described above, the EL layer 102 of this embodiment can be formed.

In the above-described light-emitting element, a current flows due to a potential difference generated between the first electrode 103 and the second electrode 108 and holes and electrons recombine in the EL layer 102, so that light is emitted. Then, this light emission is extracted to the outside through either the first electrode 103 or the second electrode 108 or both. Therefore, either the first electrode 103 or the second electrode 108, or both, is an electrode having a property of transmitting visible light.

Note that the structure of layers provided between the first electrode 103 and the second electrode 108 is not limited to the above-described structure. A structure other than the above may alternatively be employed as long as a light-emitting region in which holes and electrons recombine is provided in a portion away from the first electrode 103 and the second electrode 108 so as to prevent quenching due to proximity of the light-emitting region to metal.

In other words, there is no particular limitation on a stack structure of the layers. A layer including a substance having a high electron-transport property, a substance having a high hole-transport property, a substance having a high electron-injection property, a substance having a high hole-injection property, a bipolar substance (a substance having a high electron-transport property and a high hole-transport property), a hole-blocking material, or the like may freely be combined with a light-emitting layer.

By use of the light-emitting element described in this embodiment, a passive matrix light-emitting device or an active matrix light-emitting device in which driving of the light-emitting element is controlled by a transistor can be manufactured. Furthermore, the light-emitting device can be applied to an electronic device, a lighting device, or the like.

In the above-described manner, the light-emitting element of one embodiment of the present invention can be manufactured.

Note that this embodiment can be combined with the other embodiment as appropriate.

Example 1

Figure 1B:
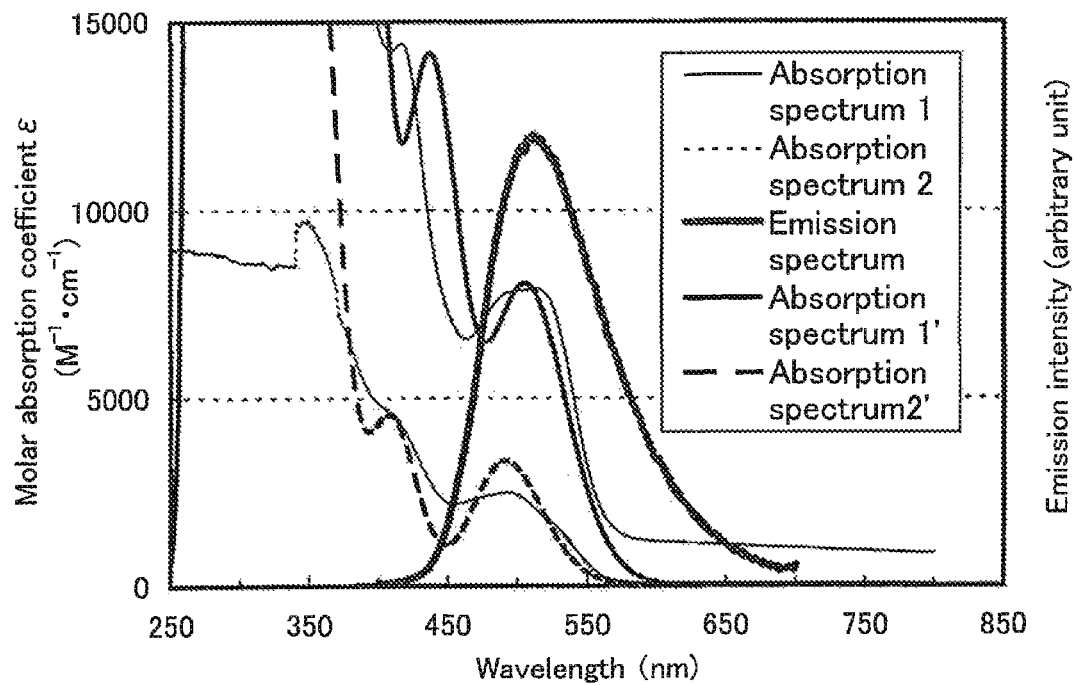
Figure 16:
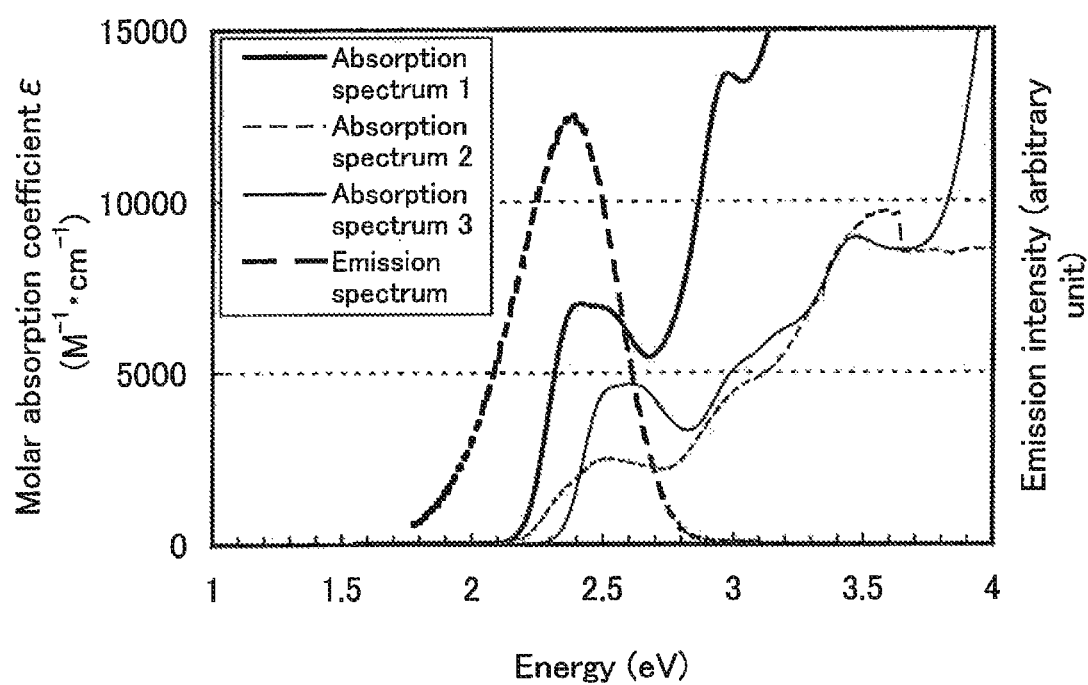
FIG. 16 shows absorption spectra and an emission spectrum according to Example 1.

Example 1 shows guest materials and a host material which can be included in the light-emitting element of one embodiment of the present invention with reference to FIGS. 1A and 1B and FIG. 16.

The guest materials used in this example are the following three types: (acetylacetonato)bis(4,6-diphenylpyrimidinato)iridium(III) (abbreviation: [Ir(dppm)$_2$(acac)]), bis(3,5-dimethyl-2-phenylpyrazinato)(dipivaloylmethanato)iridium(III) (abbreviation: [Ir(mppr-Me)$_2$(dpm)]), and (acetylacetonato)bis(6-methyl-4-phenylpyrimidinato)iridium(II) (abbreviation: [Ir(mppm)$_2$(acac)]). The host material used also in this example is a mixed material of 2-[3-(dibenzothiophen-4-yl)phenyl]dibenzo[f,h]quinoxaline (abbreviation: 2mDBTPDBq-II) and 4-phenyl-4'-(9-phenyl-9H-carbazol-3-yl)triphenylamine (abbreviation: PCBA1BP). Chemical formulas of materials used in this example are shown below.

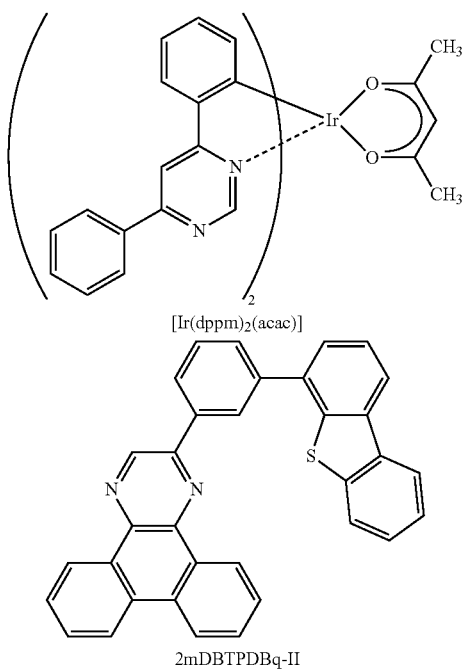

[Ir(dppm)$_2$(acac)]

2mDBTPDBq-II

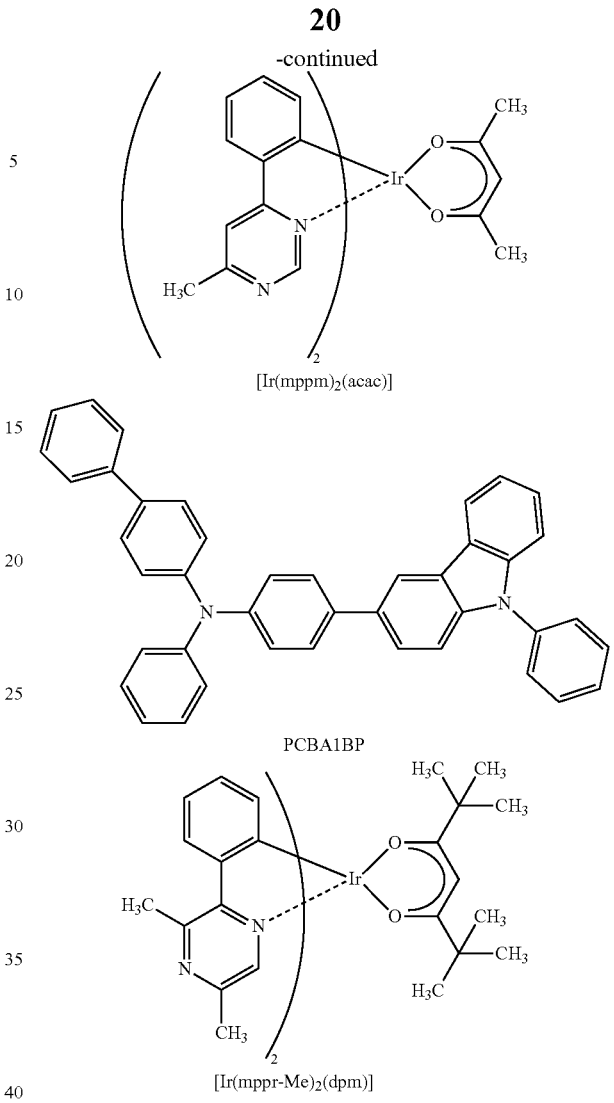

[Ir(mppm)$_2$(acac)]

PCBA1BP

[Ir(mppr-Me)$_2$(dpm)]

(Measurement Results of Absorption Spectra of Guest Materials and Emission Spectrum of Host Material)

(Absorption Spectra)

FIG. 1A and FIG. 16 show an ultraviolet-visible absorption spectrum (hereinafter simply referred to as absorption spectrum) of [Ir(dppm)$_2$(acac)] in a dichloromethane solution of [Ir(dppm)$_2$(acac)] as an absorption spectrum 1. Similarly, FIG. 1A and FIG. 16 also show an absorption spectrum of [Ir(mppr-Me)$_2$(dpm)] in a dichloromethane solution of [Ir(mppr-Me)$_2$(dpm)] as an absorption spectrum 2, and an absorption spectrum of [Ir(mppm)$_2$(acac)] in a dichloromethane solution of [Ir(mppm)$_2$(acac)] as an absorption spectrum 3.

Measurements of the respective absorption spectra were conducted at room temperature, by using an ultraviolet-visible light spectrophotometer (V550 type, manufactured by JASCO Corporation) with the dichloromethane solutions put in quartz cells.

(Emission Spectrum)

FIG. 1A and FIG. 16 also show an emission spectrum of a thin film of a mixed material of 2mDBTPDBq-II and PCBA1BP. In FIG. 1A, the horizontal axis represents wavelength (nm) and the vertical axes represent molar absorption coefficient ε (M$^{-1}$·cm$^{-1}$) and emission intensity (arbitrary unit). In FIG. 16, the horizontal axis represents energy (eV)

and the vertical axes represent molar absorption coefficient ε ($M^{-1} \cdot cm^{-1}$) and emission intensity (arbitrary unit).

FIG. 1A and FIG. 16 show that each of the absorption spectra 1 to 3 overlaps with the emission spectrum. Thus, it is indicated that a light-emitting element including a light-emitting layer in which any one of the guest materials of this example and the host material of this example are used together has high energy transfer efficiency because an energy transfers by using the overlap between the emission spectrum of the host material and the absorption spectrum of the guest material.

Here, in FIG. 1A and FIG. 16, attention is paid to peaks of longest-wavelength-side (lowest-energy-side) absorption bands (absorption bands which are considered to greatly contribute to light emission) in the absorption spectra and a peak of the emission spectrum. Of the peaks of the absorption spectra 1 to 3, the peak of the absorption spectrum 1 is the closest to the peak of the emission spectrum, and the peak of the absorption spectrum 3 is the farthest from the peak of the emission spectrum.

Specifically, in FIG. 16, the difference between the peak of the absorption spectrum 1 and the peak of the emission spectrum is 0.02 eV, the difference between the peak of the absorption spectrum 2 and the peak of the emission spectrum is 0.12 eV, and the difference between the peak of the absorption spectrum 3 and the peak of the emission spectrum is 0.23 eV.

Next, attention is paid to the molar absorption coefficients at the peaks of the longest-wavelength-side (lowest-energy-side) absorption bands in the absorption spectra in FIG. 1A. Of the absorption spectra 1 to 3, the absorption spectrum 1 has the highest molar absorption coefficient, and the absorption spectrum 2 has the lowest molar absorption coefficient.

That is, of the absorption spectra 1 to 3, the absorption spectrum 1 has the peak of the longest-wavelength-side (lowest-energy-side) absorption band closest to the peak of the emission spectrum, and the highest molar absorption coefficient at the peak.

From the above, it is found that the absorption spectrum 1 especially largely overlaps with the emission spectrum. Therefore, it is indicated that a light-emitting element including a mixed material of 2mDBTPDBq-II and PCBA1BP as the host material and [Ir(dppm)$_2$(acac)] as the guest material has especially high energy transfer efficiency because an energy transfers by using the overlap between the emission spectrum of the mixed material and the absorption spectrum of [Ir(dppm)$_2$(acac)].

(Calculation Results of Absorption Spectra of Guest Materials)

Next, reproduction of the absorption spectra of [Ir(dppm)$_2$(acac)] and [Ir(mppr-Me)$_2$(dpm)] (the absorption spectra 1 and 2 in FIG. 1A) which were obtained by the above measurements was attempted by calculation.

To obtain the absorption spectra of [Ir(dppm)$_2$(acac)] and [Ir(mppr-Me)$_2$(dpm)], excitation energies and oscillator intensities were calculated by using most stable structures of the respective molecules in ground states. Based on the calculated oscillator intensities, the absorption spectra were obtained. Specific calculation methods are shown below.

The most stable structures of [Ir(dppm)$_2$(acac)] and [Ir(mppr-Me)$_2$(dpm)] in the ground states were calculated by using the density functional theory (DFT). Next, the excitation energies and oscillator intensities of [Ir(dppm)$_2$(acac)] and [Ir(mppr-Me)$_2$(dpm)] were obtained by using the time-dependent density functional theory (TD-DFT), and the absorption spectra thereof were calculated by using the results. In the DFT, the total energy is represented as the sum of potential energy, electrostatic energy between electrons, electronic kinetic energy, and exchange-correlation energy including all the complicated interactions between electrons. Also in the DFT, an exchange-correlation interaction is approximated by a functional (that is, a function of another function) of one electron potential represented in terms of electron density to enable highly accurate calculations. Here, B3PW91 which was a hybrid functional was used to specify the weight of each parameter related to exchange-correlation energy. In addition, as a basis function, LanL2DZ was applied to Ir atoms, 6-311 (basis function of a triple-split valence basis set using three contraction functions for each valence orbital) was applied to atoms other than Ir atoms. The above basis function involves, for example, 1 s to 3 s orbitals in the case of hydrogen atoms, and 1 s to 4 s orbitals and 2p to 4p orbitals in the case of carbon atoms. Further, to improve calculation accuracy, the p function and the d function as polarization basis sets were added respectively to hydrogen atoms and atoms other than hydrogen atoms.

Note that Gaussian 09 was used as a quantum chemistry computational program. A high performance computer (Altix 4700, manufactured by SGI Japan, Ltd.) was used for the calculations.

FIG. 1B shows the absorption spectra obtained by the calculations. For comparison, FIG. 1B also shows the absorption spectra obtained by the above-described measurements. Specifically, the absorption spectrum of [Ir(dppm)$_2$(acac)] obtained by the measurements is shown as an absorption spectrum 1 and the absorption spectrum thereof obtained by the calculations is shown as an absorption spectrum 1'. Further, the absorption spectrum of [Ir(mppr-Me)$_2$(dpm)] obtained by the measurements is shown as an absorption spectrum 2 and the absorption spectrum thereof obtained by the calculations is shown as an absorption spectrum 2'. In FIG. 1B, the horizontal axis represents wavelength (nm) and the vertical axes represent molar absorption coefficient ε ($M^{-1} \cdot cm^{-1}$) and emission intensity (arbitrary unit)

As shown in FIG. 1B, the absorption spectrum 1 and the absorption spectrum 2 obtained by the measurements have substantially the same shapes as the absorption spectrum 1' and the absorption spectrum 2' obtained by the calculations, respectively. In particular, the following two tendencies of the absorption spectra 1 and 2 can also be seen in the absorption spectra 1' and 2'.

Tendency 1: The peak wavelength of the absorption spectrum 1 (1') is closer to the peak wavelength of the emission spectrum than the peak wavelength of the absorption spectrum 2 (2').

Tendency 2: The absorption spectrum 1 (1') has a higher molar absorption coefficient at the peak wavelength of the longest-wavelength-side absorption band thereof than the absorption spectrum 2 (2').

Example 2

Figure 2:
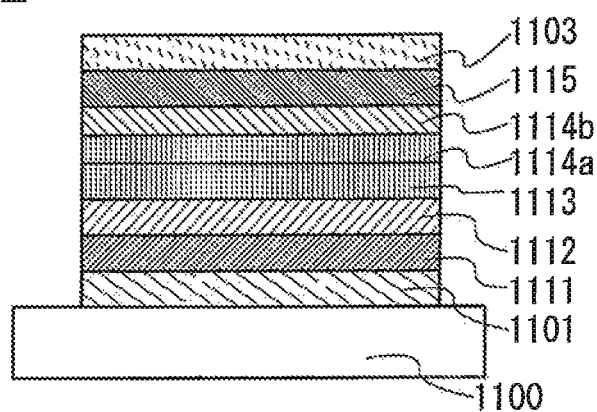
FIG. 2 illustrates the structure of light-emitting elements of Examples.

Example 2 shows a light-emitting element of one embodiment of the present invention with reference to FIG. 2. Chemical formulas of materials used in this example are shown below. Note that chemical formulas of the materials used in the above example are omitted here.

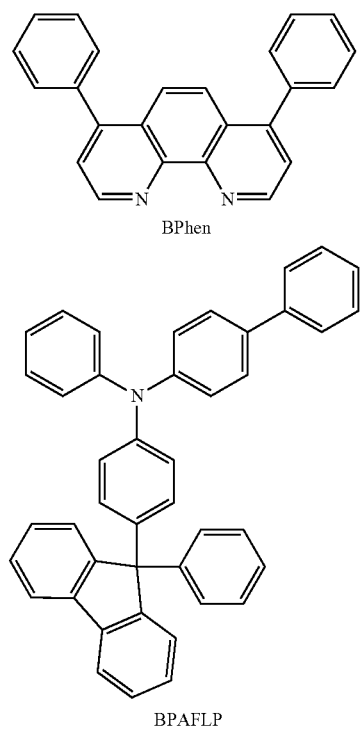

BPhen

BPAFLP

The following shows a method of fabricating light-emitting elements 1 to 3 of this example.

(Light-Emitting Element 1)

First, a film of indium tin oxide containing silicon oxide (ITSO) was formed over a glass substrate 1100 by a sputtering method, so that a first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for one hour and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in a vacuum evaporation apparatus such that a surface on which the first electrode 1101 was provided faced downward. The pressure in the vacuum evaporation apparatus was reduced to about $10^{-4}$ Pa. Then, 4-phenyl-4'-(9-phenylfluoren-9-yl)triphenylamine (abbreviation: BPAFLP) and molybdenum(VI) oxide were co-evaporated over the first electrode 1101, so that a hole-injection layer 1111 was formed. The thickness of the hole-injection layer 1111 was 40 nm, and the weight ratio of BPAFLP to molybdenum oxide was adjusted to 4:2 (=BPAFLP:molybdenum oxide).

Next, a BPAFLP film was formed to a thickness of 20 nm over the hole-injection layer 1111, so that a hole-transport layer 1112 was formed.

Further, 2mDBTPDBq-II, PCBA1BP, and [Ir(dppm)$_2$(acac)] were co-evaporated, so that a light-emitting layer 1113 was formed over the hole-transport layer 1112. The weight ratio of 2mDBTPDBq-II to PCBA1BP and [Ir(dppm)$_2$(acac)] was adjusted to 0.8:0.2:0.05 (=2mDBTPDBq-II:PCBA1BP:[Ir(dppm)$_2$(acac)]). The thickness of the light-emitting layer 1113 was 40 nm.

Next, a 2mDBTPDBq-II film was formed to a thickness of 10 nm over the light-emitting layer 1113, so that a first electron-transport layer 1114a was formed.

Next, a bathophenanthroline (abbreviation: BPhen) film was formed to a thickness of 20 nm over the first electron-transport layer 1114a, so that a second electron-transport layer 1114b was formed.

Further, a lithium fluoride (LiF) film was formed to a thickness of 1 nm over the second electron-transport layer 1114b by evaporation, so that an electron-injection layer 1115 was formed.

Lastly, an aluminum film was formed to a thickness of 200 nm by evaporation, so that a second electrode 1103 functioning as a cathode was formed. Thus, the light-emitting element 1 of this example was fabricated.

(Light-Emitting Element 2)

The light-emitting layer 1113 of the light-emitting element 2 was formed by co-evaporation of 2mDBTPDBq-II, PCBA1BP, and [Ir(mppr-Me)$_2$(dpm)]. The weight ratio of 2mDBTPDBq-II to PCBA1BP and [Ir(mppr-Me)$_2$(dpm)] was adjusted to 0.8:0.2:0.05 (=2mDBTPDBq-II:PCBA1BP:[Ir(mppr-Me)$_2$(dpm)]). The thickness of the light-emitting layer 1133 was 40 nm. The layers other than the light-emitting layer 1113 were formed in the same manner as that of the light-emitting element 1.

(Light-Emitting Element 3)

The light-emitting layer 1113 of the light-emitting element 3 was formed by co-evaporation of 2mDBTPDBq-II, PCBA1BP, and [Ir(mppm)$_2$(acac)]. The weight ratio of 2mDBTPDBq-II to PCBA1BP and [Ir(mppm)$_2$(acac)] was adjusted to 0.8:0.2:0.05 (=2mDBTPDBq-II:PCBA1BP:[Ir(mppm)$_2$(acac)]). The thickness of the light-emitting layer 1113 was 40 nm. The layers other than the light-emitting layer 1113 were formed in the same manner as that of the light-emitting element 1.

Note that, in the above evaporation process, evaporation was all performed by a resistance heating method.

Table 1 shows element structures of the thus obtained light-emitting elements 1 to 3.

TABLE 1

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 1 | ITSO 110 nm | BPAFLP:MoOx (=4:2) 40 nm | BPAFLP 20 nm | 2mDBTPDBq-II:PCBA1BP:[Ir(dppm)$_2$(acac)] (=0.8:0.2:0.05) 40 nm | 2mDBTPDBq-II 10 nm | BPhen 20 nm | LiF 1 nm | Al 200 nm |

TABLE 1-continued

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 2 | ITSO 110 nm | BPAFLP:MoOx (=4:2) 40 nm | BPAFLP 20 nm (=0.8:0.2:0.05) | 2mDBTPDBq-II:PCBA1BP:[Ir(mppr-Me)$_2$(dpm)] 40 nm | 2mDBTPDBq-II 10 nm | BPhen 20 nm | LiF 1 nm | Al 200 nm |
| Light-emitting Element 3 | ITSO 110 nm | BPAFLP:MoOx (=4:2) 40 nm | BPAFLP 20 nm (=0.8:0.2:0.05) | 2mDBTPDBq-II:PCBA1BP:[Ir(mppm)$_2$(acac)] 40 nm | 2mDBTPDBq-II 10 nm | BPhen 20 nm | LiF 1 nm | Al 200 nm |

In a glove box containing a nitrogen atmosphere, these light-emitting elements were sealed so as not to be exposed to air. Then, operation characteristics of these light-emitting elements were measured. Note that the measurements were carried out at room temperature (in an atmosphere kept at 25° C.).

Figure 3:
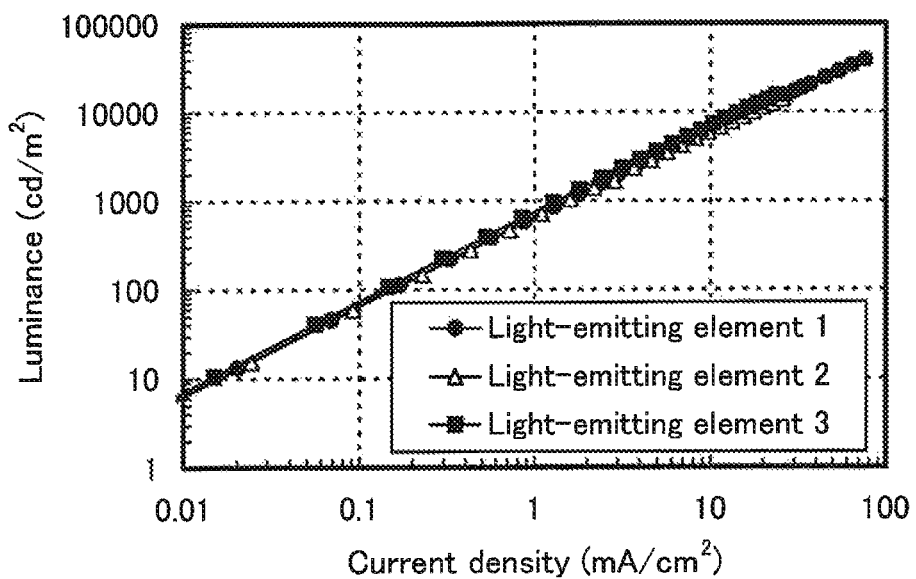
FIG. 3 shows current density versus luminance characteristics of light-emitting elements of Example 2.
Figure 4:
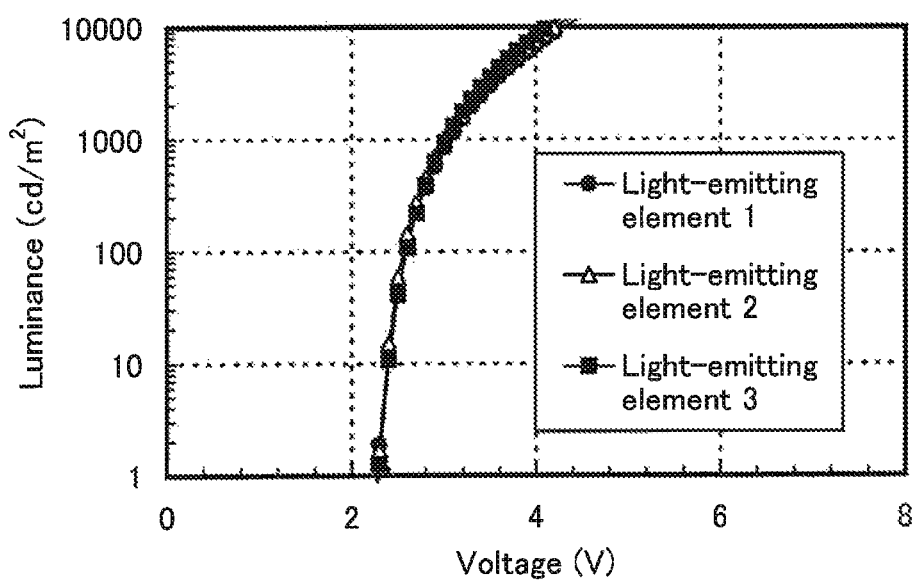
FIG. 4 shows voltage versus luminance characteristics of the light-emitting elements of Example 2.
Figure 5:
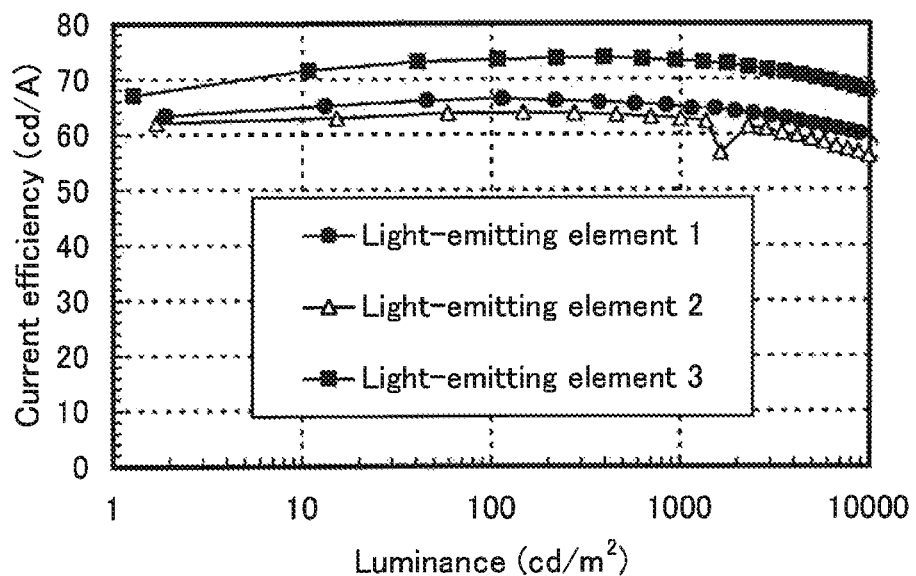
FIG. 5 shows luminance versus current efficiency characteristics of the light-emitting elements of Example 2.
Figure 6:
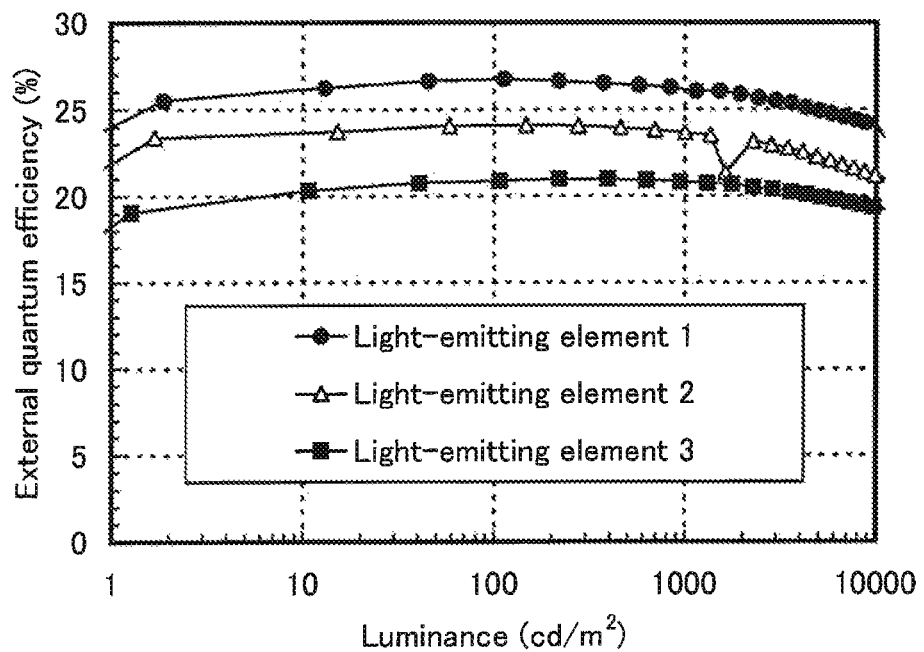
FIG. 6 shows luminance versus external quantum efficiency characteristics of the light-emitting elements of Example 2.

FIG. 3 shows current density versus luminance characteristics of the light-emitting elements 1 to 3. In FIG. 3, the horizontal axis represents current density (mA/cm$^2$) and the vertical axis represents luminance (cd/m$^2$). FIG. 4 shows voltage versus luminance characteristics. In FIG. 4, the horizontal axis represents voltage (V) and the vertical axis represents luminance (cd/m$^2$). FIG. 5 shows luminance versus current efficiency characteristics. In FIG. 5, the horizontal axis represents luminance (cd/m$^2$) and the vertical axis represents current efficiency (cd/A). FIG. 6 shows luminance versus external quantum efficiency characteristics. In FIG. 6, the horizontal axis represents luminance (cd/m$^2$) and the vertical axis represents external quantum efficiency (%).

Further, Table 2 shows the voltage (V), current density (mA/cm$^2$), CIE chromaticity coordinates (x, y), current efficiency (cd/A), power efficiency (lm/W), and external quantum efficiency (%) of the light-emitting elements 1 to 3 at a luminance of around 1000 cd/m$^2$.

TABLE 2

| | Votage (V) | Current Density (mA/cm$^2$) | Chromaticity (x, y) | Luminance (cd/m$^2$) | Current Efficiency (cd/A) | Power Efficiency (lm/W) | External Quantum Efficiency (%) |
|---|---|---|---|---|---|---|---|
| Light-emitting Element 1 | 3.9 | 1.3 | (0.56, 0.44) | 840 | 65 | 68 | 26 |
| Light-emitting Element 2 | 3.9 | 1.6 | (0.55, 0.45) | 1000 | 63 | 66 | 24 |
| Light-emitting Element 3 | 3.9 | 1.3 | (0.44, 0.55) | 940 | 77 | 76 | 28 |

Figure 7:
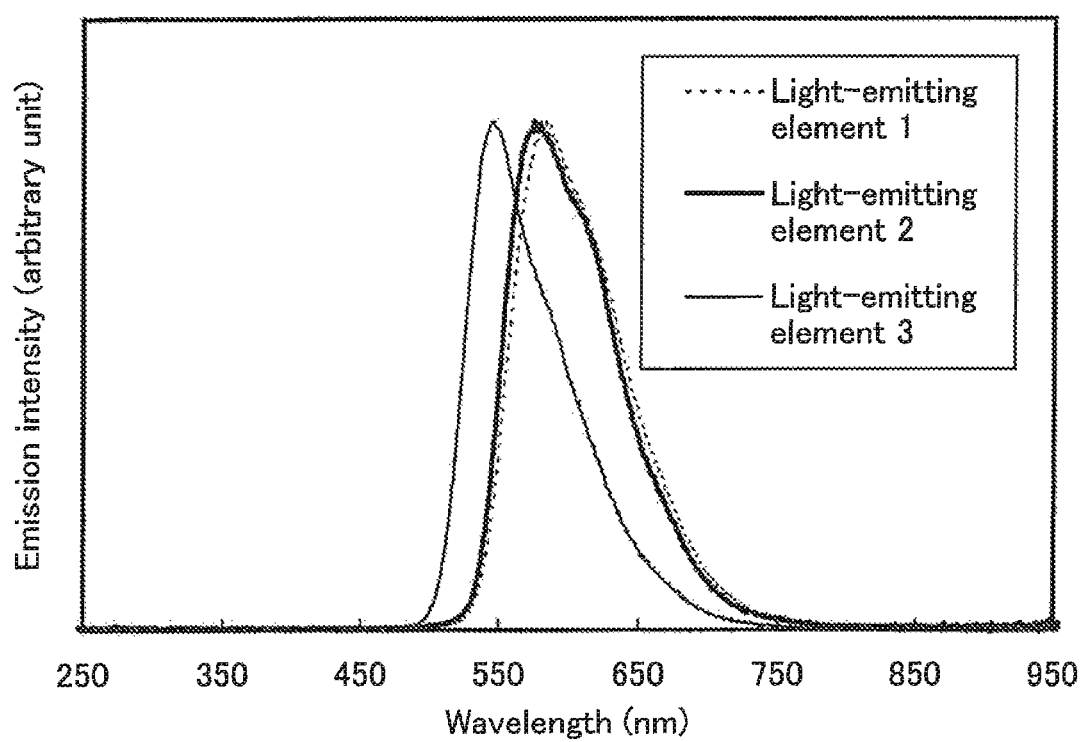
FIG. 7 shows emission spectra of the light-emitting elements of Example 2.

FIG. 7 shows emission spectra of the light-emitting elements 1 to 3 which were obtained by applying a current of 0.1 mA. In FIG. 7, the horizontal axis represents wavelength (nm) and the vertical axis represents emission intensity (arbitrary unit). As shown in Table 2, CIE chromaticity coordinates of the light-emitting element 1 at a luminance of 840 cd/m$^2$ were (x, y)=(0.56, 0.44), CIE chromaticity coordinates of the light-emitting element 2 at a luminance of 1000 cd/m$^2$ were (x, y)=(0.55, 0.45), and CIE chromaticity coordinates of the light-emitting element 3 at a luminance of 940 cd/m$^2$ were (x, y)=(0.44, 0.55). The results indicate that the light-emitting element 1 emits light originating from [Ir(dppm)$_2$(acac)], the light-emitting element 2 emits light originating from [Ir(mppr-Me)$_2$(dpm)], and the light-emitting element 3 emits light originating from [Ir(mppm)$_2$(acac)].

As can be seen from Table 2 and FIGS. 3 to 6, each of the light-emitting elements 1 to 3 has high current efficiency, high power efficiency, and high external quantum efficiency.

In the light-emitting elements of this example, the light-emitting layers include the host material and guest materials described in Example 1. As described in Example 1, the respective absorption spectra of the guest materials included in the light-emitting elements 1 to 3 overlap with the emission spectrum of the host material. The light-emitting elements of this example are considered to have high energy transfer efficiency and external quantum efficiency because energies transfer by using the overlaps.

Further, the light-emitting element 1 has higher external quantum efficiency than the light-emitting elements 2 and 3. According to the results in Example 1, in the lowest-energy-side absorption band in the absorption spectrum of the guest material included in the light-emitting element 1, the peak thereof is the closest to the peak of the emission spectrum (the difference between the peaks is 0.02 eV), and the molar absorption coefficient at the peak wavelength is the highest (>5000 M$^{-1}$·cm$^{-1}$). Thus, it is indicated that the especially high energy transfer efficiency of the light-emitting element 1 results in the high external quantum efficiency.

Further, the light-emitting element 2 has higher external quantum efficiency than the light-emitting element 3. According to the results in Example 1, the peak wavelength of the absorption spectrum 2 is closer to the peak wavelength of the emission spectrum than the peak wavelength of the absorption spectrum 3. Thus, it is indicated that this is the reason why external quantum efficiency characteristics of the light-emitting elements 2 and 3 differ from each other.

The above results indicate that application of one embodiment of the present invention makes it possible to achieve a light-emitting element with high external quantum efficiency.

Figure 8:
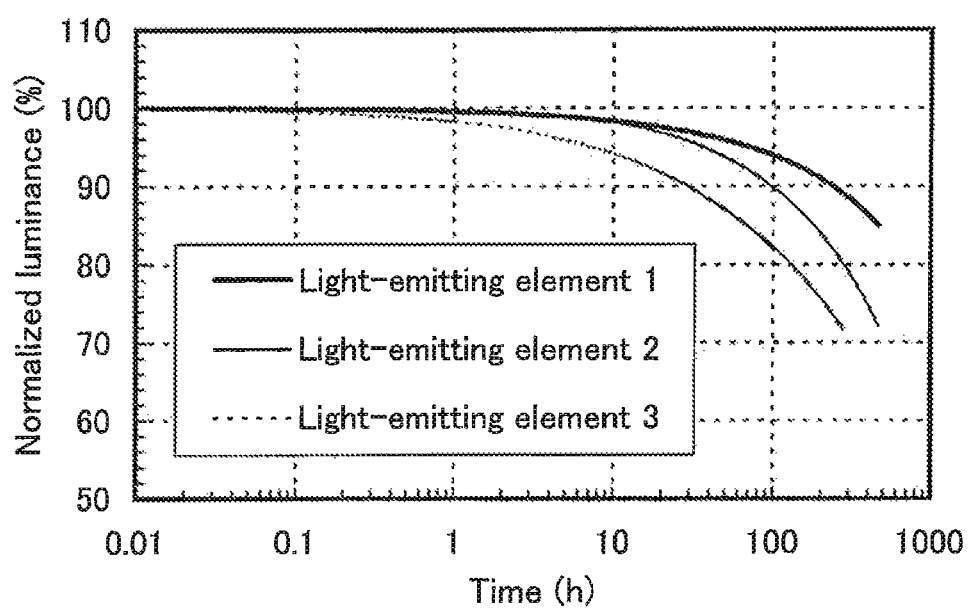
FIG. 8 shows results of reliability tests of the light-emitting elements of Example 2.

Next, reliability tests of the light-emitting elements 1 to 3 were conducted. FIG. 8 shows the results of the reliability tests. In FIG. 8, the vertical axis represents normalized luminance (%) on the assumption that an initial luminance is 100%, and the horizontal axis represents driving time (h) of the elements.

In the reliability tests, the light-emitting elements 1 to 3 were each driven under the conditions where the initial luminance was set to 5000 cd/m² and the current density was constant.

The light-emitting element 1 kept 85% of the initial luminance after 470 hour driving. The light-emitting element 2 kept 72% of the initial luminance after 470 hour driving. The light-emitting element 3 kept 72% of the initial luminance after 280 hour driving.

The above results indicate that application of one embodiment of the present invention makes it possible to achieve a light-emitting element with a long lifetime.

Example 3

Example 3 shows a light-emitting element of one embodiment of the present invention with reference to FIG. 2. The materials used in this example are used in the above examples, and therefore the chemical formulas thereof are omitted here.

The following shows a method of fabricating a light-emitting element 4 of this example.

(Light-Emitting Element 4)

First, a film of indium tin oxide containing silicon oxide (ITSO) was formed over the glass substrate 1100 by a sputtering method, so that the first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in a vacuum evaporation apparatus such that a surface on which the first electrode 1101 was provided faced downward. The pressure in the vacuum evaporation apparatus was reduced to about $10^{-4}$ Pa. Then, BPAFLP and molybdenum(VI) oxide were co-evaporated over the first electrode 1101, so that the hole-injection layer 1111 was formed. The thickness of the hole-injection layer 1111 was 40 nm, and the weight ratio of BPAFLP to molybdenum oxide was adjusted to 4:2 (=BPAFLP:molybdenum oxide).

Next, a BPAFLP film was formed to a thickness of 20 nm over the hole-injection layer 1111, so that the hole-transport layer 1112 was formed.

Further, 2mDBTPDBq-II, PCBA1BP, and [Ir(dppm)$_2$(acac)] were co-evaporated, so that the light-emitting layer 1113 was formed over the hole-transport layer 1112. The weight ratio of 2mDBTPDBq-II to PCBA1BP and [Ir(dppm)$_2$(acac)] was adjusted to 0.8:0.2:0.1 (=2mDBTPDBq-II:PCBA1BP:[Ir(dppm)$_2$(acac)]). The thickness of the light-emitting layer 1113 was 40 nm.

Next, a 2mDBTPDBq-II film was formed to a thickness of 15 nm over the light-emitting layer 1113, so that the first electron-transport layer 1114a was formed.

Next, a BPhen film was formed to a thickness of 15 nm over the first electron-transport layer 1114a, so that the second electron-transport layer 1114b was formed.

Further, a LiF film was formed to a thickness of 1 nm over the second electron-transport layer 1114b by evaporation, so that the electron-injection layer 1115 was formed.

Lastly, an aluminum film was formed to a thickness of 200 nm by evaporation, so that the second electrode 1103 functioning as a cathode was formed. Thus, the light-emitting element 4 of this example was fabricated.

Note that, in the above evaporation process, evaporation was all performed by a resistance heating method.

Table 3 shows element structures of the thus obtained light-emitting element 4.

TABLE 3

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 4 | ITSO 110 nm | BPAFLP:MoOx (=4:2) 40 nm | BPAFLP 20 nm | 2mDBTPDBq-II:PCBA1BP:[Ir(dppm)$_2$(acac)] (=0.8:0.2:0.1) 40 nm | 2mDBTPDBq-II 15 nm | BPhen 15 nm | LiF 1 nm | Al 200 nm |

In a glove box containing a nitrogen atmosphere, the light-emitting element 4 was sealed so as not to be exposed to air. Then, operation characteristics of the light-emitting element were measured. Note that the measurements were carried out at room temperature (in an atmosphere kept at 25° C.).

Figure 9:
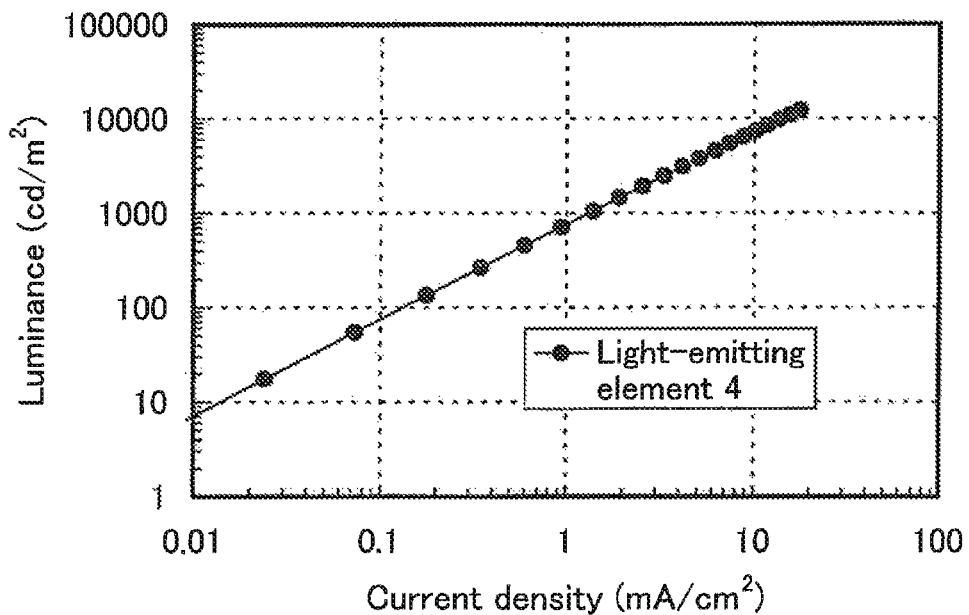
FIG. 9 shows current density versus luminance characteristics of a light-emitting element of Example 3.
Figure 10:
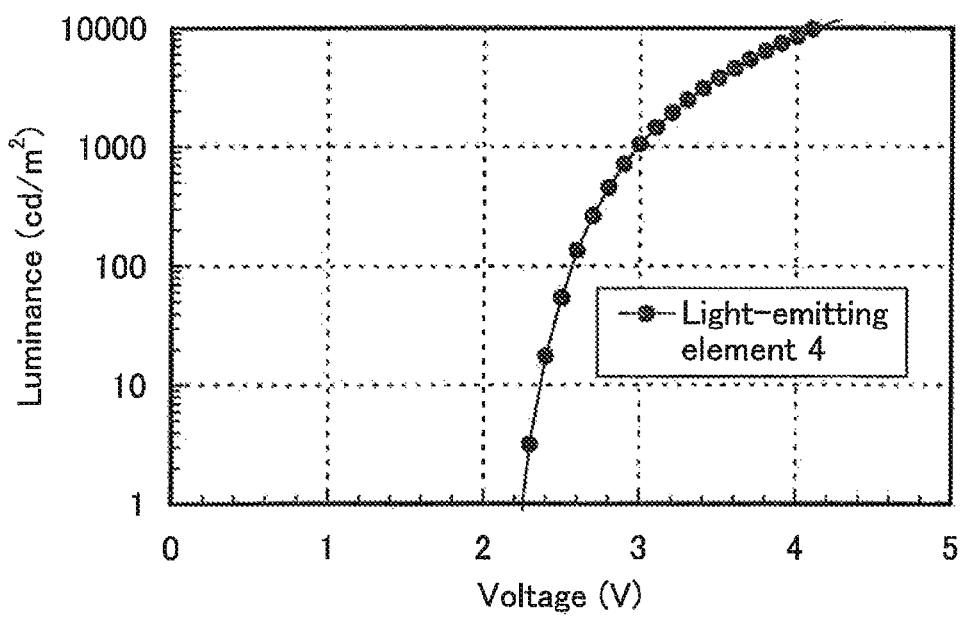
FIG. 10 shows voltage versus luminance characteristics of the light-emitting element of Example 3.
Figure 11:
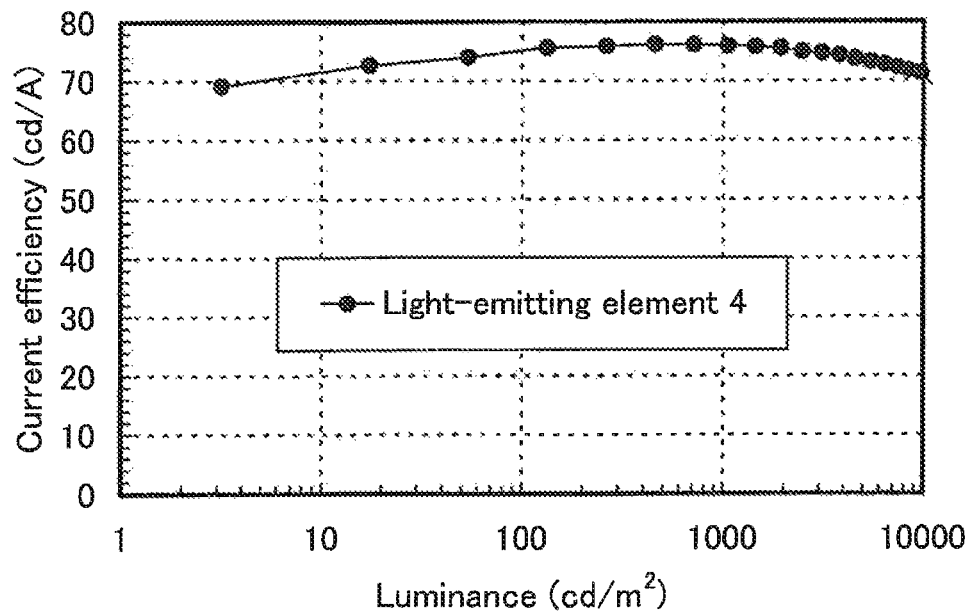
FIG. 11 shows luminance versus current efficiency characteristics of the light-emitting element of Example 3.
Figure 12:
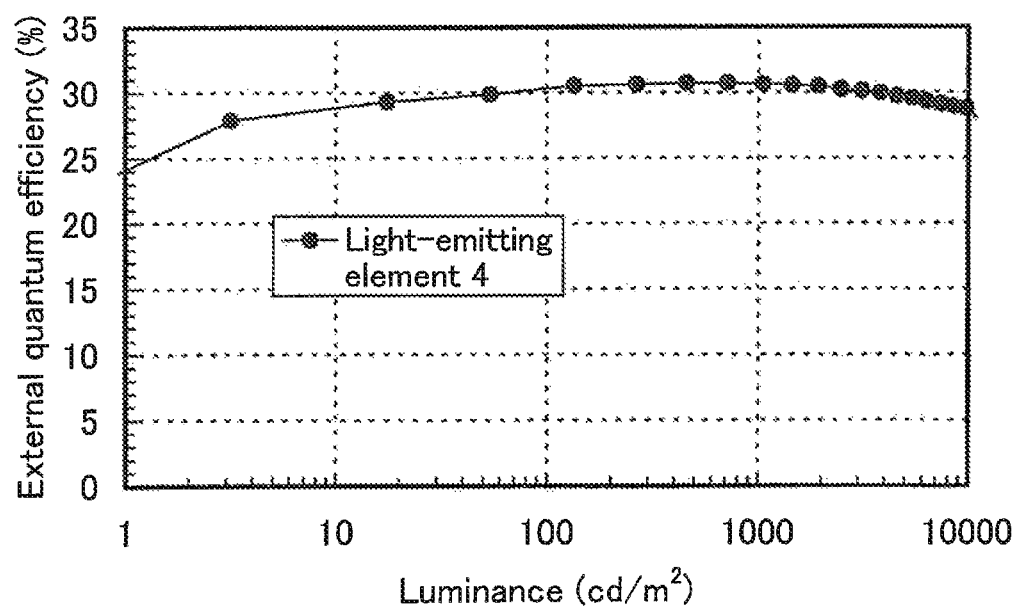
FIG. 12 shows luminance versus external quantum efficiency characteristics of the light-emitting element of Example 3.

FIG. 9 shows current density versus luminance characteristics of the light-emitting element 4. In FIG. 9, the horizontal axis represents current density (mA/cm²) and the vertical axis represents luminance (cd/m²). FIG. 10 shows voltage versus luminance characteristics. In FIG. 10, the horizontal axis represents voltage (V) and the vertical axis represents luminance (cd/m²). FIG. 11 shows luminance versus current efficiency characteristics. In FIG. 11, the horizontal axis represents luminance (cd/m²) and the vertical axis represents current efficiency (cd/A). FIG. 12 shows luminance versus external quantum efficiency characteristics. In FIG. 12, the horizontal axis represents luminance (cd/m²) and the vertical axis represents external quantum efficiency (%).

Further, Table 4 shows the voltage (V), current density (mA/cm²), CIE chromaticity coordinates (x, y), current efficiency (cd/A), power efficiency (lm/W), and external quantum efficiency (%) of the light-emitting element 4 at a luminance of around 1100 cd/m².

TABLE 4

| | Votage (V) | Current Density; (mA/cm$^2$) | Chromaticity (x, y) | Current Efficiency (cd/A) | Power Efficiency (lm/W) | External Quantum Efficiency (%) |
|---|---|---|---|---|---|---|
| Light-emitting Element 4 | 3.0 | 1.4 | (0.57, 0.43) | 76 | 70 | 31 |

Figure 13:
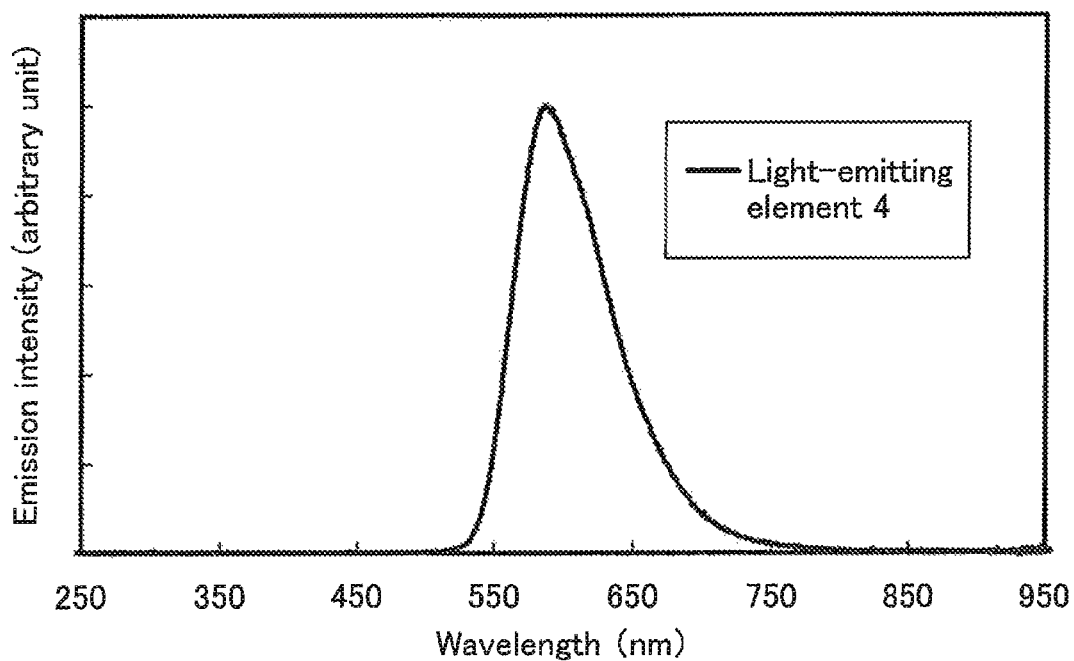
FIG. 13 shows an emission spectrum of the light-emitting element of Example 3.

FIG. 13 shows an emission spectrum of the light-emitting element 4 which was obtained by applying a current of 0.1 mA. In FIG. 13, the horizontal axis represents wavelength (nm) and the vertical axis represents emission intensity (arbitrary unit). As shown in Table 4, CIE chromaticity coordinates of the light-emitting element 4 at a luminance of 1100 cd/m$^2$ were (x, y)=(0.57, 0.43). The results indicate that the light-emitting element 4 emits light originating from [Ir(dppm)$_2$(acac)].

As can be seen from Table 4 and FIGS. 9 to 12, the light-emitting element 4 has high current efficiency, high power efficiency, and high external quantum efficiency. In particular, the light-emitting element 4 has an extremely high external quantum efficiency at a luminance of 1100 cd/m$^2$, which is 31%. As described above, the limit of the external quantum efficiency has been said to be approximately 25%. However, the result is beyond the limit.

In the light-emitting element of this example, the light-emitting layer includes the host material and guest material described in Example 1. As described in Example 1, the absorption spectrum of the guest material included in the light-emitting element 4 overlaps with the emission spectrum of the host material. The light-emitting element of this example is considered to have high energy transfer efficiency and external quantum efficiency because an energy transfers by using the overlap.

Further, according to the results in Example 1, in the longest-wavelength-side absorption band in the absorption spectrum of the guest material included in the light-emitting element 4, the peak wavelength thereof is close to the peak wavelength of the emission spectrum (the difference between the peaks is 0.02 eV), and the molar absorption coefficient at the peak wavelength is high (>5000 M$^{-1}$·cm$^{-1}$). Thus, it is indicated that the especially high energy transfer efficiency of the light-emitting element 4 results in the novel high external quantum efficiency.

The above results indicate that application of one embodiment of the present invention makes it possible to achieve a light-emitting element with high external quantum efficiency.

Figure 14:
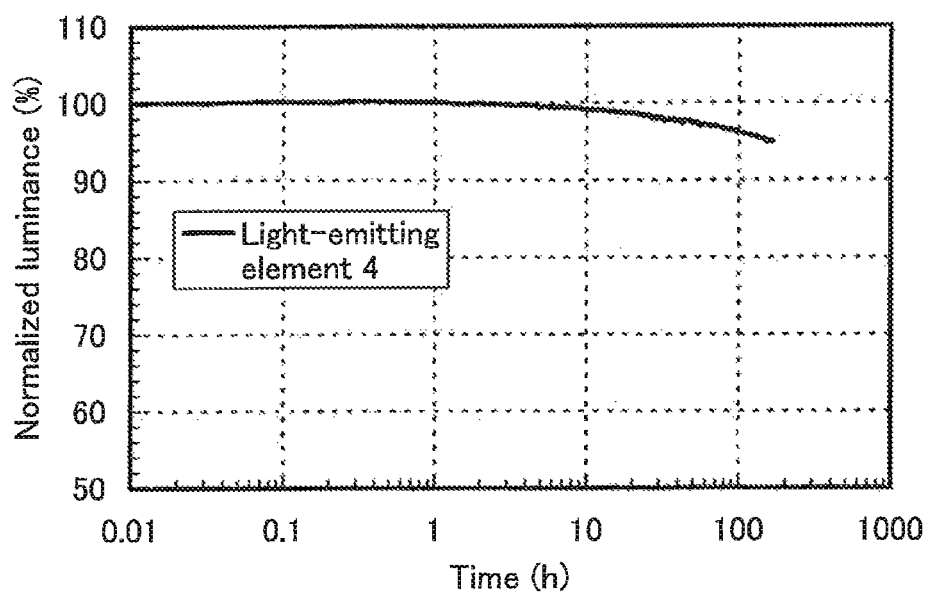
FIG. 14 shows results of reliability tests of the light-emitting element of Example 3.

Next, reliability tests of the light-emitting element 4 were conducted. FIG. 14 shows the results of the reliability tests. In FIG. 14, the vertical axis represents normalized luminance (%) on the assumption that an initial luminance is 100%, and the horizontal axis represents driving time (h) of the element.

In the reliability tests, the light-emitting element 4 was driven under the conditions where the initial luminance was set to 5000 cd/m$^2$ and the current density was constant.

The light-emitting element 4 kept 95% of the initial luminance after 170 hour driving.

The above results indicate that application of one embodiment of the present invention makes it possible to achieve a light-emitting element with high reliability.

Example 4

Figure 17A:
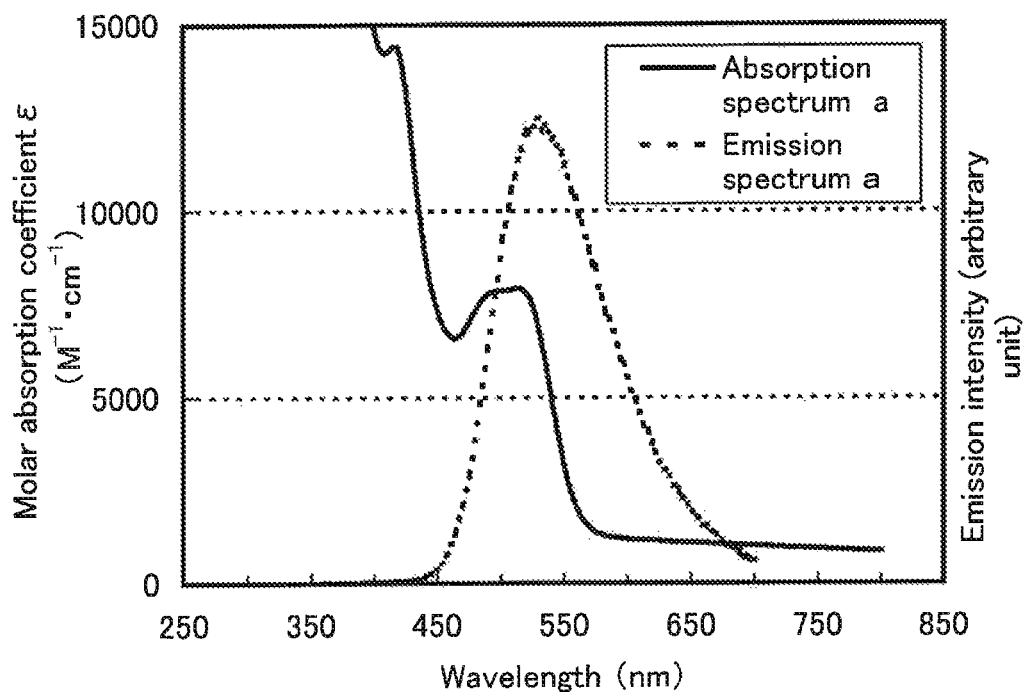
FIGS. 17A and 17B show absorption spectra and emission spectra according to Example 4.
Figure 17B:
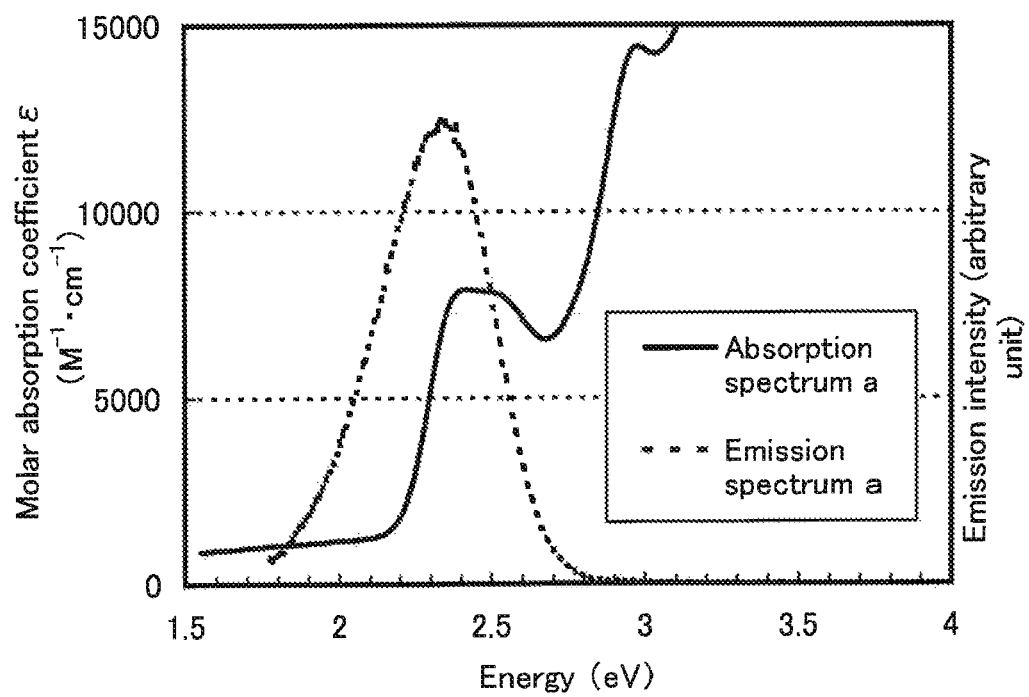

Example 4 shows examples of a guest material and a host material which can be included in the light-emitting element of one embodiment of the present invention with reference to FIGS. 17A and 17B.

The guest material used in this example is [Ir(dppm)$_2$(acac)]. The host material used also in this example is a mixed material of 2mDBTPDBq-II and 4,4'-bis[N-(1-naphthyl)-N-phenylamino]biphenyl (abbreviation: NPB). A chemical formula of a material used in this example is shown below. Note that chemical formulas of the materials used in the above examples are omitted here.

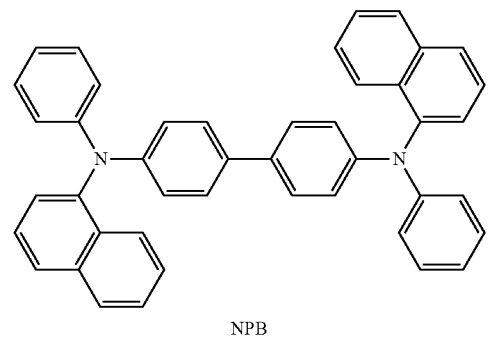

NPB (Absorption Spectrum)

FIGS. 17A and 17B show an ultraviolet-visible absorption spectrum (absorption spectrum a) of [Ir(dppm)$_2$(acac)] in a dichloromethane solution of [Ir(dppm)$_2$(acac)]. Measurements of the absorption spectrum were conducted at room temperature, by using an ultraviolet-visible light spectrophotometer (V550 type, manufactured by JASCO Corporation) with the dichloromethane solution (0.093 mmol/L) put in a quartz cell.

(Emission Spectrum)

FIGS. 17A and 17B also show an emission spectrum (emission spectrum a) of a thin film of a mixed material of 2mDBTPDBq-II and NPB. In FIG. 17A, the horizontal axis represents wavelength (nm) and the vertical axes represent molar absorption coefficient ε (M$^{-1}$·cm$^{-1}$) and emission intensity (arbitrary unit). In FIG. 17B, the horizontal axis represents energy (eV) and the vertical axes represent molar absorption coefficient ε (M$^{-1}$·cm$^{-1}$) and emission intensity (arbitrary unit).

The absorption spectrum a in FIG. 17A indicates that [Ir(dppm)$_2$(acac)] has a broad absorption band around 520 nm. This absorption band is considered to greatly contribute to light emission.

The peak of the emission spectrum a is found to have a large overlap with the absorption band in the absorption spectrum a, which is considered to greatly contribute to light emission. Specifically, the difference between the peak (515 nm) of the absorption band in the absorption spectrum a and the peak of the emission spectrum a is 0.09 eV. Thus, it is indicated that a light-emitting element including a light-emitting layer in which the guest material and host material of this example are used together has high energy transfer efficiency because an energy transfers by using the overlap between the emission spectrum of the host material and the absorption spectrum of the guest material. Therefore, it is indicated that a light-emitting element with high external quantum efficiency can be obtained.

Example 5

Example 5 shows a light-emitting element of one embodiment of the present invention with reference to FIG. 2. A chemical formula of a material used in this example is shown below. Note that chemical formulas of the materials used in the above examples are omitted here.

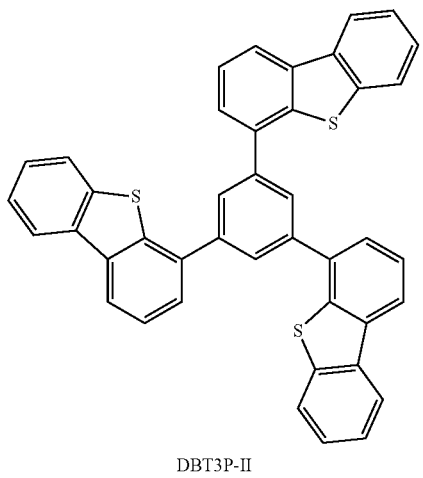 [SMILES: c1ccc2c(c1)sc1c(-c3cc(-c4cccc5c4sc4ccccc45)cc(-c4cccc5c4sc4ccccc45)c3)cccc12 ; "DBT3P-II"]

DBT3P-II

The following shows a method of fabricating a light-emitting element 5 of this example.

vacuum evaporation apparatus, and then the substrate 1100 was cooled down for about 30 minutes.

Next, the substrate 1100 provided with the first electrode 1101 was fixed to a substrate holder in a vacuum evaporation apparatus such that a surface on which the first electrode 1101 was provided faced downward. The pressure in the vacuum evaporation apparatus was reduced to about $10^{-4}$ Pa. Then, 4,4',4"-(1,3,5-benzenetriyl)tri(dibenzothiophene) abbreviation: DBT3P-II) and molybdenum(VI) oxide were co-evaporated over the first electrode 1101, so that the hole-injection layer 1111 was formed. The thickness of the hole-injection layer 1111 was 40 nm, and the weight ratio of DBT3P-II to molybdenum oxide was adjusted to 4:2 (=DBT3P-II:molybdenum oxide).

Next, a BPAFLP film was formed to a thickness of 20 nm over the hole-injection layer 1111, so that the hole-transport layer 1112 was formed.

Further, 2mDBTPDBq-II, NPB, and [Ir(dppm)$_2$(acac)] were co-evaporated, so that the light-emitting layer 1113 was formed over the hole-transport layer 1112. The weight ratio of 2mDBTPDBq-II to NPB and [Ir(dppm)$_2$(acac)] was adjusted to 0.8:0.2:0.05 (=2mDBTPDBq-II: NPB:[Ir(dppm)$_2$(acac)]). The thickness of the light-emitting layer 1113 was 40 nm.

Next, a 2mDBTPDBq-II film was formed to a thickness of 10 nm over the light-emitting layer 1113, so that the first electron-transport layer 1114a was formed.

Next, a BPhen film was formed to a thickness of 20 nm over the first electron-transport layer 1114a, so that the second electron-transport layer 1114b was formed.

Further, a LiF film was formed to a thickness of 1 nm over the second electron-transport layer 1114b by evaporation, so that the electron-injection layer 1115 was formed.

Lastly, an aluminum film was formed to a thickness of 200 nm by evaporation, so that the second electrode 1103 functioning as a cathode was formed. Thus, the light-emitting element 5 of this example was fabricated.

Note that, in the above evaporation process, evaporation was all performed by a resistance heating method.

Table 5 shows element structures of the thus obtained light-emitting element 5.

TABLE 5

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 5 | ITSO 11●nm | DBT3P-II: MoOx (=4:2) 1●nm | BPAFLP 2●nm | 2mDBTPDBq-II: NPB: (Ir(dppm)$_2$(acac)] (=●.8:●.2:●.●5) 4●nm | 2mDBTPDBq-II 1●nm | BPhen 2●nm | LiF 1 nm | Al 2●●nm |

(Light-Emitting Element 5)

First, an ITSO film was formed over the glass substrate 1100 by a sputtering method, so that the first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the In a glove box containing a nitrogen atmosphere, the light-emitting element 5 was sealed so as not to be exposed to air. Then, operation characteristics of the light-emitting element were measured. Note that the measurements were carried out at room temperature (in an atmosphere kept at 25° C.).

Figure 18:
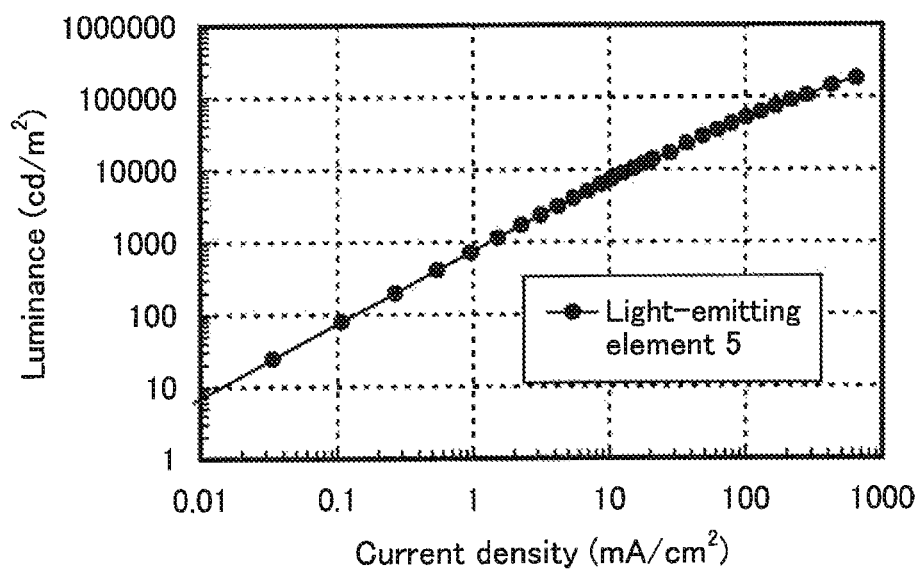
FIG. 18 shows current density versus luminance characteristics of a light-emitting element of Example 5.
Figure 19:
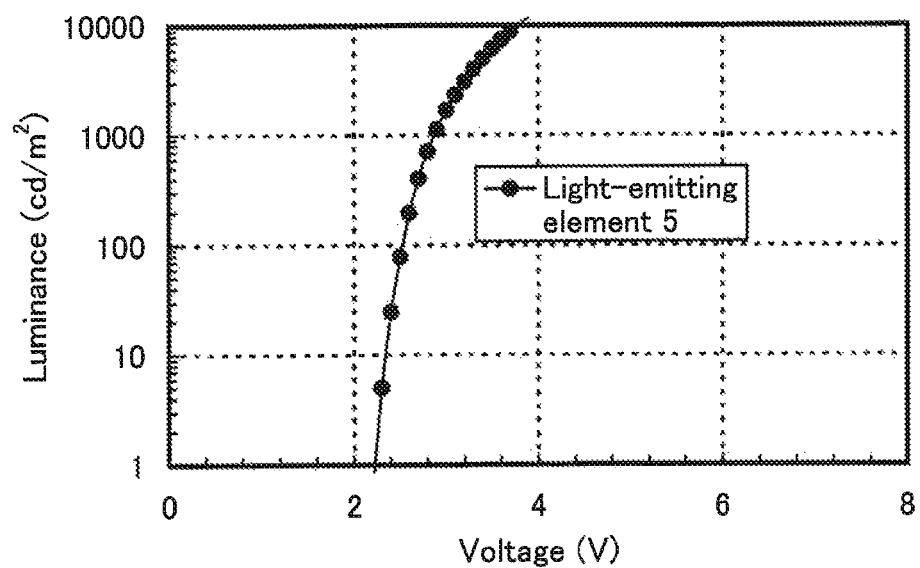
FIG. 19 shows voltage versus luminance characteristics of the light-emitting element of Example 5.
Figure 20:
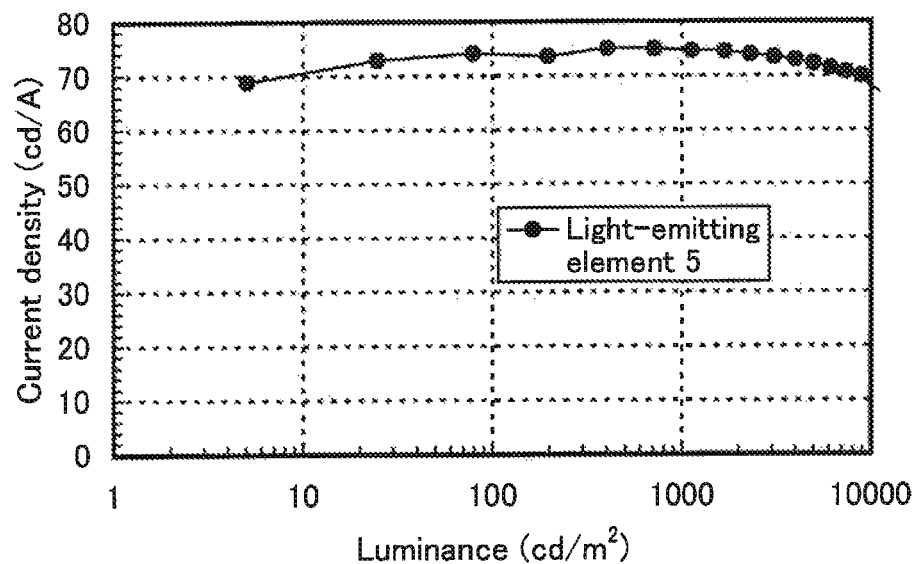
FIG. 20 shows luminance versus current efficiency characteristics of the light-emitting element of Example 5.
Figure 21:
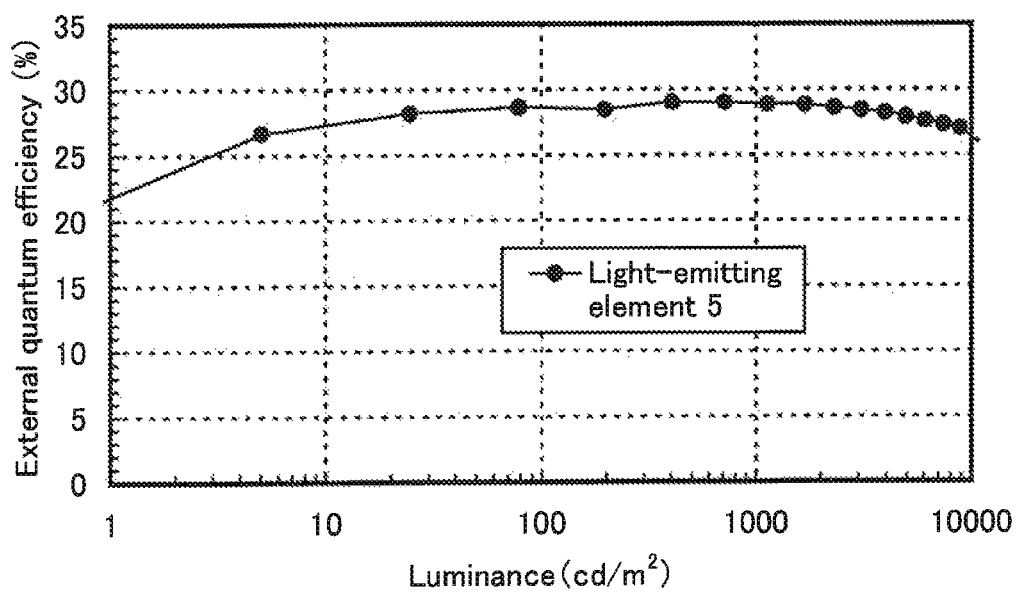
FIG. 21 shows luminance versus external quantum efficiency characteristics of the light-emitting element of Example 5.

FIG. 18 shows current density versus luminance characteristics of the light-emitting element 5. In FIG. 18, the horizontal axis represents current density (mA/cm$^2$) and the vertical axis represents luminance (cd/m$^2$). FIG. 19 shows voltage versus luminance characteristics. In FIG. 19, the horizontal axis represents voltage (V) and the vertical axis represents luminance (cd/m$^2$). FIG. 20 shows luminance versus current efficiency characteristics. In FIG. 20, the horizontal axis represents luminance (cd/m$^2$) and the vertical axis represents current efficiency (cd/A). FIG. 21 shows luminance versus external quantum efficiency characteristics. In FIG. 21, the horizontal axis represents luminance (cd/m$^2$) and the vertical axis represents external quantum efficiency (%).

Further, Table 6 shows the voltage (V), current density (mA/cm$^2$), CIE chromaticity coordinates (x, y), current efficiency (cd/A), power efficiency (lm/W), and external quantum efficiency (%) of the light-emitting element 5 at a luminance of around 1100 cd/m$^2$.

TABLE 6

|  | Votage (V) | Current Density (mA/cm$^2$) | Chromaticity (x, y) | Current Efficiency (cd/A) | Power Efficiency (lm/W) | External Quantum Efficiency (%) |
| --- | --- | --- | --- | --- | --- | --- |
| Light-emitting Element 5 | 2.9 | 1.5 | (0.57, 0.43) | 75 | 81 | 29 |

Figure 22:
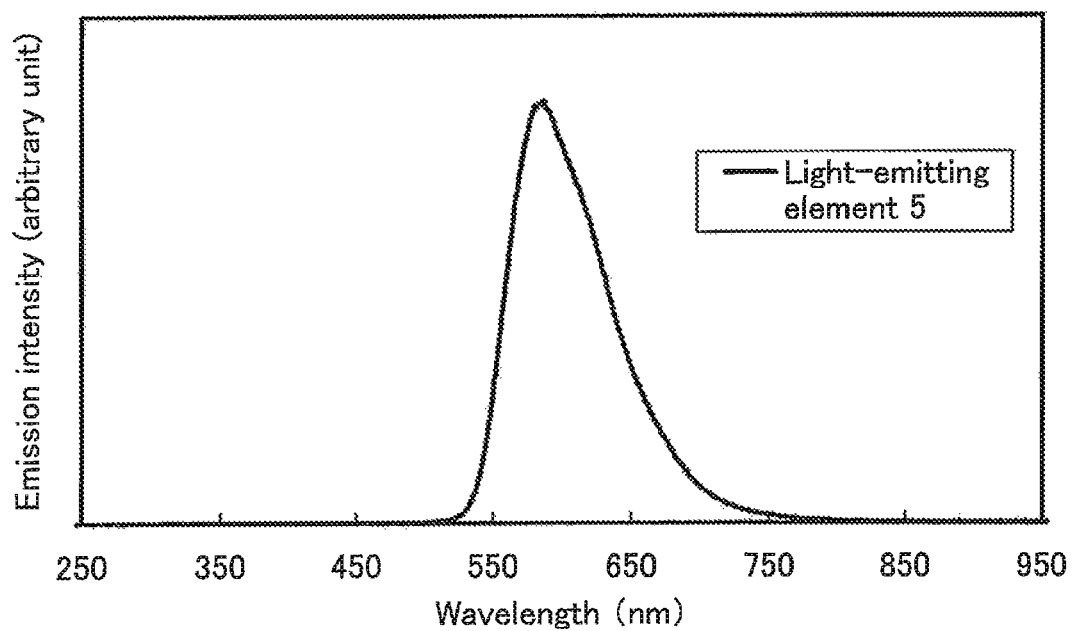
FIG. 22 shows an emission spectrum of the light-emitting element of Example 5.

FIG. 22 shows an emission spectrum of the light-emitting element 5 which was obtained by applying a current of 0.1 mA. In FIG. 22, the horizontal axis represents wavelength (nm) and the vertical axis represents emission intensity (arbitrary unit). As shown in Table 6, CIE chromaticity coordinates of the light-emitting element 5 at a luminance of 1100 cd/m$^2$ were (x, y)=(0.57, 0.43). The results indicate that the light-emitting element 5 emits light originating from [Ir(dppm)$_2$(acac)].

As can be seen from Table 6 and FIGS. 18 to 21, the light-emitting element 5 has high current efficiency, high power efficiency, and high external quantum efficiency.

In the light-emitting element 5, the light-emitting layer includes 2mDBTPDBq-II, NPB, and [Ir(dppm)$_2$(acac)] described in Example 4. As described in Example 4, the emission spectrum of the mixed material of 2mDBTPDBq-II and NPB largely overlaps with the absorption band which is considered to greatly contribute to light emission in the absorption spectrum of [Ir(dppm)$_2$(acac)]. The light-emitting element 5 is considered to have high energy transfer efficiency and external quantum efficiency because an energy transfers by using the overlap.

Further, according to the results in Example 4, in the longest-wavelength-side absorption band in the absorption spectrum of the guest material included in the light-emitting element 5, the peak thereof is close to the peak of the emission spectrum, and the molar absorption coefficient at the peak is high (>5000 M$^{-1}$·cm$^{-1}$). Thus, it is indicated that the especially high energy transfer efficiency of the light-emitting element 5 results in the novel high external quantum efficiency.

The above results indicate that application of one embodiment of the present invention makes it possible to achieve a light-emitting element with high external quantum efficiency.

Example 6

Figure 23A:
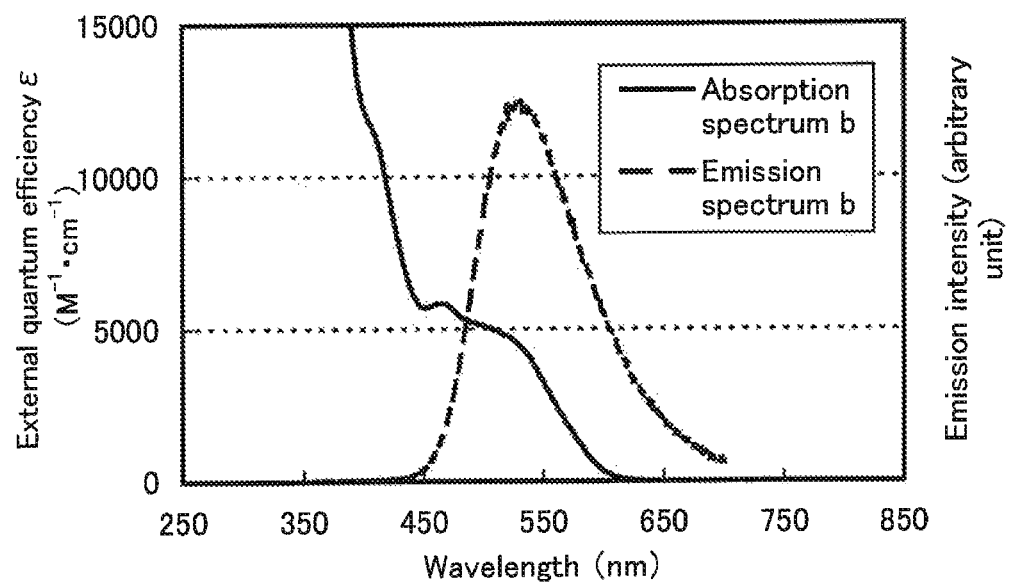
FIGS. 23A and 23B show absorption spectra and emission spectra according to Example 6.
Figure 23B:
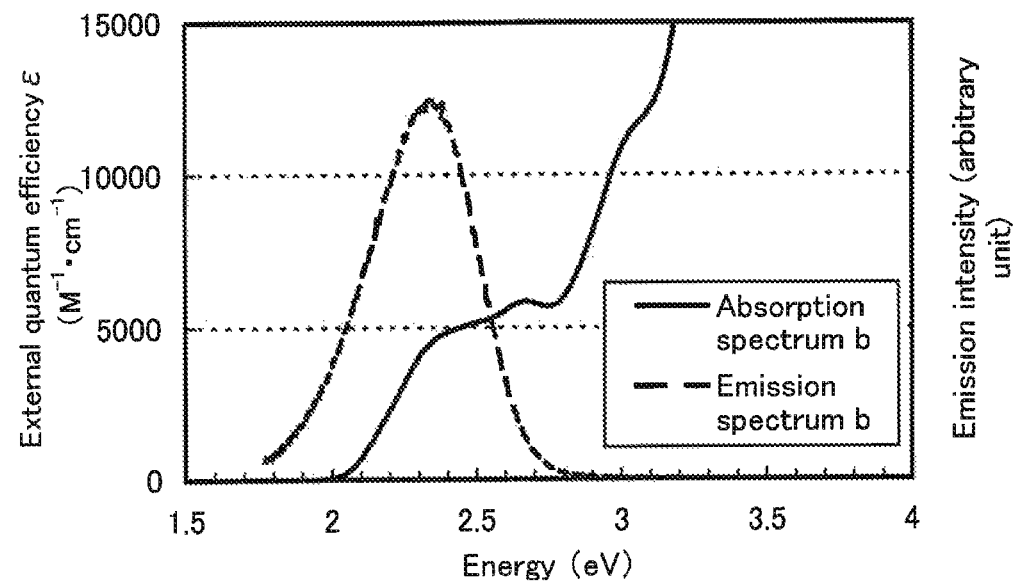

Example 6 shows examples of a guest material and a host material which can be included in the light-emitting element of one embodiment of the present invention with reference to FIGS. 23A and 23B.

The guest material used in this example is bis(2,3,5-triphenylpyrazinato)(dipivaloylmethanato)iridium(III) (abbreviation: [Ir(tppr)$_2$(dpm)]). The host material used also in this example is a mixed material of 2mDBTPDBq-II and NPB. A chemical formulas of a material used in this example is shown below. Note that chemical formulas of the materials used in the above examples are omitted here.

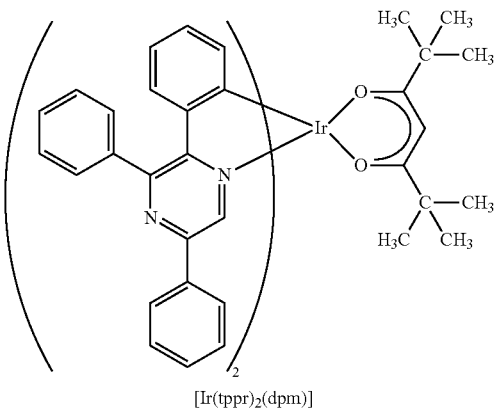

[Ir(tppr)$_2$(dpm)]

(Absorption Spectrum)

FIGS. 23A and 23B show an ultraviolet-visible absorption spectrum (absorption spectrum b) of [Ir(tppr)$_2$(dpm)] in a dichloromethane solution of [Ir(tppr)$_2$(dpm)]. Measurements of the absorption spectrum were conducted at room temperature, by using an ultraviolet-visible light spectrophotometer (V550 type, manufactured by JASCO Corporation) with the dichloromethane solution (0.094 mmol/L) put in a quartz cell.

(Emission Spectrum)

FIGS. 23A and 23B also show an emission spectrum (emission spectrum b) of a thin film of a mixed material of 2mDBTPDBq-II and NPB. In FIG. 23A, the horizontal axis represents wavelength (nm) and the vertical axes represent molar absorption coefficient ε (M$^{-1}$·cm$^{-1}$) and emission intensity (arbitrary unit). In FIG. 23B, the horizontal axis represents energy (eV) and the vertical axes represent molar absorption coefficient ε (M$^{-1}$·cm$^{-1}$) and emission intensity (arbitrary unit).

The absorption spectrum b in FIG. 23A indicates that [Ir(tppr)$_2$(dpm)] has a broad absorption band around 530 nm. This absorption band is considered to greatly contribute to light emission.

The peak of the emission spectrum b is found to have a large overlap with the absorption band in the absorption spectrum b, which is considered to greatly contribute to light emission. Specifically, the difference between the peak (shoulder peak around 530 nm) of the absorption band in the absorption spectrum b and the peak of the emission spectrum b is 0.01 eV. Thus, it is indicated that a light-emitting element including a light-emitting layer in which the guest material and host material of this example are used together has high energy transfer efficiency because an energy transfers by using the overlap between the emission spectrum of the host material and the absorption spectrum of the guest material. Therefore, it is indicated that a light-emitting element with high external quantum efficiency can be obtained.

Example 7

Example 7 shows a light-emitting element of one embodiment of the present invention with reference to FIG. 2. The materials used in this example are used in the above examples, and therefore the chemical formulas thereof are omitted here.

The following shows a method of fabricating a light-emitting element 6 of this example.

(Light-Emitting Element 6)

The light-emitting layer 1113 of the light-emitting element 6 was formed by co-evaporation of 2mDBTPDBq-II, NPB, and [Ir(tppr)$_2$(dpm)]. The weight ratio of 2mDBTPDBq-II to NPB and [Ir(tppr)$_2$(dpm)] was adjusted to 0.8:0.2:0.05 (=2mDBTPDBq-II: NPB:[Ir(tppr)$_2$(dpm)]). The thickness of the light-emitting layer 1113 was 40 nm. The light-emitting element 6 was fabricated in a manner similar to that in the light-emitting element 5 described in Example 5 except for the light-emitting layer 1113.

Figure 26:
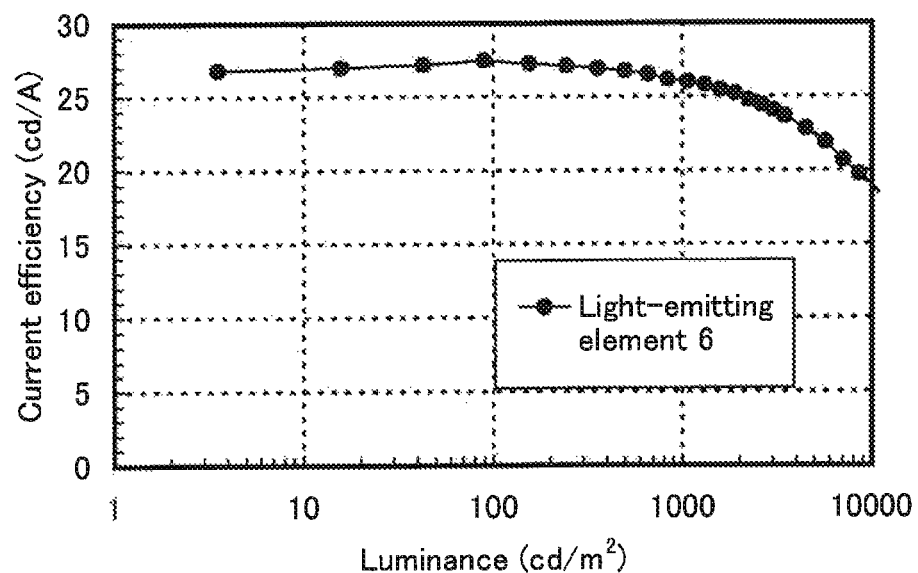
FIG. 26 shows luminance versus current efficiency characteristics of the light-emitting element of Example 7.
Figure 27:
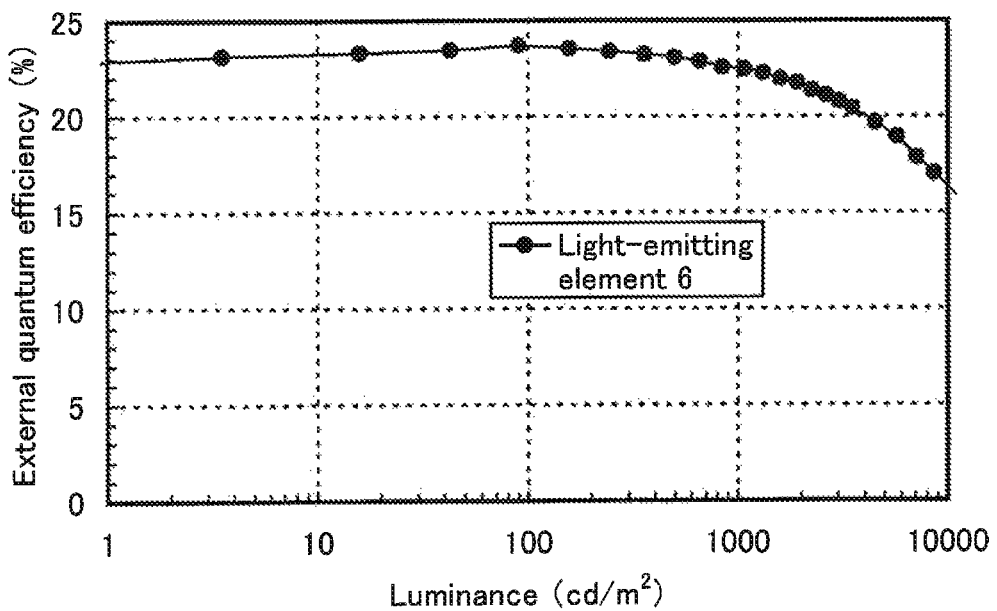
FIG. 27 shows luminance versus external quantum efficiency characteristics of the light-emitting element of Example 7.

Table 7 shows element structures of the thus obtained light-emitting element 6.

horizontal axis represents voltage (V) and the vertical axis represents luminance (cd/m$^2$). FIG. 26 shows luminance versus current efficiency characteristics. In FIG. 26, the horizontal axis represents luminance (cd/m$^2$) and the vertical axis represents current efficiency (cd/A). FIG. 27 shows luminance versus external quantum efficiency characteristics. In FIG. 27, the horizontal axis represents luminance (cd/m$^2$) and the vertical axis represents external quantum efficiency (%).

Further, Table 8 shows the voltage (V), current density (mA/cm$^2$), CIE chromaticity coordinates (x, y), current efficiency (cd/A), power efficiency (lm/W), and external quantum efficiency (%) of the light-emitting element 6 at a luminance of around 1100 cd/m$^2$.

TABLE 8

| | Votage (V) | Current Density (mA/cm$^2$) | Chromaticity (x, y) | Current Efficiency (cd/A) | Power Efficiency (lm/W) | External Quantum Efficiency (%) |
|---|---|---|---|---|---|---|
| Light-emitting Element 6 | 3.3 | 4.1 | (0.66, 0.34) | 26 | 25 | 22 |

Figure 28:
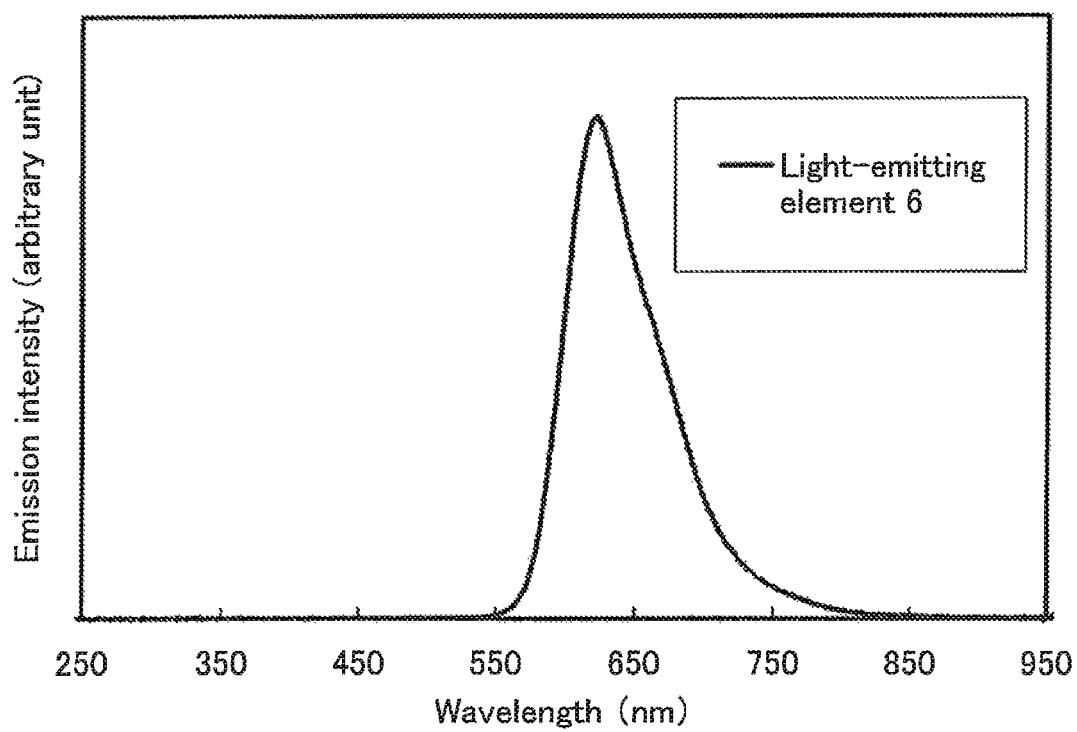
FIG. 28 shows an emission spectrum of the light-emitting element of Example 7.

FIG. 28 shows an emission spectrum of the light-emitting element 6 which was obtained by applying a current of 0.1 mA. In FIG. 28, the horizontal axis represents wavelength (nm) and the vertical axis represents emission intensity (arbitrary unit). As shown in Table 8, CIE chromaticity coordinates of the light-emitting element 6 at a luminance of 1100 cd/m$^2$ were (x, y)=(0.66, 0.34). The results indicate that the light-emitting element 6 emits light originating from [Ir(tppr)$_2$(dpm)].

As can be seen from Table 8 and FIGS. 24 to 27, the light-emitting element 6 has high current efficiency, high power efficiency, and high external quantum efficiency.

In the light-emitting element 6, the light-emitting layer includes 2mDBTPDBq-II, NPB, and [Ir(tppr)$_2$(dpm)] described in Example 6. As described in Example 6, the emission spectrum of the mixed material of 2mDBTPDBq-II and NPB largely overlaps with the absorption band which is considered to greatly contribute to light emission in the absorption spectrum of [Ir(tppr)$_2$(dpm)]. The light-emitting

TABLE 7

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 6 | ITSO 110 nm | DBT3P-II: MoOx (=4:2) 40 nm | BPAFLP 20 nm | 2mDBTPDBq-II: NPB: [Ir(tppr)$_2$(dpm)] (=0.8:0.2:0.05) 40 nm | 2mDBTPDBq-II 10 nm | BPhen 20 nm | LiF 1 nm | Al 200 nm |

In a glove box containing a nitrogen atmosphere, the light-emitting element 6 was sealed so as not to be exposed to air. Then, operation characteristics of the light-emitting element were measured. Note that the measurements were carried out at room temperature (in an atmosphere kept at 25° C.).

Figure 24:
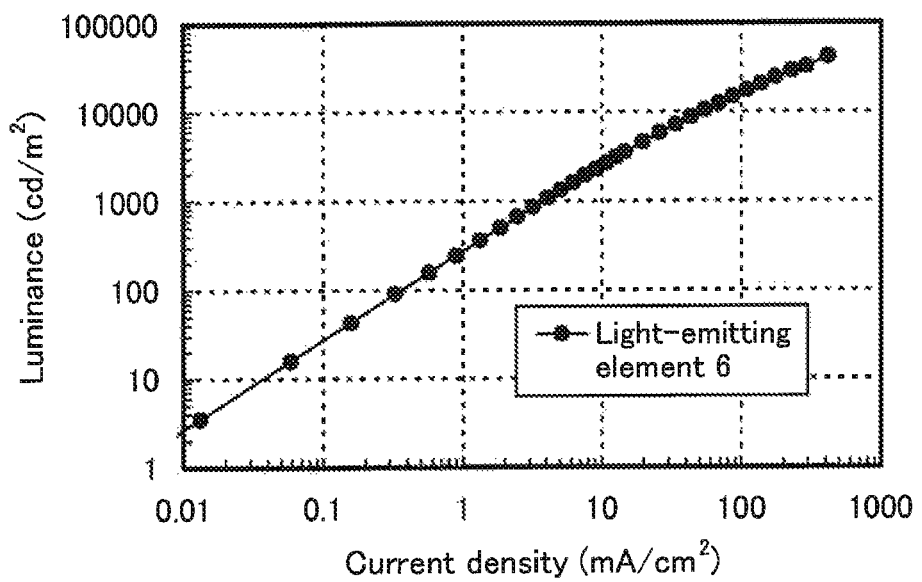
FIG. 24 shows current density versus luminance characteristics of a light-emitting element of Example 7.
Figure 25:
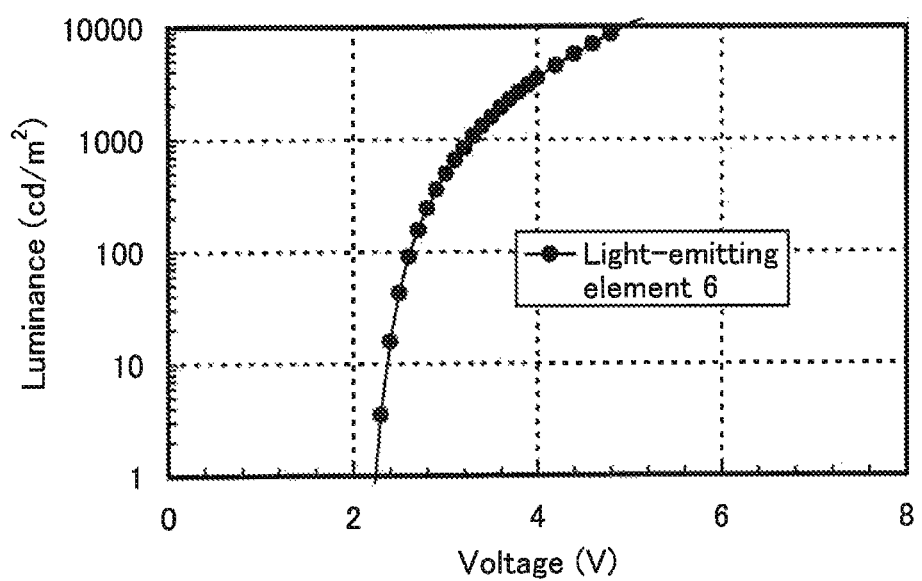
FIG. 25 shows voltage versus luminance characteristics of the light-emitting element of Example 7.

FIG. 24 shows current density versus luminance characteristics of the light-emitting element 6. In FIG. 24, the horizontal axis represents current density (mA/cm$^2$) and the vertical axis represents luminance (cd/m$^2$). FIG. 25 shows voltage versus luminance characteristics. In FIG. 25, the element 6 is considered to have high energy transfer efficiency and external quantum efficiency because an energy transfers by using the overlap.

The above results indicate that application of one embodiment of the present invention makes it possible to achieve a light-emitting element with high external quantum efficiency.

Figure 29:
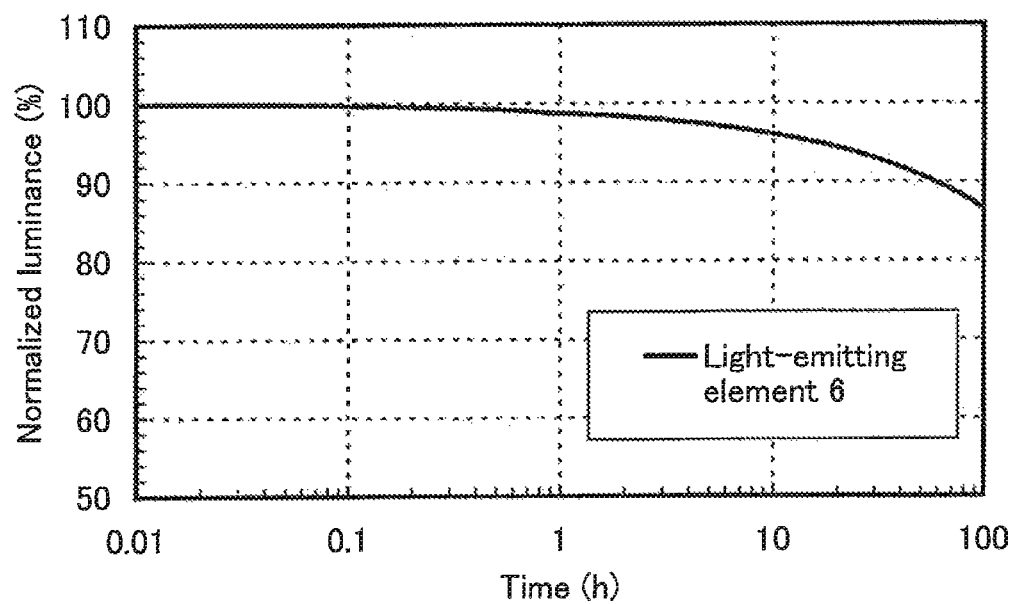
FIG. 29 shows results of reliability tests of the light-emitting element of Example 7.

Next, reliability tests of the light-emitting element 6 were conducted. FIG. 29 shows the results of the reliability tests. In FIG. 29, the vertical axis represents normalized luminance (%) on the assumption that an initial luminance is 100%, and the horizontal axis represents driving time (h) of the element.

In the reliability tests, the light-emitting element 6 was driven under the conditions where the initial luminance was set to 5000 cd/m² and the current density was constant.

The light-emitting element 6 kept 87% of the initial luminance after 98 hour driving. The results indicate that the light-emitting element 6 has a long lifetime.

The above results indicate that application of one embodiment of the present invention makes it possible to achieve a light-emitting element with high reliability.

Example 8

Figure 30A:
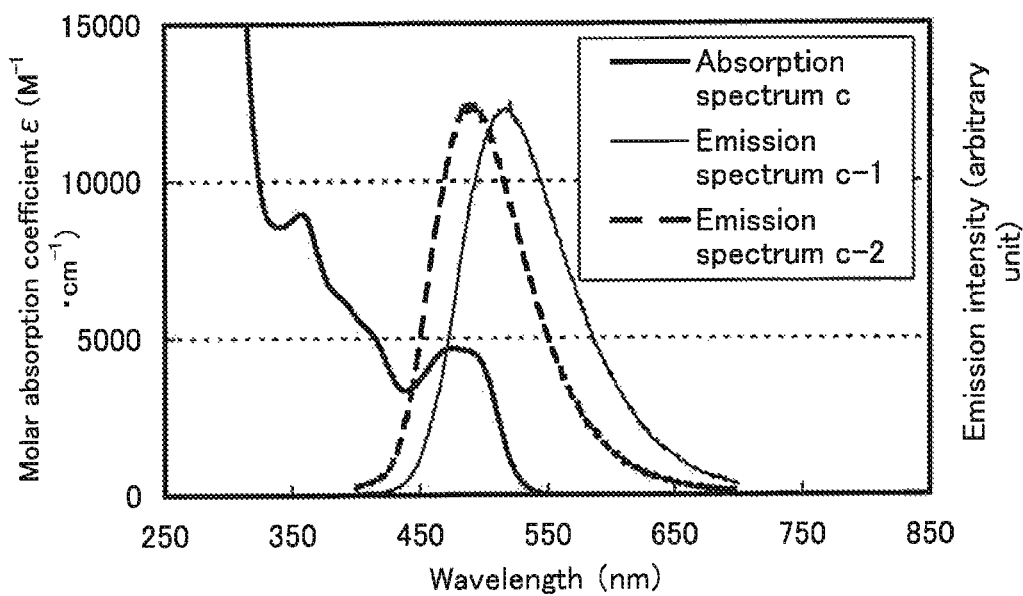
FIGS. 30A and 30B show absorption spectra and emission spectra according to Example 8.
Figure 30B:
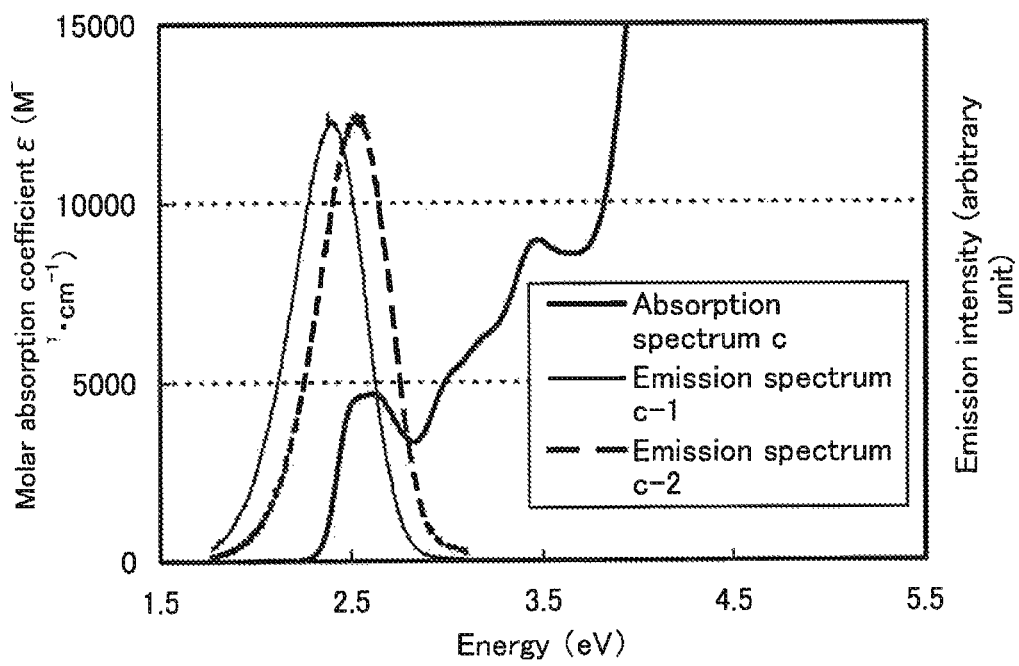

Example 8 shows examples of a guest material and host materials which can be included in the light-emitting element of one embodiment of the present invention with reference to FIGS. 30A and 30B.

The guest material used in this example is [Ir(mppm)₂(acac)]. The host materials used also in this example are the following two types: a mixed material of 2mDBTPDBq-II and PCBA1BP and a mixed material of 2mDBTPDBq-II and 4-(1-naphthyl)-4'-phenyltriphenylamine (abbreviation: αNBA1BP). A chemical formula of a material used in this example is shown below. Note that chemical formulas of the materials used in the above examples are omitted here.

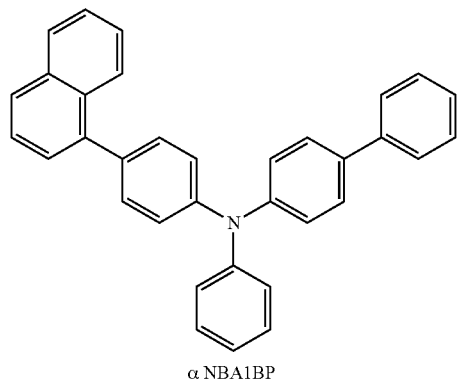 [SMILES: c1ccc(-c2ccc(N(c3ccccc3)c3ccc(-c4cccc5ccccc45)cc3)cc2)cc1]

αNBA1BP (Absorption Spectrum)

FIGS. 30A and 30B show an ultraviolet-visible absorption spectrum (absorption spectrum c) of [Ir(mppm)₂(acac)] in a dichloromethane solution of [Ir(mppm)₂(acac)]. Measurements of the absorption spectrum were conducted at room temperature, by using an ultraviolet-visible light spectrophotometer (V550 type, manufactured by JASCO Corporation) with the dichloromethane solution (0.10 mmol/L) put in a quartz cell.

(Emission Spectra)

FIGS. 30A and 30B also show an emission spectrum (emission spectrum c-1) of a thin film of a mixed material of 2mDBTPDBq-II and PCBA1BP and an emission spectrum (emission spectrum c-2) of a thin film of a mixed material of 2mDBTPDBq-II and αNBA1BP. In FIG. 30A, the horizontal axis represents wavelength (nm) and the vertical axes represent molar absorption coefficient ε (M⁻¹·cm⁻¹) and emission intensity (arbitrary unit). In FIG. 30B, the horizontal axis represents energy (eV) and the vertical axes represent molar absorption coefficient ε (M⁻¹·cm⁻¹) and emission intensity (arbitrary unit).

The absorption spectrum c in FIG. 30A indicates that [Ir(mppm)₂(acac)] has a broad absorption band around 490 nm. This absorption band is considered to greatly contribute to light emission.

Each of peaks of the emission spectra c-1 and c-2 is found to have a large overlap with the absorption band in the absorption spectrum c, which is considered to greatly contribute to light emission. Thus, it is indicated that a light-emitting element including a light-emitting layer in which the guest material and either host material of this example are used together has high energy transfer efficiency because an energy transfers by using the overlap between the emission spectrum of the host material and the absorption spectrum of the guest material. Therefore, it is indicated that a light-emitting element with high external quantum efficiency can be obtained.

Here, the emission spectrum c-2 has a peak on a shorter wavelength (higher energy) side than the emission spectrum c-1. The peak of the emission spectrum c-2 is closer to the above absorption band than the peak of the emission spectrum c-1. Specifically, the difference between the peak of the absorption band in the absorption spectrum c (shoulder peak around 490 nm) and the peak of the emission spectrum c-1 is 0.15 eV, and the difference between the peak of the absorption band in the absorption spectrum c (shoulder peak around 490 nm) and the peak of the emission spectrum c-2 is 0.01 eV.

The difference between the peaks of the emission spectra c-1 and c-2 is considered to be attributed to the difference between HOMO levels of PCBA1BP and αNBA1BP. Specifically, the HOMO level of PCBA1BP is −5.43 eV whereas the HOMO level of αNBA1BP is −5.52 eV (both values were calculated by cyclic voltammetry (CV) measurements). It is considered that since αNBA1BP has a lower (deeper) HOMO level than PCBA1BP, the peak of the emission spectrum c-2 is on a shorter wavelength (higher energy) side than the peak of the emission spectrum c-1.

Example 9

Example 9 shows a light-emitting element of one embodiment of the present invention with reference to FIG. 2. The materials used in this example are used in the above examples, and therefore the chemical formulas thereof are omitted here.

The following shows a method of fabricating light-emitting elements 7 and 8 of this example.

(Light-Emitting Element 7)

First, an ITSO film was formed over the glass substrate 1100 by a sputtering method, so that the first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for one hour, and subjected to UV ozone treatment for 370 seconds.

After that, the substrate 1100 was transferred into a vacuum evaporation apparatus where the pressure had been reduced to approximately 10⁻⁴ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in a vacuum evaporation apparatus such that a surface on which the first electrode 1101 was provided faced downward. The pressure in the vacuum evaporation apparatus was reduced to about $10^{-4}$ Pa. Then, BPAFLP and molybdenum(VI) oxide were co-evaporated over the first electrode 1101, so that the hole-injection layer 1111 was formed. The thickness of the hole-injection layer 1111 was 40 nm, and the weight ratio of BPAFLP to molybdenum oxide was adjusted to 4:2 (=BPAFLP:molybdenum oxide).

Next, a BPAFLP film was formed to a thickness of 20 nm over the hole-injection layer 1111, so that the hole-transport layer 1112 was formed.

Further, 2mDBTPDBq-II, PCBA1BP, and [Ir(mppm)$_2$(acac)] were co-evaporated, so that the light-emitting layer 1113 was formed over the hole-transport layer 1112. The weight ratio of 2mDBTPDBq-II to PCBA1BP and [Ir(mppm)$_2$(acac)] was adjusted to 0.8:0.2:0.05 (=2mDBTPDBq-II:PCBA1BP:[Ir(mppm)$_2$(acac)]). The thickness of the light-emitting layer 1113 was 40 nm.

Next, a 2mDBTPDBq-II film was formed to a thickness of 10 nm over the light-emitting layer 1113, so that the first electron-transport layer 1114a was formed.

Next, a BPhen film was formed to a thickness of 20 nm over the first electron-transport layer 1114a, so that the second electron-transport layer 1114b was formed.

Further, a LiF film was formed to a thickness of 1 nm over the second electron-transport layer 1114b by evaporation, so that the electron-injection layer 1115 was formed.

Lastly, an aluminum film was formed to a thickness of 200 nm by evaporation, so that the second electrode 1103 functioning as a cathode was formed. Thus, the light-emitting element 7 of this example was fabricated.

(Light-Emitting Element 8)

The light-emitting layer 1113 of the light-emitting element 8 was formed by co-evaporation of 2mDBTPDBq-II, αNBA1BP, and [Ir(mppm)$_2$(acac)]. The weight ratio of 2mDBTPDBq-II to αNBA1BP and [Ir(mppm)$_2$(acac)] was adjusted to 0.8:0.2:0.05 (=2mDBTPDBq-II:αNBA1BP:[Ir(mppm)$_2$(acac)]). The thickness of the light-emitting layer 1113 was 40 nm. The layers other than the light-emitting layer 1113 were formed in the same manner as that of the light-emitting element 7.

Note that, in the above evaporation process, evaporation was all performed by a resistance heating method.

Table 9 shows element structures of the thus obtained light-emitting elements 7 and 8.

TABLE 9

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 7 | ITSO 110 nm | BPAFLP:MoOx (=4:2) 40 nm | BPAFLP 20 nm | 2mDBTPDBq-II:PCBA1BP:[Ir(mppm)$_2$(acac)] (=0.8:0.2:0.05) 40 nm | 2mDBTPDBq-II 10 nm | BPhen 20 nm | LiF 1 nm | Al 200 nm |
| Light-emitting Element 8 | ITSO 110 nm | BPAFLP:MoOx (=4:2) 40 nm | BPAFLP 20 nm | 2mDBTPDq-II:αNBA1BP:[Ir(mppm)$_2$(acac)] (=0.8:0.2:0.05) 40 nm | 2mDBTPDBq-II 10 nm | BPhen 20 nm | LiF 1 nm | Al 200 nm |

In a glove box containing a nitrogen atmosphere, these light-emitting elements were sealed so as not to be exposed to air. Then, operation characteristics of these light-emitting elements were measured. Note that the measurements were carried out at room temperature (in an atmosphere kept at 25° C.).

Figure 31:
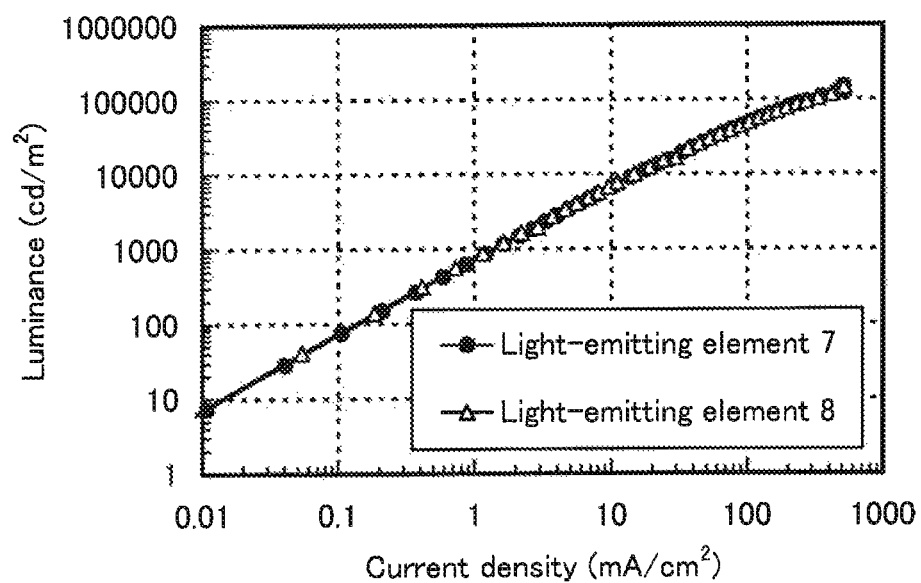
FIG. 31 shows current density versus luminance characteristics of light-emitting elements of Example 9.
Figure 32:
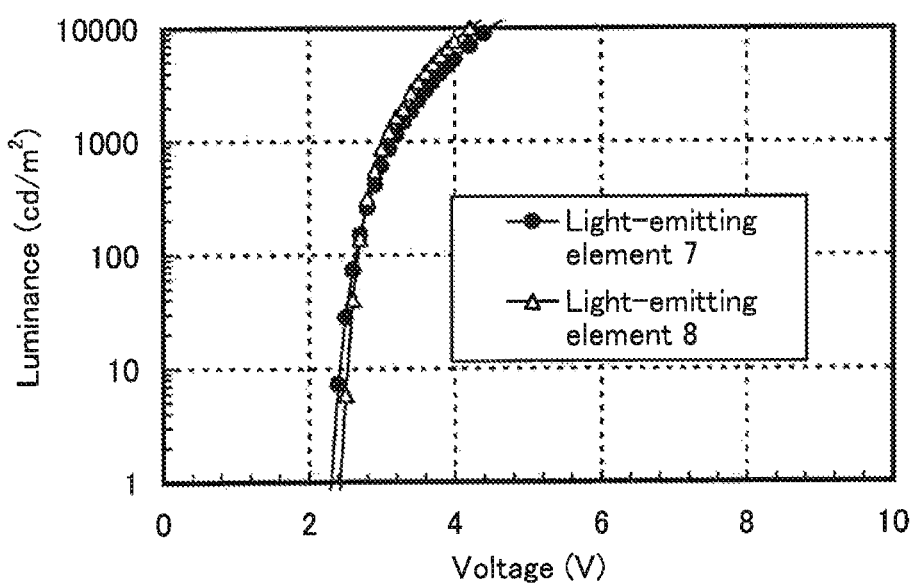
FIG. 32 shows voltage versus luminance characteristics of the light-emitting elements of Example 9.
Figure 33:
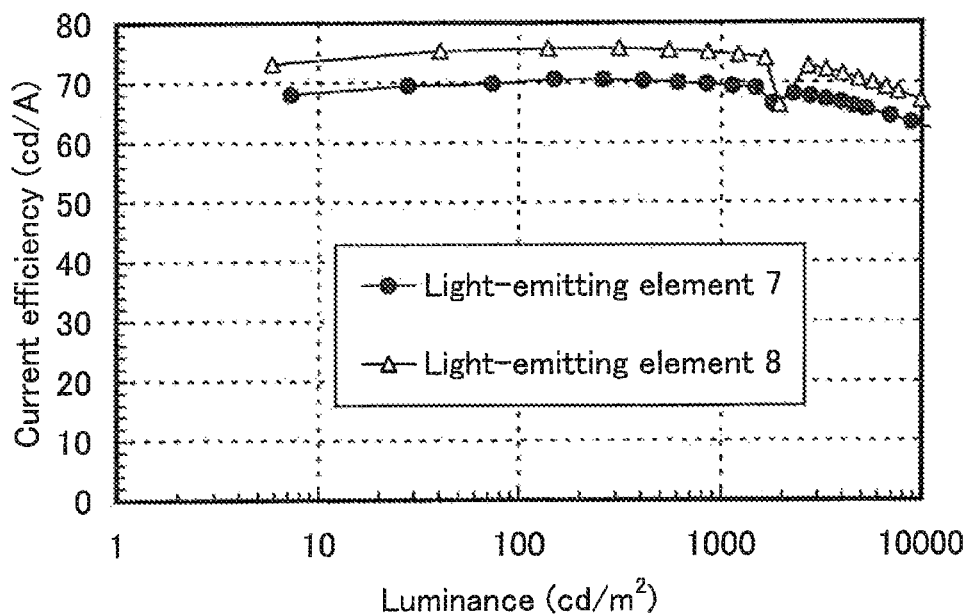
FIG. 33 shows luminance versus current efficiency characteristics of the light-emitting elements of Example 9.
Figure 34:
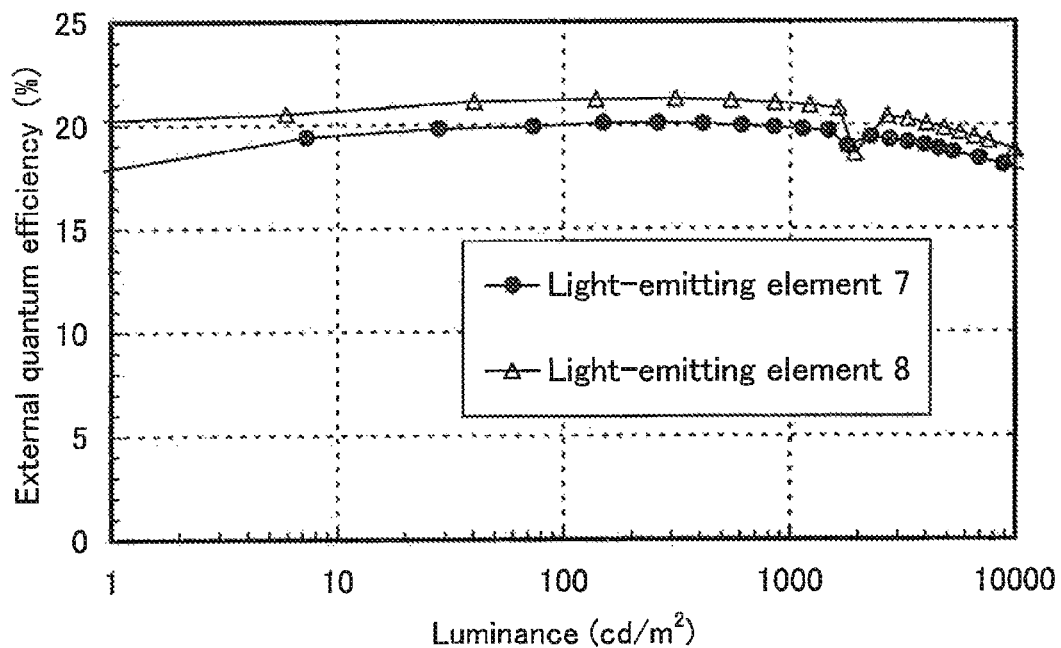
FIG. 34 shows luminance versus external quantum efficiency characteristics of the light-emitting elements of Example 9.

FIG. 31 shows current density versus luminance characteristics of the light-emitting elements 7 and 8. In FIG. 31, the horizontal axis represents current density (mA/cm$^2$) and the vertical axis represents luminance (cd/m$^2$). FIG. 32 shows voltage versus luminance characteristics. In FIG. 32, the horizontal axis represents voltage (V) and the vertical axis represents luminance (cd/m$^2$). FIG. 33 shows luminance versus current efficiency characteristics. In FIG. 33, the horizontal axis represents luminance (cd/m$^2$) and the vertical axis represents current efficiency (cd/A). FIG. 34 shows luminance versus external quantum efficiency characteristics. In FIG. 34, the horizontal axis represents luminance (cd/m$^2$) and the vertical axis represents external quantum efficiency (%).

Further, Table 10 shows the voltage (V), current density (mA/cm$^2$), CIE chromaticity coordinates (x, y), current efficiency (cd/A), power efficiency (lm/W), and external quantum efficiency (%) of the light-emitting elements 7 and 8 at a luminance of around 1000 cd/m$^2$.

TABLE 10

| | Votage (V) | Current Density (mA/cm$^2$) | Chromaticity (x, y) | Luminance (cd/m$^2$) | Current Efficiency (cd/A) | Power Efficiency (lm/W) | External Quantum Efficiency (%) |
|---|---|---|---|---|---|---|---|
| Light-emitting Element 7 | 3.2 | 1.6 | (0.43, 0.56) | 1100 | 69 | 68 | 20 |
| Light-emitting Element 8 | 3.0 | 1.1 | (0.43, 0.56) | 860 | 75 | 79 | 21 |

Figure 35:
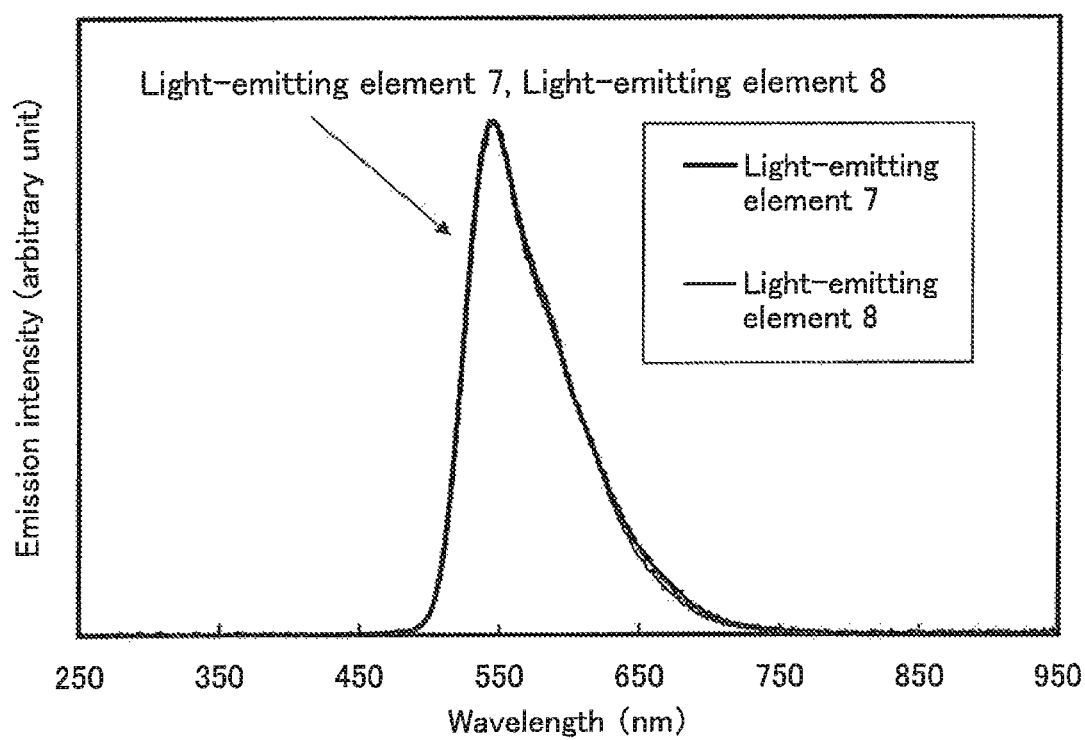
FIG. 35 shows emission spectra of the light-emitting elements of Example 9.

FIG. 35 shows emission spectra of the light-emitting elements 7 and 8 which were obtained by applying a current of 0.1 mA. In FIG. 35, the horizontal axis represents wavelength (nm) and the vertical axis represents emission intensity (arbitrary unit). As shown in Table 10, CIE chromaticity coordinates of the light-emitting element 7 at a luminance of 1100 cd/m$^2$ were (x, y)=(0.43, 0.56), and CIE chromaticity coordinates of the light-emitting element 8 at a luminance of 860 cd/m² were (x, y)=(0.43, 0.56). The results indicate that the light-emitting elements 7 and 8 emit yellow green light originating from [Ir(mppm)₂(acac)].

As can be seen from Table 10 and FIGS. 31 to 34, each of the light-emitting elements 7 and 8 has high current efficiency, high power efficiency, and high external quantum efficiency.

The light-emitting layer of the light-emitting element 7 includes PCBA1BP, 2mDBTPDBq-II, and [Ir(mppm)₂(acac)] described in Example 8, and the light-emitting layer of the light-emitting element 8 includes αNBA1BP, 2mDBTPDBq-II and [Ir(mppm)₂(acac)] described in Example 8. As described in Example 8, the emission spectra of the mixed material of 2mDBTPDBq-II and PCBA1BP and the mixed material of 2mDBTPDBq-II and αNBA1BP have large overlaps with the absorption band in the absorption spectrum of [Ir(mppm)₂(acac)], which is considered to greatly contribute to light emission. The light-emitting elements 7 and 8 are considered to have high energy transfer efficiency and external quantum efficiency because energies transfer by using the overlaps.

The above results indicate that application of one embodiment of the present invention makes it possible to achieve a light-emitting element with high external quantum efficiency.

Figure 36:
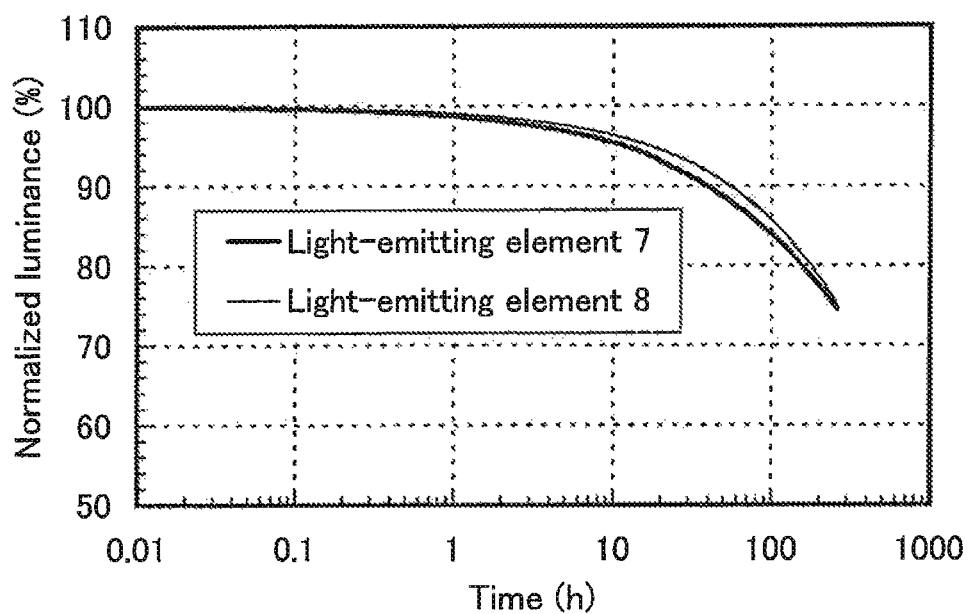
FIG. 36 shows results of reliability tests of the light-emitting elements of Example 9.

Next, reliability tests of the light-emitting elements 7 and 8 were conducted. FIG. 36 shows the results of the reliability tests. In FIG. 36, the vertical axis represents normalized luminance (%) on the assumption that an initial luminance is 100%, and the horizontal axis represents driving time (h) of the elements.

In the reliability tests, the light-emitting elements 7 and 8 were each driven under the conditions where the initial luminance was set to 5000 cd/m² and the current density was constant.

The light-emitting element 7 kept 74% of the initial luminance after 260 hour driving. The light-emitting element 8 kept 75% of the initial luminance after 260 hour driving. The results indicate that the light-emitting elements 7 and 8 have a long lifetime.

The above results indicate that application of one embodiment of the present invention makes it possible to achieve a light-emitting element with high reliability.

Example 10

Figure 37A:
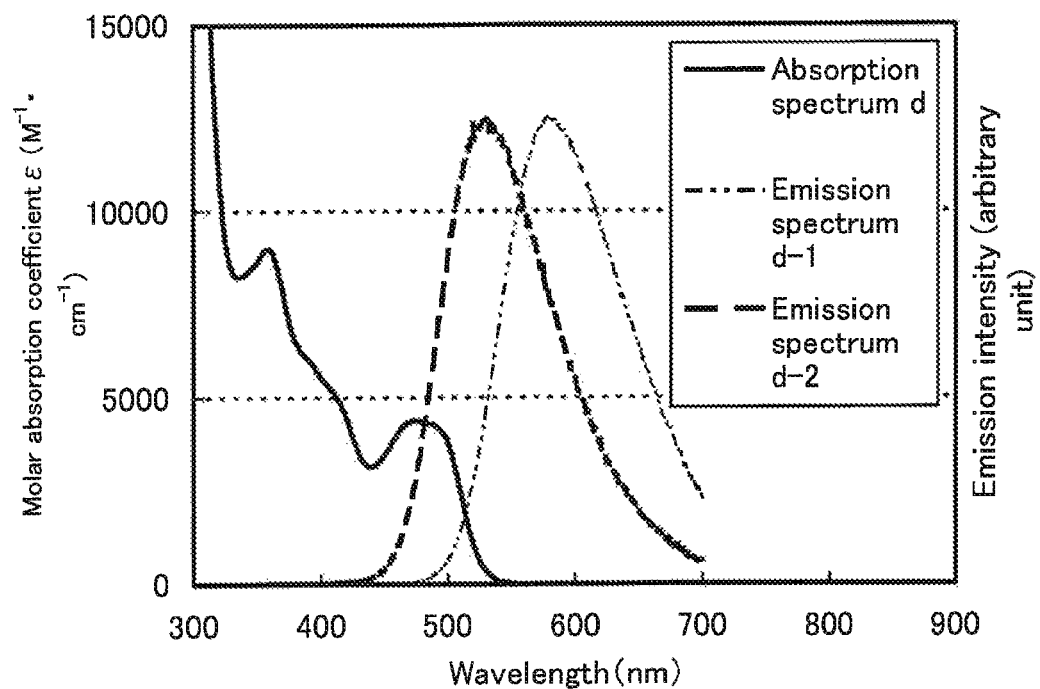
FIGS. 37A and 37B show absorption spectra and emission spectra according to Example 10.
Figure 37B:
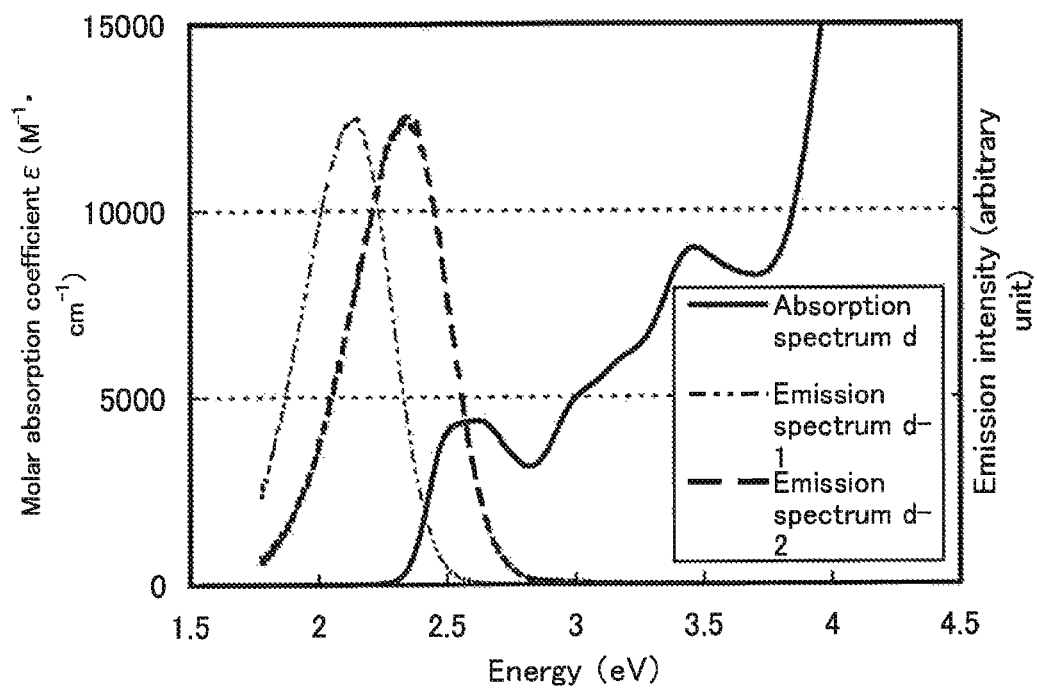

Example 10 shows examples of a guest material and host materials which can be included in the light-emitting element of one embodiment of the present invention with reference to FIGS. 37A and 37B.

The guest material used in this example is (acetylacetonato)bis(6-tert-butyl-4-phenylpyrimidinato)iridium(III) (abbreviation: [Ir(tBuppm)₂(acac)]). The host materials used also in this example are the following two types: a mixed material of 2mDBTPDBq-II and NPB and a mixed material of 2mDBTPDBq-II and 2,7-bis[N-(diphenylaminophenyl)-N-phenylamino]-spiro-9,9'-bifluorene (abbreviation: DPA2SF). Chemical formulas of materials used in this example are shown below. Note that chemical formulas of the materials used in the above examples are omitted here.

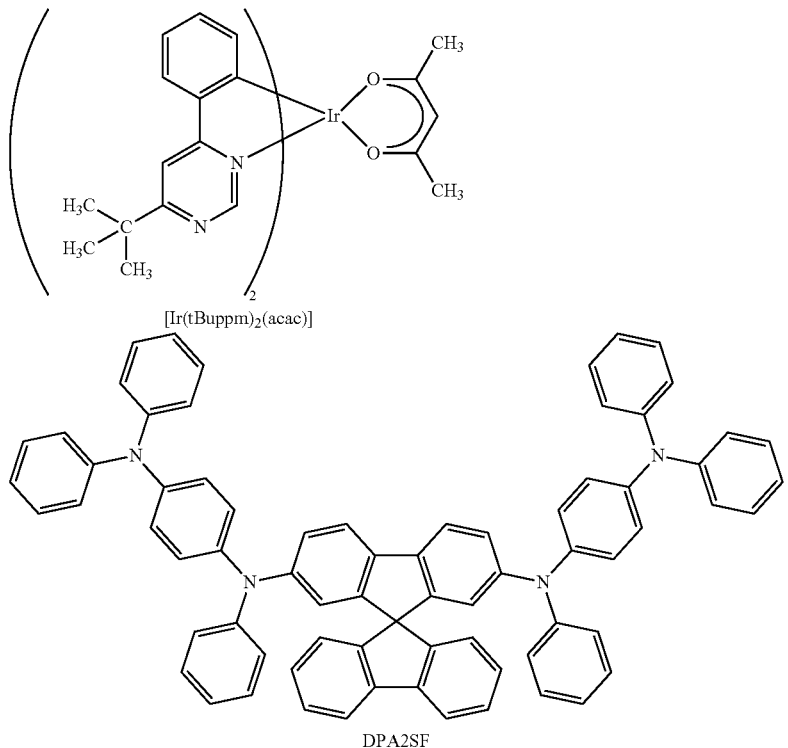

[Ir(tBuppm)₂(acac)]

DPA2SF (Absorption Spectrum)

FIGS. 37A and 37B show an ultraviolet-visible absorption spectrum (absorption spectrum d) of [Ir(tBuppm)₂(acac)] in a dichloromethane solution of [Ir(tBuppm)₂(acac)]. Measurements of the absorption spectrum were conducted at room temperature, by using an ultraviolet-visible light spectrophotometer (V550 type, manufactured by JASCO Corporation) with the dichloromethane solution (0.093 mmol/L) put in a quartz cell.

(Emission Spectra)

FIGS. 37A and 37B also show an emission spectrum (emission spectrum d-1) of a thin film of a mixed material of 2mDBTPDBq-II and DPA2SF and an emission spectrum (emission spectrum d-2) of a thin film of a mixed material of 2mDBTPDBq-II and NPB. In FIG. 37A, the horizontal axis represents wavelength (nm) and the vertical axes represent molar absorption coefficient ε ($M^{-1} \cdot cm^{-1}$) and emission intensity (arbitrary unit). In FIG. 37B, the horizontal axis represents energy (eV) and the vertical axes represent molar absorption coefficient ε ($M^{-1} \cdot cm^{-1}$) and emission intensity (arbitrary unit).

The absorption spectrum d in FIG. 37A indicates that [Ir(tBuppm)$_2$(acac)] has a broad absorption band around 490 nm. This absorption band is considered to greatly contribute to light emission.

Each of peaks of the emission spectra d-1 and d-2 is found to have a large overlap with the absorption band in the absorption spectrum d, which is considered to greatly contribute to light emission. Thus, it is indicated that a light-emitting element including a light-emitting layer in which the guest material and either host material of this example are used together has high energy transfer efficiency because an energy transfers by using the overlap between the emission spectrum of the host material and the absorption spectrum of the guest material. Therefore, it is indicated that a light-emitting element with high external quantum efficiency can be obtained.

Here, the emission spectrum d-2 has a peak on a shorter wavelength (higher energy) side than the emission spectrum d-1. The peak of the emission spectrum d-2 is closer to the above absorption band than the peak of the emission spectrum d-1. From the above, in FIGS. 37A and 37B, it is found that the emission spectrum having the largest overlap with the absorption band in the absorption spectrum d, which greatly contributes to light emission is the emission spectrum d-2. Specifically, the difference between the peak of the absorption band in the absorption spectrum d and the peak of the emission spectrum d-1 is 0.39 eV, and the difference between the peak of the absorption band in the absorption spectrum d and the peak of the emission spectrum d-2 is 0.19 eV.

The difference between the peaks of the emission spectra d-1 and d-2 is considered to be attributed to the difference between HOMO levels of DPA2SF and NPB. Specifically, the HOMO level of DPA2SF is −5.09 eV whereas the HOMO level of NPB is −5.38 eV (both values were calculated by CV measurements). It is considered that since NPB has a lower (deeper) HOMO level than DPA2SF, the peak of the emission spectrum d-2 is on a shorter wavelength (higher energy) side than the peak of the emission spectrum d-1.

From the above, it is indicated that a light-emitting element including a light-emitting layer in which a mixed material of 2mDBTPDBq-II and NPB and [Ir(tBuppm)$_2$(acac)] are used together has high energy transfer efficiency as compared to a light-emitting element including a light-emitting layer in which a mixed material of 2mDBTPDBq-II and DPA2SF and [Ir(tBuppm)$_2$(acac)] are used together, because an energy transfers by using the large overlap between the emission spectrum of the host material and the absorption spectrum of the guest material. Therefore, it is indicated that a light-emitting element with higher external quantum efficiency can be obtained.

Example 11

Example 11 shows a light-emitting element of one embodiment of the present invention with reference to FIG. 2. The materials used in this example are used in the above examples, and therefore the chemical formulas thereof are omitted here.

The following shows a method of fabricating light-emitting elements 9 and 10 of this example.

(Light-Emitting Element 9)

First, an ITSO film was formed over the glass substrate 1100 by a sputtering method, so that the first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in a vacuum evaporation apparatus such that a surface on which the first electrode 1101 was provided faced downward. The pressure in the vacuum evaporation apparatus was reduced to about $10^{-4}$ Pa. Then, DBT3P-II and molybdenum(VI) oxide were co-evaporated over the first electrode 1101, so that the hole-injection layer 1111 was formed. The thickness of the hole-injection layer 1111 was 40 nm, and the weight ratio of DBT3P-II to molybdenum oxide was adjusted to 4:2 (=DBT3P-II:molybdenum oxide).

Next, a BPAFLP film was formed to a thickness of 20 nm over the hole-injection layer 1111, so that the hole-transport layer 1112 was formed.

Further, 2mDBTPDBq-II, DPA2SF, and [Ir(tBuppm)$_2$(acac)] were co-evaporated, so that the light-emitting layer 1113 was formed over the hole-transport layer 1112. The weight ratio of 2mDBTPDBq-II to DPA2SF and [Ir(tBuppm)$_2$(acac)] was adjusted to 0.8:0.2:0.05 (=2mDBTPDBq-II:DPA2SF:[Ir(tBuppm)$_2$(acac)]). The thickness of the light-emitting layer 1113 was 40 nm.

Next, a 2mDBTPDBq-II film was formed to a thickness of 10 nm over the light-emitting layer 1113, so that the first electron-transport layer 1114a was formed.

Next, a BPhen film was formed to a thickness of 20 nm over the first electron-transport layer 1114a, so that the second electron-transport layer 1114b was formed.

Further, a LiF film was formed to a thickness of 1 nm over the second electron-transport layer 1114b by evaporation, so that the electron-injection layer 1115 was formed.

Lastly, an aluminum film was formed to a thickness of 200 nm by evaporation, so that the second electrode 1103 functioning as a cathode was formed. Thus, the light-emitting element 9 of this example was fabricated.

(Light-Emitting Element 10)

The light-emitting layer 1113 of the light-emitting element 10 was formed by co-evaporation of 2mDBTPDBq-II, NPB, and [Ir(tBuppm)$_2$(acac)]. The weight ratio of 2mDBTPDBq-II to NPB and [Ir(tBuppm)$_2$(acac)] was adjusted to 0.8:0.2:0.05 (=2mDBTPDBq-II:NPB:[Ir(tBuppm)$_2$(acac)]). The thickness of the light-emitting layer 1113 was 40 nm. The layers other than the light-emitting layer 1113 were formed in the same manner as that of the light-emitting element 9.

Note that, in the above evaporation process, evaporation was all performed by a resistance heating method.

Table 11 shows element structures of the thus obtained light-emitting elements 9 and 10.

TABLE 11

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 9 | ITSO 110 nm | DBT3P-II: MoOx (=4:2) 40 nm | BPAFLP 20 nm | 2mDBTPDBq-II: DPA2SF: [Ir(Buppm)$_2$(acac)] (=0.8:0.2:0.05) 40 nm | 2mDBTPDBq-II 10 nm | BPhen 20 nm | LiF 1 nm | Al 200 nm |
| Light-emitting Element 10 | ITSO 110 nm | DBT3P-II: MoOx (=4:2) 40 nm | BPAFLP 20 nm | 2mDBTPDBq-II: NPB: (Ir(tBuppm)$_2$(acac)] (=0.8:0.2:0.05) 40 nm | 2mDBTPDBq-II 10 nm | BPhen 20 nm | LiF 1 nm | Al 200 nm |

In a glove box containing a nitrogen atmosphere, these light-emitting elements were sealed so as not to be exposed to air. Then, operation characteristics of these light-emitting elements were measured. Note that the measurements were carried out at room temperature (in an atmosphere kept at 25° C.).

Figure 38:
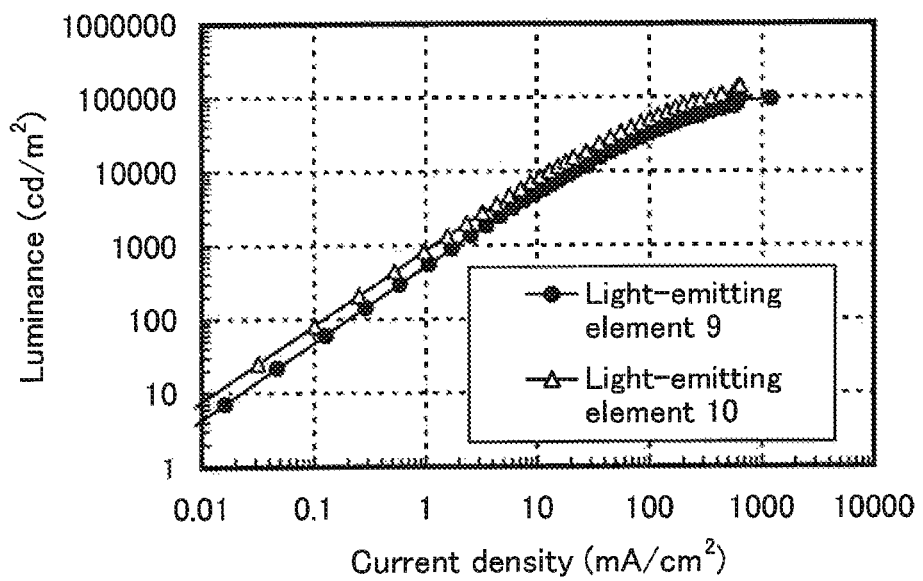
FIG. 38 shows current density versus luminance characteristics of light-emitting elements of Example 11.
Figure 39:
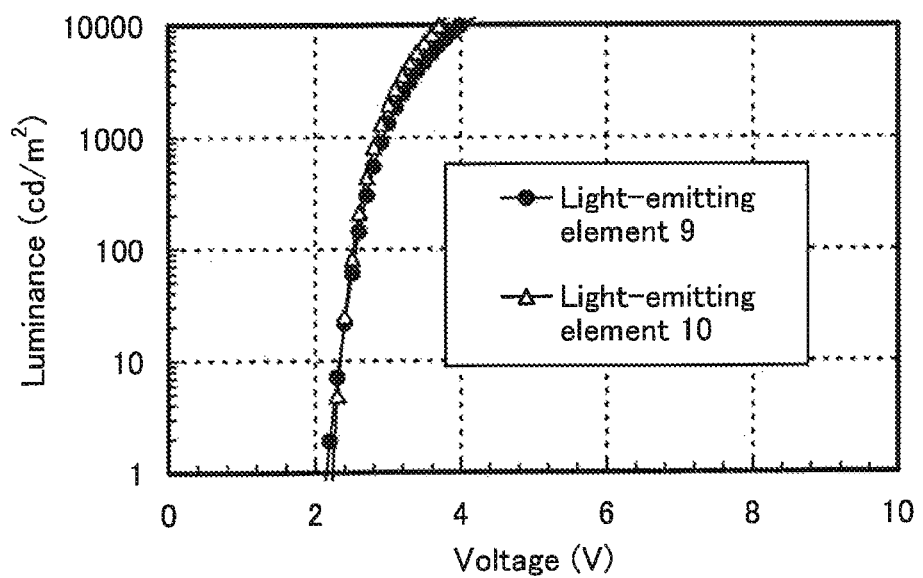
FIG. 39 shows voltage versus luminance characteristics of the light-emitting elements of Example 11.
Figure 40:
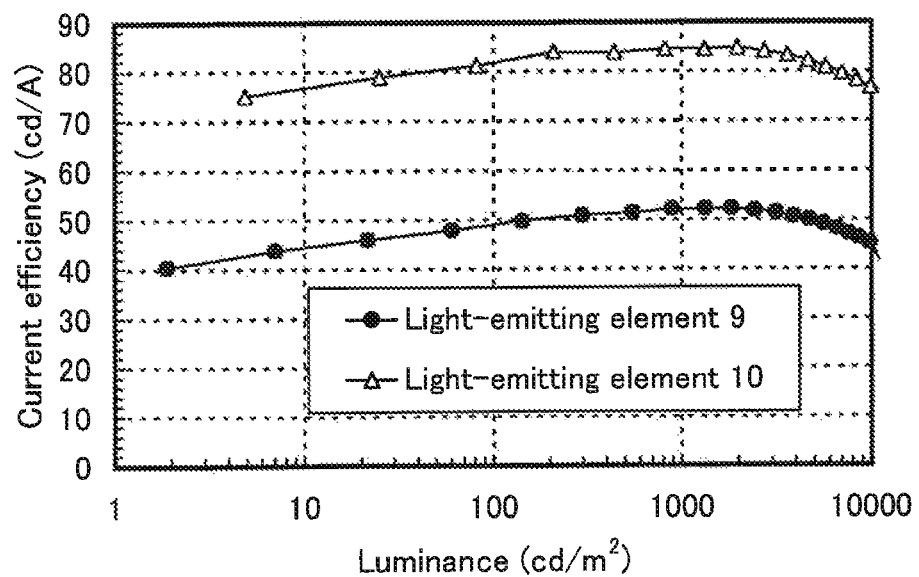
FIG. 40 shows luminance versus current efficiency characteristics of the light-emitting elements of Example 11.
Figure 41:
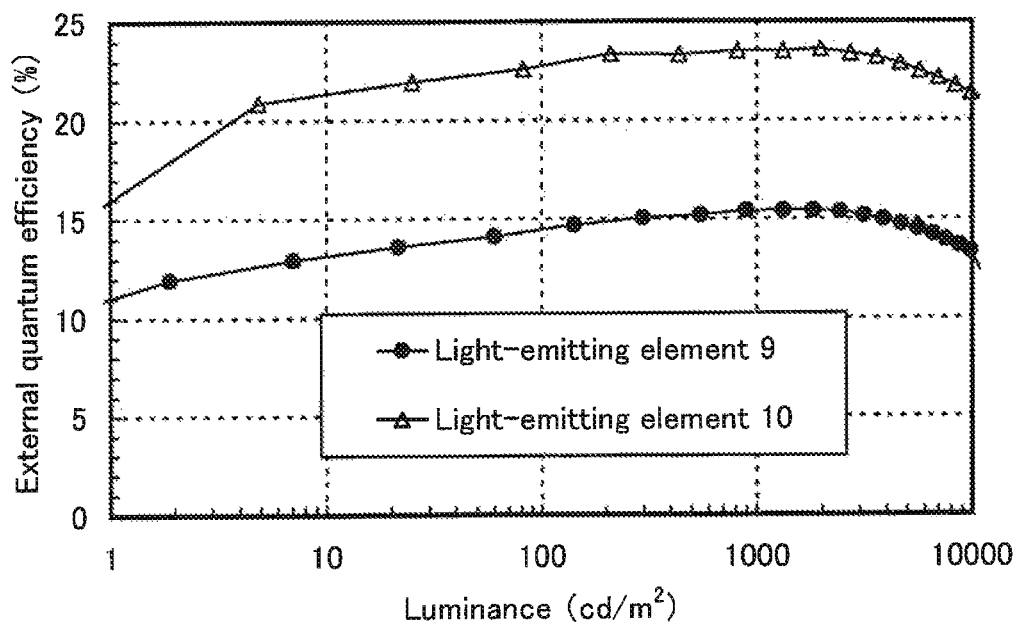
FIG. 41 shows luminance versus external quantum efficiency characteristics of the light-emitting elements of Example 11.

FIG. 38 shows current density versus luminance characteristics of the light-emitting elements 9 and 10. In FIG. 38, the horizontal axis represents current density (mA/cm$^2$) and the vertical axis represents luminance (cd/m$^2$). FIG. 39 shows voltage versus luminance characteristics. In FIG. 39, the horizontal axis represents voltage (V) and the vertical axis represents luminance (cd/m$^2$). FIG. 40 shows luminance versus current efficiency characteristics. In FIG. 40, the horizontal axis represents luminance (cd/m$^2$) and the vertical axis represents current efficiency (cd/A). FIG. 41 shows luminance versus external quantum efficiency characteristics. In FIG. 41, the horizontal axis represents luminance (cd/m$^2$) and the vertical axis represents external quantum efficiency (%).

Further, Table 12 shows the voltage (V), current density (mA/cm$^2$), CIE chromaticity coordinates (x, y), current efficiency (cd/A), power efficiency (lm/W), and external quantum efficiency (%) of the light-emitting elements 9 and 10 at a luminance of around 1000 cd/m$^2$.

TABLE 12

| | Votage (V) | Current Density (mA/cm$^2$) | Chromaticity (x, y) | Luminance (cd/m$^2$) | Current Efficiency (cd/A) | Power Efficiency (lm/W) | External Quantum Efficiency (%) |
|---|---|---|---|---|---|---|---|
| Light-emitting Element 9 | 2.9 | 1.7 | (0.43, 0.56) | 890 | 52 | 56 | 15 |
| Light-emitting Element 10 | 2.8 | 1.0 | (0.42, 0.57) | 820 | 84 | 95 | 23 |

Figure 42:
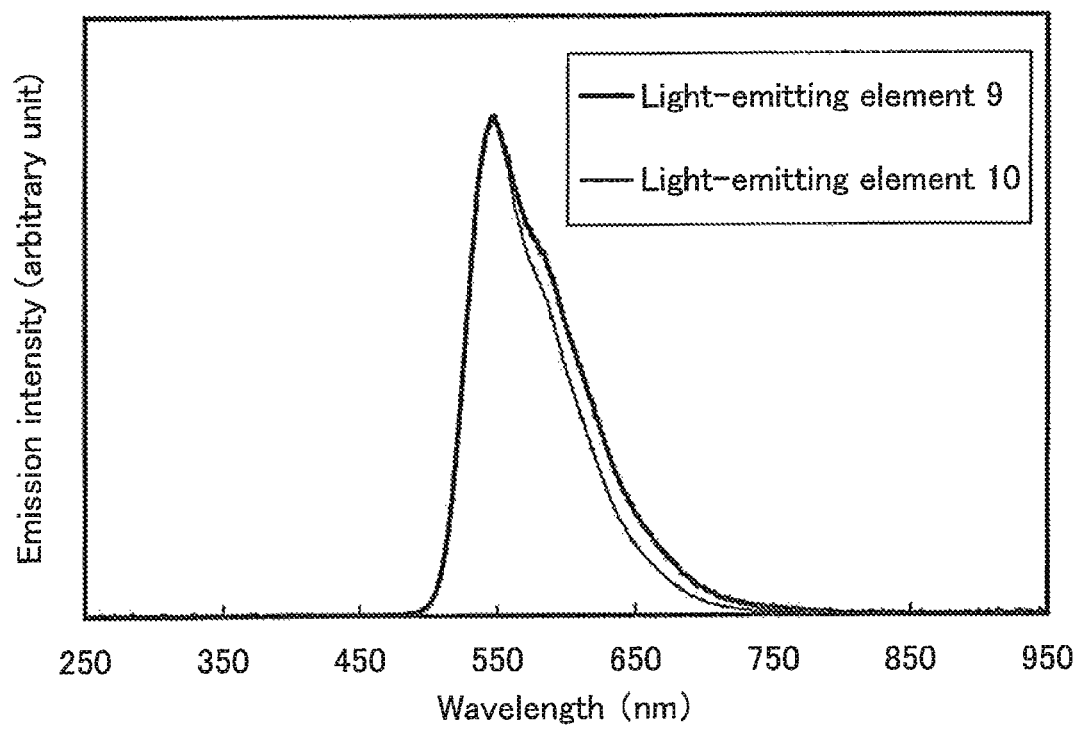
FIG. 42 shows emission spectra of the light-emitting elements of Example 11.

FIG. 42 shows emission spectra of the light-emitting elements 9 and 10 which were obtained by applying a current of 0.1 mA. In FIG. 42, the horizontal axis represents wavelength (nm) and the vertical axis represents emission intensity (arbitrary unit). As shown in Table 12, CIE chromaticity coordinates of the light-emitting element 9 at a luminance of 890 cd/m$^2$ were (x, y)=(0.43, 0.56), and CIE chromaticity coordinates of the light-emitting element 10 at a luminance of 820 cd/m$^2$ were (x, y)=(0.42, 0.57). The results indicate that the light-emitting elements 9 and 10 emit yellow green light originating from [Ir(tBuppm)$_2$(acac)].

As can be seen from Table 12 and FIGS. 38 to 41, each of the light-emitting elements 9 and 10 has high current efficiency, high power efficiency, and high external quantum efficiency.

The light-emitting layer of the light-emitting element 9 includes DPA2SF, 2mDBTPDBq-II, and [Ir(tBuppm)$_2$(acac)] described in Example 10, and the light-emitting layer of the light-emitting element 10 includes NPB, 2mDBTPDBq-II, and [Ir(tBuppm)$_2$(acac)] described in Example 10. As described in Example 10, the emission spectra of the mixed material of 2mDBTPDBq-II and DPA2SF and the mixed material of 2mDBTPDBq-II and NPB have large overlaps with the absorption band in the absorption spectrum of [Ir(tBuppm)$_2$(acac)], which is considered to greatly contribute to light emission. The light-emitting elements 9 and 10 are considered to have high energy transfer efficiency and external quantum efficiency because energies transfer by using the overlaps. In particular, the emission spectrum of the mixed material of 2mDBTPDBq-II and NPB has a larger overlap with the absorption band than the emission spectrum of the mixed material of 2mDBTPDBq-II and DPA2SF. Therefore, the light-emitting element 10 is considered to have higher energy transfer efficiency and external quantum efficiency than the light-emitting element 9, because an energy transfers by using the larger overlap. Referring to the results of Example 10, it is found that the difference between the energy value of a peak of the emission spectrum of the host material and the energy value of a peak of the lowest-energy-side absorption band in the absorption spectrum of the guest material is preferably 0.3 eV or less.

The above results indicate that application of one embodiment of the present invention makes it possible to achieve a light-emitting element with high external quantum efficiency.

Example 12

Figure 43A:
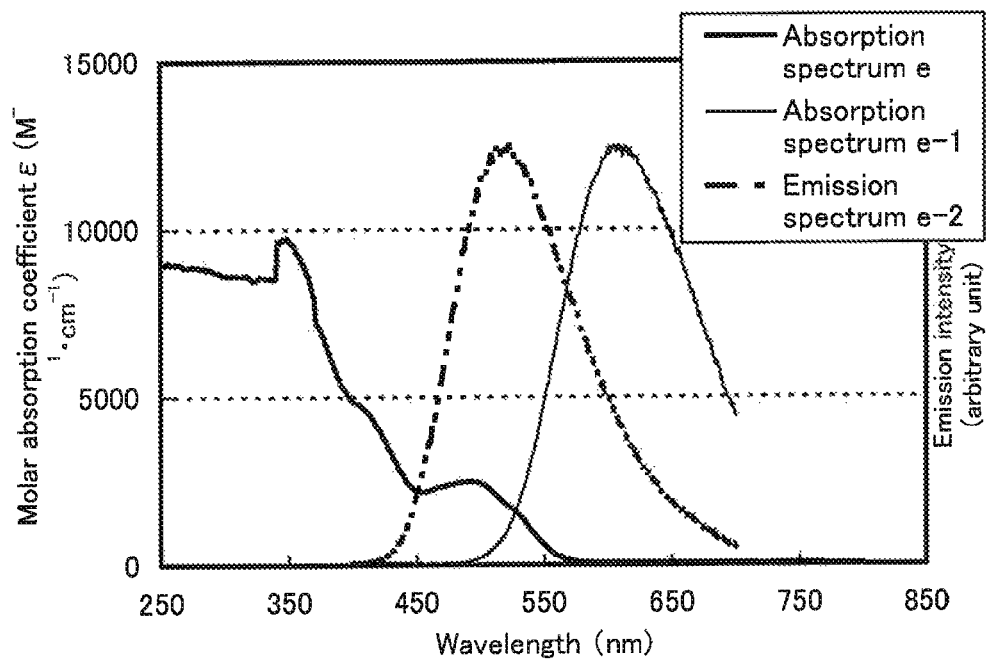
FIGS. 43A and 43B show absorption spectra and emission spectra according to Example 12.
Figure 43B:
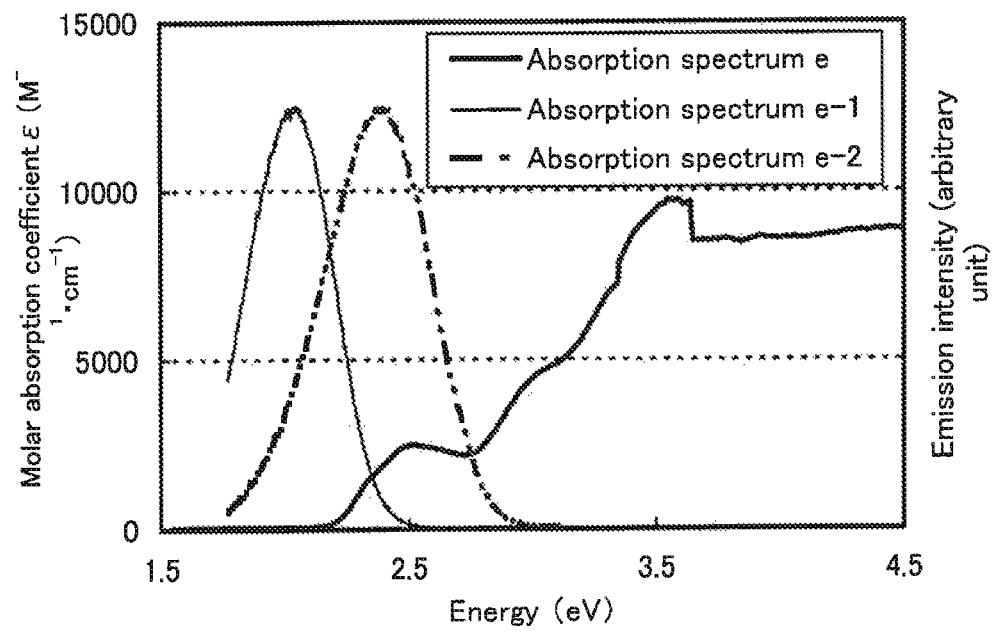

Example 12 shows examples of a guest material and host materials which can be included in the light-emitting element of one embodiment of the present invention with reference to FIGS. 43A and 43B.

The guest material used in this example is [Ir(mppr-Me)$_2$(dpm)]. The host materials used also in this example are the following two types: a mixed material of 2mDBTPDBq-II and 4,4',4''-tris[N-(1-naphthyl)-N-phenylamino]triphenylamine (abbreviation: 1'-TNATA) and a mixed material of 2-[4-(dibenzothiophen-4-yl)phenyl]-1-phenyl-1H-benzimidazole (abbreviation: DBTBIm-II) and 1'-TNATA. A chemical formula of a material used in this example is shown below. Note that chemical formulas of the materials used in the above examples are omitted here.

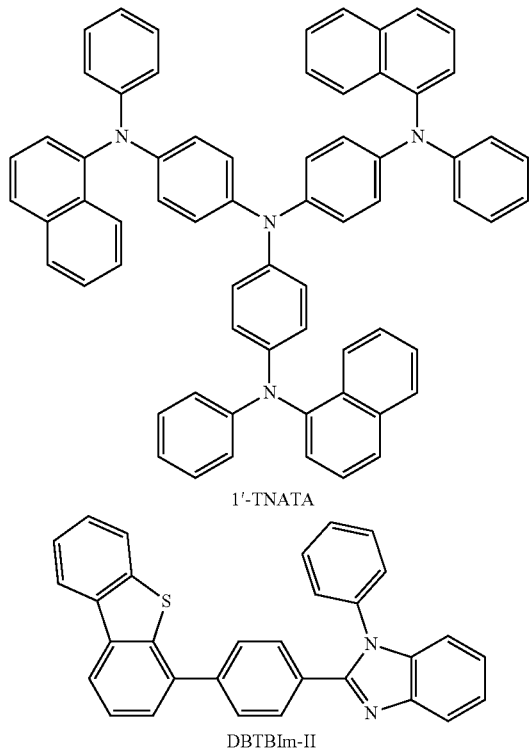

(Absorption Spectrum)

FIGS. 43A and 43B show an ultraviolet-visible absorption spectrum (absorption spectrum e) of [Ir(mppr-Me)$_2$(dpm)] in a dichloromethane solution of [Ir(mppr-Me)$_2$(dpm)]. Measurements of the absorption spectrum were conducted at room temperature, by using an ultraviolet-visible light spectrophotometer (V550 type, manufactured by JASCO Corporation) with the dichloromethane solution (0.093 mmol/L) put in a quartz cell.

(Emission Spectra)

FIGS. 43A and 43B also show an emission spectrum (emission spectrum e-1) of a thin film of a mixed material of 2mDBTPDBq-II and 1'-TNATA and an emission spectrum (emission spectrum e-2) of a thin film of a mixed material of DBTBIm-II and 1'-TNATA. In FIG. 43A, the horizontal axis represents wavelength (nm) and the vertical axes represent molar absorption coefficient ε (M$^{-1}$·cm$^{-1}$) and emission intensity (arbitrary unit). In FIG. 43B, the horizontal axis represents energy (eV) and the vertical axes represent molar absorption coefficient ε (M$^{-1}$·cm$^{-1}$) and emission intensity (arbitrary unit).

The absorption spectrum e in FIG. 43A indicates that [Ir(mppr-Me)$_2$(dpm)] has a broad absorption band around 520 nm. This absorption band is considered to greatly contribute to light emission.

Each of peaks of the emission spectra e-1 and e-2 is found to have a large overlap with the absorption band in the absorption spectrum e, which is considered to greatly contribute to light emission. Thus, it is indicated that a light-emitting element including a light-emitting layer in which the guest material and either host material of this example are used together has high energy transfer efficiency because an energy transfers by using the overlap between the emission spectrum of the host material and the absorption spectrum of the guest material. Therefore, it is indicated that a light-emitting element with high external quantum efficiency can be obtained.

Here, the emission spectrum e-2 has a peak on a shorter wavelength (higher energy) side than the emission spectrum e-1. The peak of the emission spectrum e-2 is closer to the above absorption band than the peak of the emission spectrum e-1. From the above, in FIGS. 43A and 43B, it is found that the emission spectrum having the largest overlap with the absorption band in the absorption spectrum e, which greatly contributes to light emission is the emission spectrum e-2. Specifically, the difference between the peak of the absorption band in the absorption spectrum e (shoulder peak around 520 nm) and the peak of the emission spectrum e-1 is 0.35 eV, and the difference between the peak of the absorption band in the absorption spectrum e (shoulder peak around 520 nm) and the peak of the emission spectrum e-2 is 0.01 eV.

The difference between the peaks of the emission spectra e-1 and e-2 is considered to be attributed to the difference between LUMO levels of 2mDBTPDBq-II and DBTBIm-II. Specifically, the LUMO level of 2mDBTPDBq-II is −2.95 eV whereas the LUMO level of DBTBIm-II is −2.52 eV (both values were calculated by CV measurements). It is considered that since DBTBIm-II has a higher (shallower) LUMO level than 2mDBTPDBq-II, even when DBTBIm-II is mixed with 1'-TNATA having a high HOMO level, the wavelength side on which the peak of the emission spectrum of the composite material is located is not too long (that is, the peak of the emission spectrum e-2 is on a shorter wavelength side than the peak of the emission spectrum e-1).

From the above, it is indicated that a light-emitting element including a mixed material of DBTBIm-II and 1'-TNATA and [Ir(mppr-Me)$_2$(dpm)] has higher energy transfer efficiency than a light-emitting element including a mixed material of 2mDBTPDBq-II and 1'-TNATA and [Ir(mppr-Me)$_2$(dpm)], because an energy transfers by using the large overlap between the emission spectrum of the mixed material and the absorption spectrum of the phosphorescent compound. Therefore, it is indicated that a light-emitting element with higher external quantum efficiency can be obtained.

Example 13

Example 13 shows a light-emitting element of one embodiment of the present invention with reference to FIG.

2. The materials used in this example are used in the above examples, and therefore the chemical formulas thereof are omitted here.

The following shows a method of fabricating light-emitting elements 11 and 12 of this example.

(Light-Emitting Element 11)

First, an ITSO film was formed over the glass substrate 1100 by a sputtering method, so that the first electrode 1101 functioning as an anode was formed. The thickness was 110 nm and the electrode area was 2 mm×2 mm.

Next, as pretreatment for forming the light-emitting element over the substrate 1100, the surface of the substrate was washed with wafer, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in a vacuum evaporation apparatus such that a surface on which the first electrode 1101 was provided faced downward. The pressure in the vacuum evaporation apparatus was reduced to about $10^{-4}$ Pa. Then, BPAFLP and molybdenum(VI) oxide were co-evaporated over the first electrode 1101, so that the hole-injection layer 1111 was formed. The thickness of the hole-injection layer 1111 was 40 nm, and the weight ratio of BPAFLP to molybdenum oxide was adjusted to 4:2 (=BPAFLP:molybdenum oxide).

Next, a BPAFLP film was formed to a thickness of 20 nm over the hole-injection layer 1111, so that the hole-transport layer 1112 was formed.

Further, 2mDBTPDBq-II, 1'-TNATA, and [Ir(mppr-Me)$_2$(dpm)] were co-evaporated, so that the light-emitting layer 1113 was formed over the hole-transport layer 1112. The weight ratio of 2mDBTPDBq-II to 1'-TNATA and [Ir(mppr-Me)$_2$(dpm)] was adjusted to 0.8:0.2:0.05 (=2mDBTPDBq-II:1'-TNATA:[Ir(mppr-Me)$_2$(dpm)]). The thickness of the light-emitting layer 1113 was 20 nm.

Next, a 2mDBTPDBq-II film was formed to a thickness of 30 nm over the light-emitting layer 1113, so that the first electron-transport layer 1114a was formed.

Next, a BPhen film was formed to a thickness of 20 nm over the first electron-transport layer 1114a, so that the second electron-transport layer 1114b was formed.

Further, a LiF film was formed to a thickness of 1 nm over the second electron-transport layer 1114b by evaporation, so that the electron-injection layer 1115 was formed.

Lastly, an aluminum film was formed to a thickness of 200 nm by evaporation, so that the second electrode 1103 functioning as a cathode was formed. Thus, the light-emitting element 11 of this example was fabricated.

(Light-Emitting Element 12)

The light-emitting layer 1113 of the light-emitting element 12 was formed by co-evaporation of DBTBIm-II, 1'-TNATA, and [Ir(mppr-Me)$_2$(dpm)]. The weight ratio of DBTBIm-II to 1'-TNATA and [Ir(mppr-Me)$_2$(dpm)] was adjusted to 0.8:0.2:0.05 (=DBTBIm-II:1'-TNATA:[Ir(mppr-Me)$_2$(dpm)]). The thickness of the light-emitting layer 1113 was 20 nm.

The first electron-transport layer 1114a of the light-emitting element 12 was formed by forming DBTBIm-II film to a thickness of 30 nm. The layers other than the light-emitting layer 1113 and the first electron-transport layer 1114a were formed in the same manner as that of the light-emitting element 11.

Note that, in the above evaporation process, evaporation was all performed by a resistance heating method.

Table 13 shows element structures of the thus obtained light-emitting elements 11 and 12.

TABLE 13

| | 1st Electrode | Hole-injection Layer | Hole-transport Layer | Light-emitting Layer | 1st Electron-transport Layer | 2nd Electron-transport | Electron-injection Layer | 2nd Electrode |
|---|---|---|---|---|---|---|---|---|
| Light-emitting Element 11 | ITSO 110 nm | BPAFLP: MoOx (=4:2) 40 nm | BPAFLP 20 nm | 2mDBTPDBq-II: 1'-TNATA: [Ir(mppr-Me)$_2$(dpm)] (=0.8:0.2:0.05) 20 nm | 2mDBTPDBq-II 30 nm | BPhen 20 nm | LiF 1 nm | Al 200 nm |
| Light-emitting Element 12 | ITSO 110 nm | BPAFLP: MoOx (=4:2) 40 nm | BPAFLP 20 nm | DBTBIm-II: 1'-TNATA: [Ir(mppr-Me)$_2$(dpm)] (=0.8:0.2:0.05) 20 nm | DBTBIm-II 30 nm | BPhen 20 nm | LiF 1 nm | Al 200 nm |

In a glove box containing a nitrogen atmosphere, these light-emitting elements were sealed so as not to be exposed to air. Then, operation characteristics of these light-emitting elements were measured. Note that the measurements were carried out at room temperature (in an atmosphere kept at 25° C.).

Figure 44:
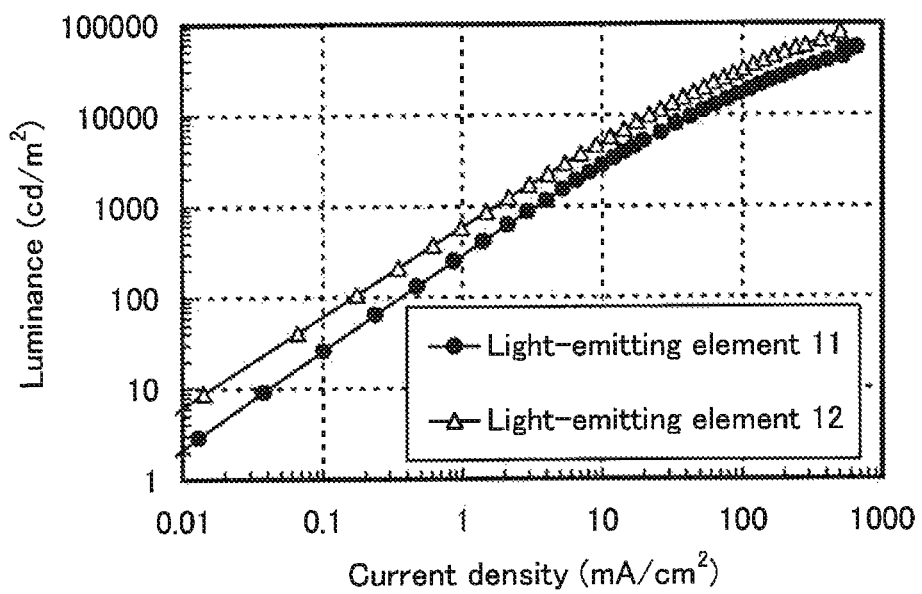
FIG. 44 shows current density versus luminance characteristics of light-emitting elements of Example 13.
Figure 45:
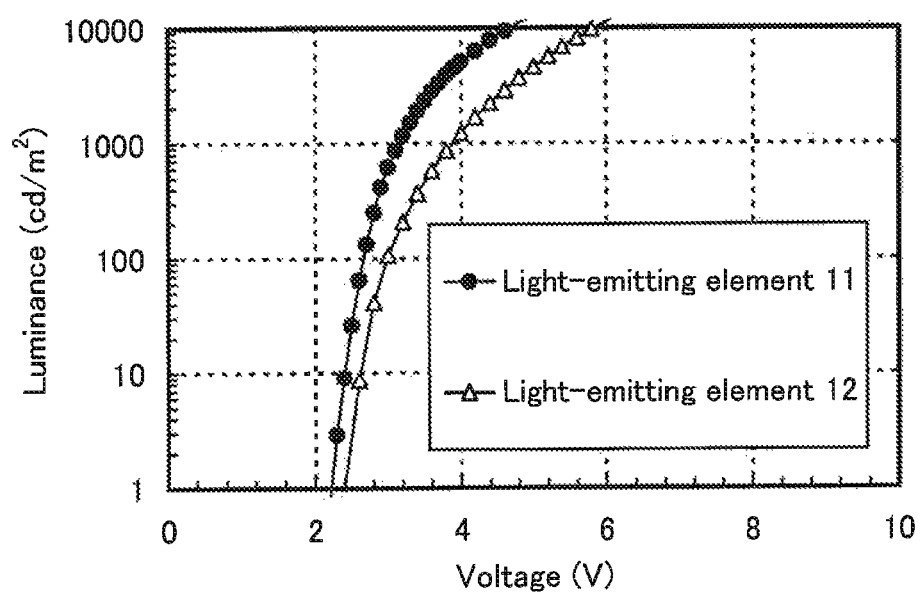
FIG. 45 shows voltage versus luminance characteristics of the light-emitting elements of Example 13.
Figure 46:
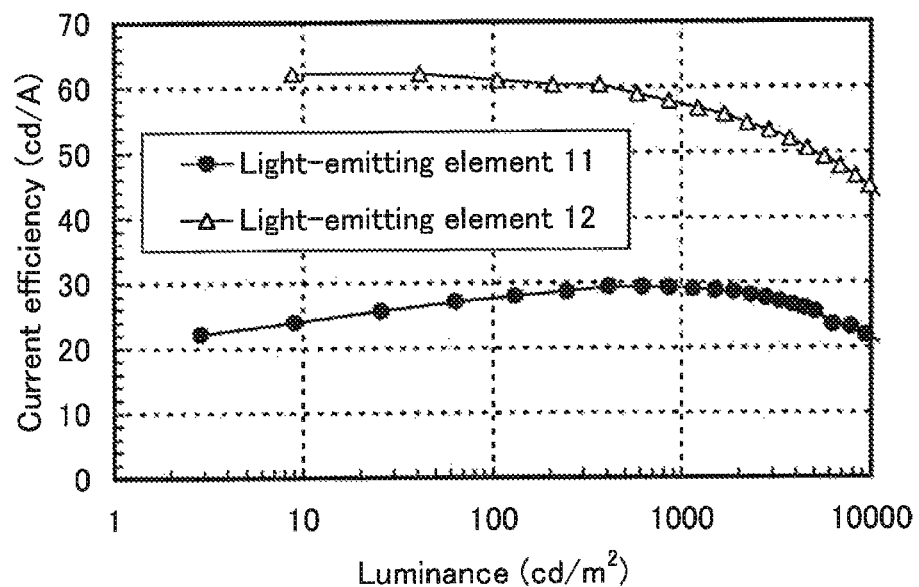
FIG. 46 shows luminance versus current efficiency characteristics of the light-emitting elements of Example 13.
Figure 47:
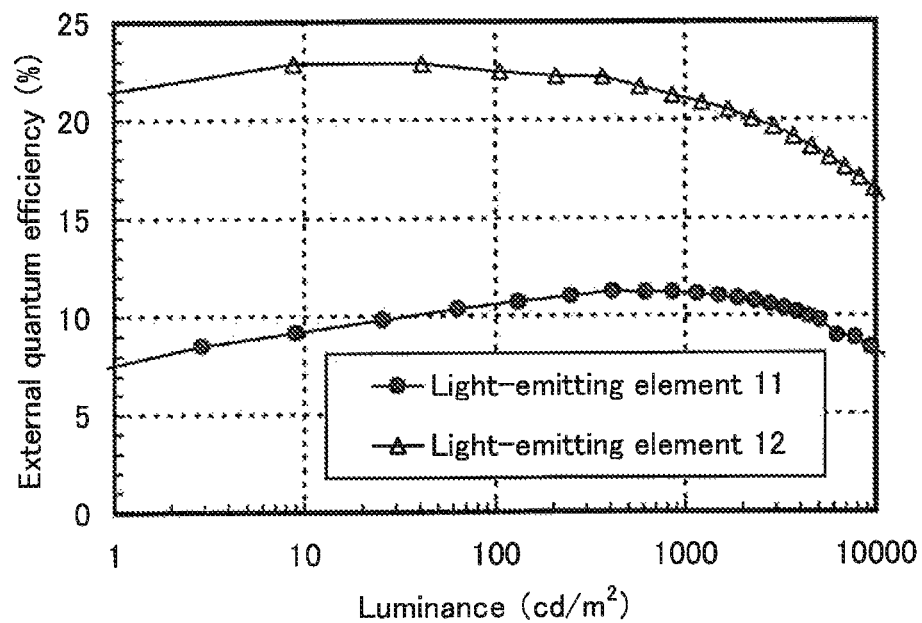
FIG. 47 shows luminance versus external quantum efficiency characteristics of the light-emitting elements of Example 13.

FIG. 44 shows current density versus luminance characteristics of the light-emitting elements 11 and 12. In FIG. 44, the horizontal axis represents current density (mA/cm$^2$) and the vertical axis represents luminance (cd/m$^2$). FIG. 45 shows voltage versus luminance characteristics. In FIG. 45, the horizontal axis represents voltage (V) and the vertical axis represents luminance (cd/m$^2$). FIG. 46 shows luminance versus current efficiency characteristics. In FIG. 46, the horizontal axis represents luminance (cd/m$^2$) and the vertical axis represents current efficiency (cd/A). FIG. 47 shows luminance versus external quantum efficiency characteristics. In FIG. 47, the horizontal axis represents luminance (cd/m$^2$) and the vertical axis represents external quantum efficiency (%).

Further, Table 14 shows the voltage (V), current density (mA/cm$^2$), CIE chromaticity coordinates (x, y), current efficiency (cd/A), power efficiency (lm/W), and external quantum efficiency (%) of the light-emitting elements 11 and 12 at a luminance of around 860 cd/m$^2$.

TABLE 14

|  | Votage (V) | Current Density (mA/cm²) | Chromaticity (x, y) | Luminance (cd/m²) | Current Efficiency (cd/A) | Power Efficiency (lm/W) | External Quantum Efficiency (%) |
|---|---|---|---|---|---|---|---|
| Light-emitting Element 11 | 3.1 | 2.9 | (0.53, 0.46) | 860 | 29 | 30 | 11 |
| Light-emitting Element 12 | 3.8 | 1.5 | (0.53, 0.46) | 860 | 58 | 48 | 21 |

Figure 48:
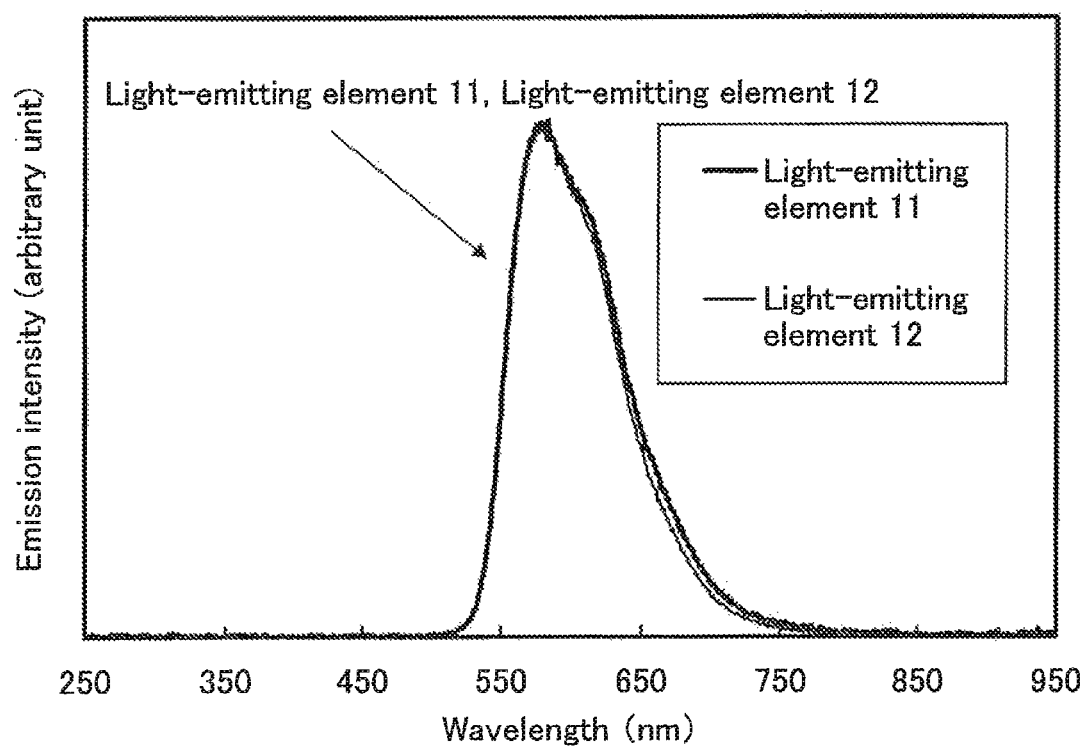
FIG. 48 shows emission spectra of the light-emitting elements of Example 13.

FIG. 48 shows emission spectra of the light-emitting elements 11 and 12 which were obtained by applying a current of 0.1 mA. In FIG. 48, the horizontal axis represents wavelength (nm) and the vertical axis represents emission intensity (arbitrary unit). As shown in Table 14, CIE chromaticity coordinates of the light-emitting element 11 and the light-emitting element 12 at a luminance of 860 cd/m² were (x, y)=(0.53, 0.46). The results indicate that the light-emitting elements 11 and 12 emit orange light originating from [Ir(mppr-Me)$_2$(dpm)].

As can be seen from Table 14 and FIGS. 44 to 47, each of the light-emitting elements 11 and 12 has high current efficiency, high power efficiency, and high external quantum efficiency.

The light-emitting layer of the light-emitting element 11 includes 2mDBTPDBq-II, 1'-TNATA, and [Ir(mppr-Me)$_2$(dpm)] described in Example 12, and the light-emitting layer of the light-emitting element 12 includes DBTBIm-II, 1'-TNATA, and [Ir(mppr-Me)$_2$(dpm)] described in Example 12. As described in Example 12, the emission spectra of the mixed material of 2mDBTPDBq-II and 1'-TNATA and the mixed material of DBTBIm-II and 1'-TNATA, have large overlaps with the absorption band in the absorption spectrum of [Ir(mppr-Me)$_2$(dpm)], which is considered to greatly contribute to light emission. The light-emitting elements 11 and 12 are considered to have high energy transfer efficiency and external quantum efficiency because energies transfer by using the overlaps. In particular, the emission spectrum of the mixed material of DBTBIm-II and 1'-TNATA has a larger overlap with the absorption band than the emission spectrum of the mixed material of 2mDBTPDBq-II and 1'-TNATA. Therefore, the light-emitting element 12 is considered to have higher energy transfer efficiency and external quantum efficiency than the light-emitting element 11, because an energy transfers by using the larger overlap. Referring to the results of Example 12, it is found that the difference between the energy value of a peak of the emission spectrum of the host material and the energy value of a peak of the lowest-energy-side absorption band in the absorption spectrum of the guest material is preferably 0.3 eV or less.

The above results indicate that application of one embodiment of the present invention makes it possible to achieve a light-emitting element with high external quantum efficiency.

Example 14

Figure 49A:
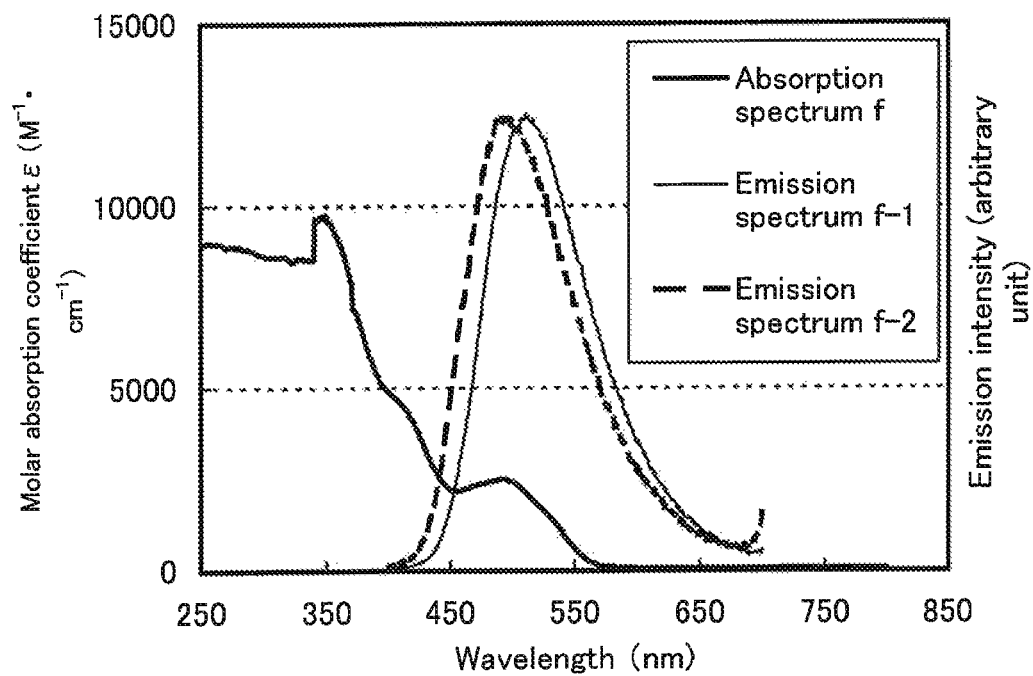
FIGS. 49A and 49B show absorption spectra and emission spectra according to Example 14.
Figure 49B:
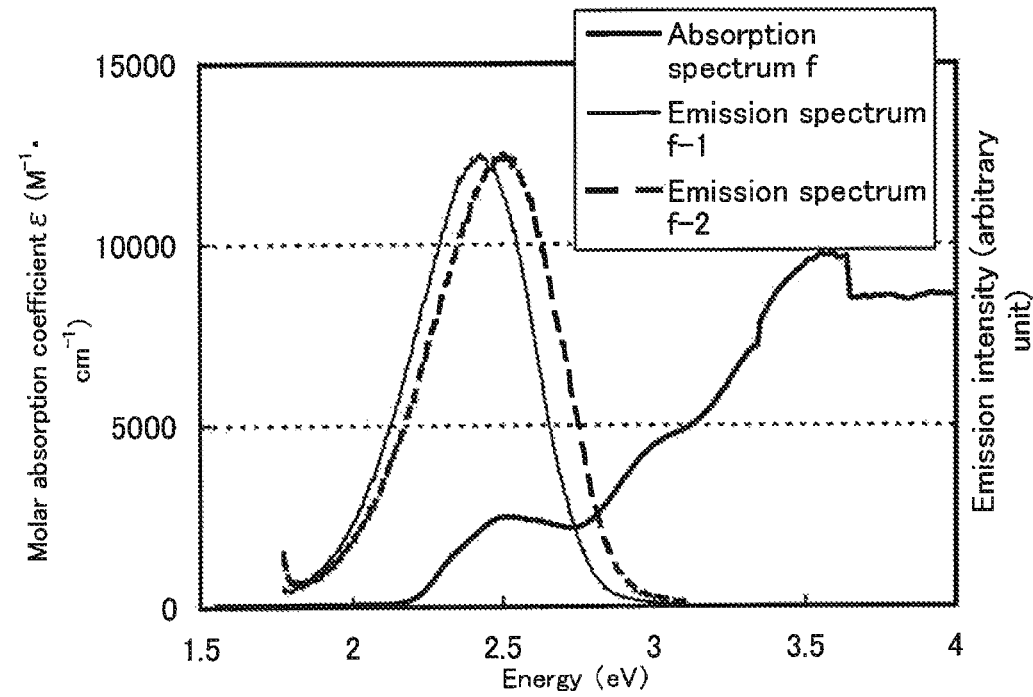

Example 14 shows examples of a guest material and host materials which can be included in the light-emitting element of one embodiment of the present invention with reference to FIGS. 49A and 49B.

The guest material used in this example is [Ir(mppr-Me)$_2$(dpm)]. The host materials used also in this example are the following two types: a mixed material of 2mDBTPDBq-II and PCBNBB and a mixed material of 2mDBTPDBq-II and 9-phenyl-9H-3-(9-phenyl-9H-carbazol-3-yl)carbazole (abbreviation: PCCP). Chemical formulas of materials used in this example are shown below. Note that chemical formulas of the materials used in the above examples are omitted here.

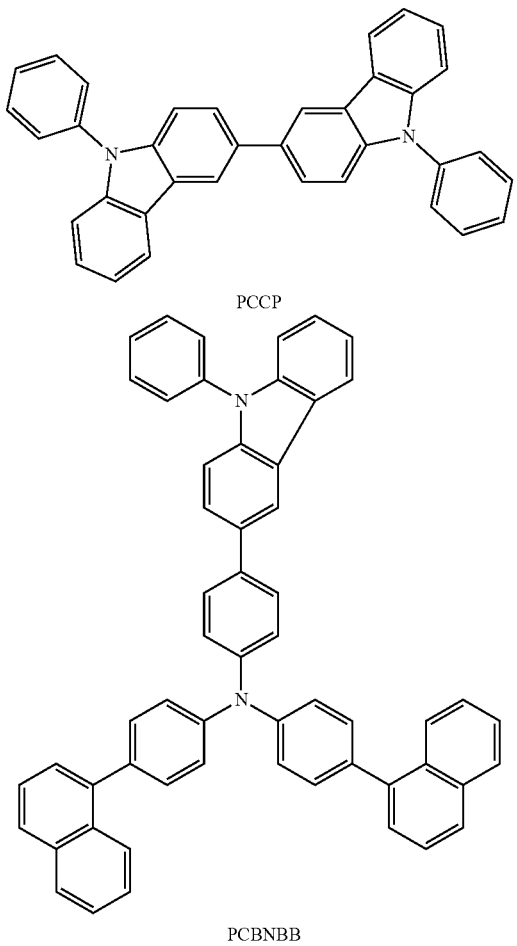

PCCP

PCBNBB (Absorption Spectrum)

FIGS. 49A and 49B show an ultraviolet-visible absorption spectrum (absorption spectrum f) of [Ir(mppr-Me)$_2$(dpm)] in a dichloromethane solution of [Ir(mppr-Me)$_2$(dpm)]. Measurements of the absorption spectrum were conducted at room temperature, by using an ultraviolet-visible light spectrophotometer (V550 type, manufactured by JASCO Corporation) with the dichloromethane solution (0.093 mmol/L) put in a quartz cell.

(Emission Spectra)

FIGS. 49A and 49B also show an emission spectrum (emission spectrum f-1) of a thin film of a mixed material of 2mDBTPDBq-II and PCBNBB and an emission spectrum (emission spectrum f-2) of a thin film of a mixed material of 2mDBTPDBq-II and PCCP. In FIG. 49A, the horizontal axis represents wavelength (nm) and the vertical axes represent molar absorption coefficient ε ($M^{-1} \cdot cm^{-1}$) and emission intensity (arbitrary unit). In FIG. 49B, the horizontal axis represents energy (eV) and the vertical axes represent molar absorption coefficient ε ($M^{-1} \cdot cm^{-1}$) and emission intensity (arbitrary unit).

The absorption spectrum f in FIG. 49A indicates that [Ir(mppr-Me)$_2$(dpm)] has a broad absorption band around 500 nm. This absorption band is considered to greatly contribute to light emission.

Each of peaks of the emission spectra f-1 and f-2 is found to have a large overlap with the absorption band in the absorption spectrum f, which is considered to greatly contribute to light emission. Thus, it is indicated that a light-emitting element including a light-emitting layer in which the guest material and either host material of this example are used together has high energy transfer efficiency because an energy transfers by using the overlap between the emission spectrum of the host material and the absorption spectrum of the guest material. Therefore, it is indicated that a light-emitting element with high external quantum efficiency can be obtained.

Example 14 indicates that either the mixed material including the carbazole compound or the composite material including the aromatic amine compound can be used as the host material.

Example 15

Example 15 shows a light-emitting element of one embodiment of the present invention with reference to FIG. 2. The materials used in this example are used in the above examples, and therefore the chemical formulas thereof are omitted here.

The following shows a method of fabricating light-emitting elements 13 and 14 of this example.

(Light-Emitting Element 13)

First, an ITSO film was formed over the glass substrate 1100 by a sputtering method, so that the first electrode 1101 functioning as an anode was formed. The thickness was 110 nm and the electrode area was 2 mm×2 mm.

Next, as pretreatment for forming the light-emitting element over the substrate 1100, the surface of the substrate was washed with water, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in a vacuum evaporation apparatus such that a surface on which the first electrode 1101 was provided faced downward. The pressure in the vacuum evaporation apparatus was reduced to about $10^{-4}$ Pa. Then, BPAFLP and molybdenum(VI) oxide were co-evaporated over the first electrode 1101, so that the hole-injection layer 1113 was formed. The thickness of the hole-injection layer 1111 was 40 nm, and the weight ratio of BPAFLP to molybdenum oxide was adjusted to 4:2 (=BPAFLP:molybdenum oxide).

Next, a BPAFLP film was formed to a thickness of 20 nm over the hole-injection layer 1111, so that the hole-transport layer 1112 was formed.

Further, 2mDBTPDBq-II, PCBNBB, and [Ir(mppr-Me)$_2$(dpm)] were co-evaporated, so that the light-emitting layer 1113 was formed over the hole-transport layer 1112. The weight ratio of 2mDBTPDBq-II to PCBNBB and [Ir(mppr-Me)$_2$(dpm)] was adjusted to 0.8:0.2:0.05 (=2mDBTPDBq-II:PCBNBB:[Ir(mppr-Me)$_2$(dpm)]). The thickness of the light-emitting layer 1113 was 20 nm.

Next, 2mDBTPDBq-II, PCBNBB, and [Ir(mppr-Me)$_2$(dpm)] were co-evaporated over the light-emitting layer 1113, so that the first electron-transport layer 1114a was formed over the light-emitting layer 1113. The weight ratio of 2mDBTPDBq-II to PCBNBB and [Ir(mppr-Me)$_2$(dpm)] was adjusted to 0.8:0.2:0.05 (=2mDBTPDBq-II:PCBNBB:[Ir(mppr-Me)$_2$(dpm)]). The thickness of the first electron-transport layer 1114a was 40 nm.

Next, a BPhen film was formed to a thickness of 10 nm over the first electron-transport layer 1114a, so that the second electron-transport layer 1114b was formed.

Further, a LiF film was formed to a thickness of 1 nm over the second electron-transport layer 1114b by evaporation, so that the electron-injection layer 1115 was formed.

Lastly, an aluminum film was formed to a thickness of 200 nm by evaporation, so that the second electrode 1103 functioning as a cathode was formed. Thus, the light-emitting element 13 of this example was fabricated.

(Light-Emitting Element 14)

The light-emitting layer 1113 of the light-emitting element 14 was formed by co-evaporation of 2mDBTPDBq-II, 9-phenyl-9H-3-(9-phenyl-9H-carbazol-3-yl)carbazole (abbreviation: PCCP), and [Ir(mppr-Me)$_2$(dpm)]. The weight ratio of 2mDBTPDBq-II to PCCP and [Ir(mppr-Me)$_2$(dpm)] was adjusted to 0.8:0.2:0.05 (=2mDBTPDBq-II:PCCP:[Ir(mppr-Me)$_2$(dpm)]). The thickness of the light-emitting layer 1113 was 20 nm. The layers other than the light-emitting layer 1113 were formed in the same manner as that of the light-emitting element 13.

Note that, in the above evaporation process, evaporation was all performed by a resistance heating method.

Table 15 shows element structures of the thus obtained light-emitting elements 13 and 14.

TABLE 15

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 13 | ITSO 11● nm | BPAFLP: MoOx (=4:2) 4● nm | BPAFLP 2● nm | 2mDBTPDBq-II: PCBNBB: [Ir(mppr-Me)$_2$(dpm)] (=●8:●.2:●.●5) | 2mDBTPDBq-II: PCBNBB: [Ir(mppr-Me)$_2$(dpm)] (=●8:●.2:●.●5) | BPhen 1● nm | LiF 1 nm | Al 2●● nm |

TABLE 15-continued

| | 1st Electrode | Hole-injection Layer | Hole-transport Layer | Light-emitting Layer | 1st Electron-transport Layer | 2nd Electron-transport Layer | Electron-injection Layer | 2nd Electrode |
|---|---|---|---|---|---|---|---|---|
| Light-emitting Element 14 | ITSO 11●nm | BPAFLP: MoOx (=4:2) 4● nm | BPAFLP 2● nm | 2● nm 2mDBTPDBq-II: PCCP: [Ir(mppr-Me)₂(dpm)] (=●8:●.2:●.●5) 2● nm | 4● nm 2mDBTPq-II: PCBNBB: [Ir(mppr-Me)₂(dpm)] (=●8:●.2:●.●5) 4● nm | BPhen 1●nm | LiF 1 nm | Al 2●●nm |

In a glove box containing a nitrogen atmosphere, these light-emitting elements were sealed so as not to be exposed to air. Then, operation characteristics of these light-emitting elements were measured. Note that the measurements were carried out at room temperature (in an atmosphere kept at 25° C.).

Figure 50:
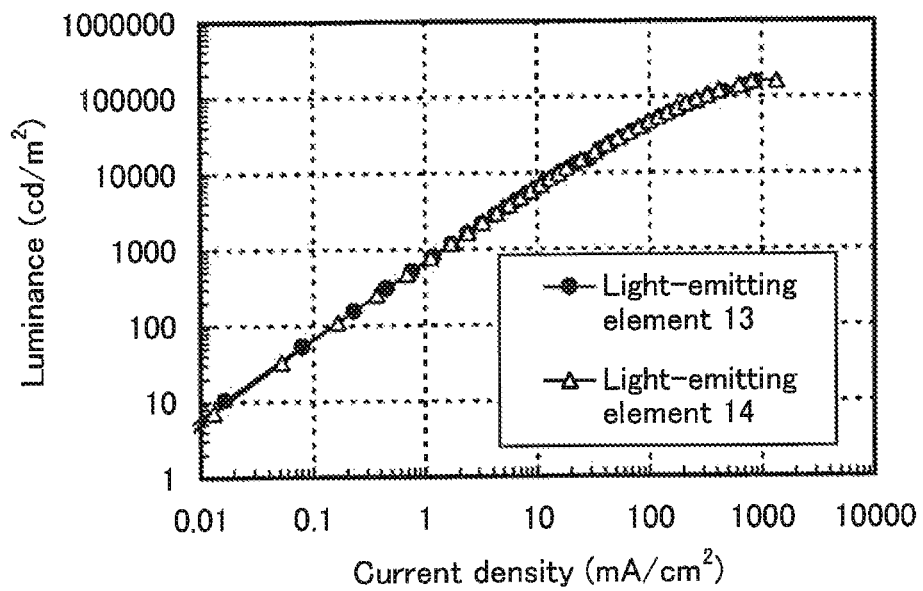
FIG. 50 shows current density versus luminance characteristics of light-emitting elements of Example 15.
Figure 51:
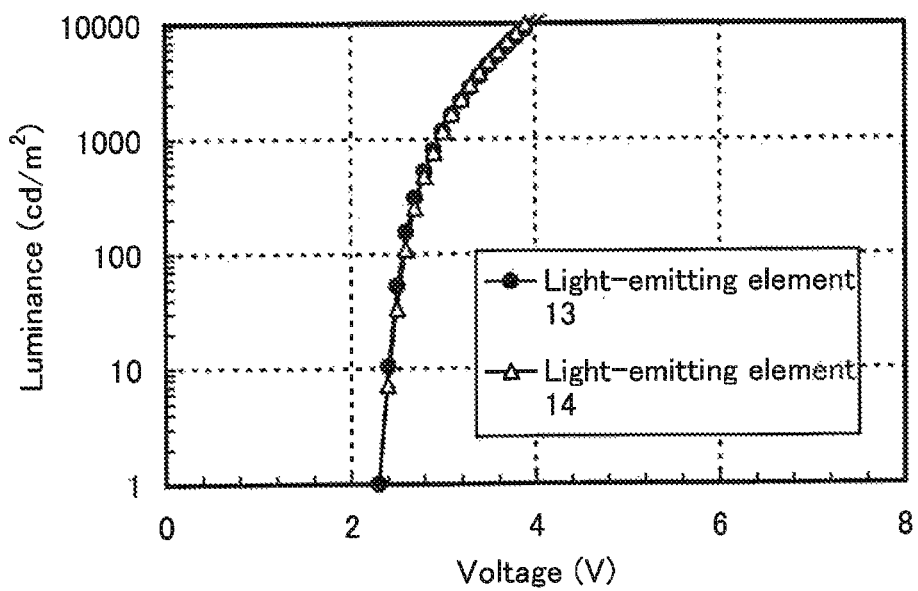
FIG. 51 shows voltage versus luminance characteristics of the light-emitting elements of Example 15.
Figure 52:
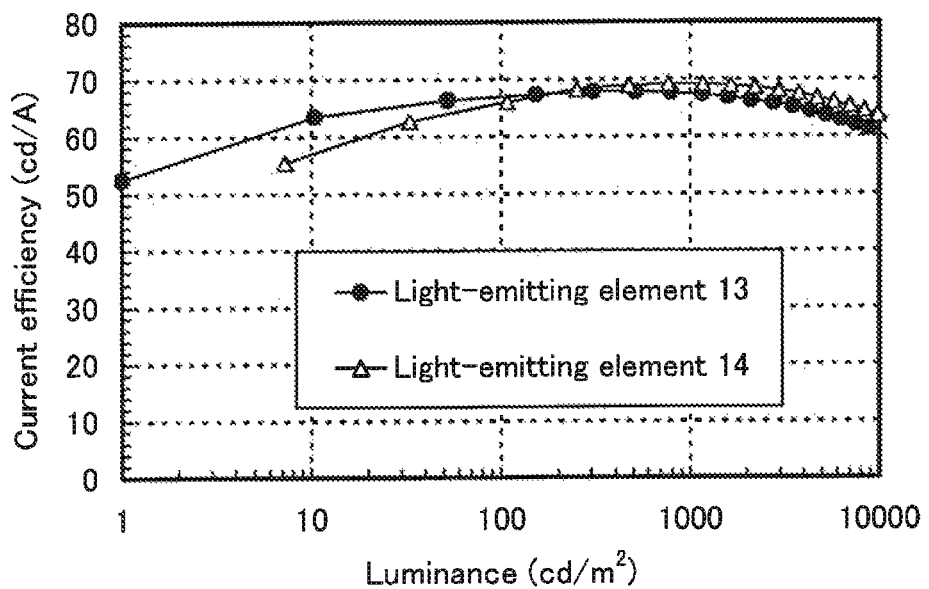
FIG. 52 shows luminance versus current efficiency characteristics of the light-emitting elements of Example 15.
Figure 53:
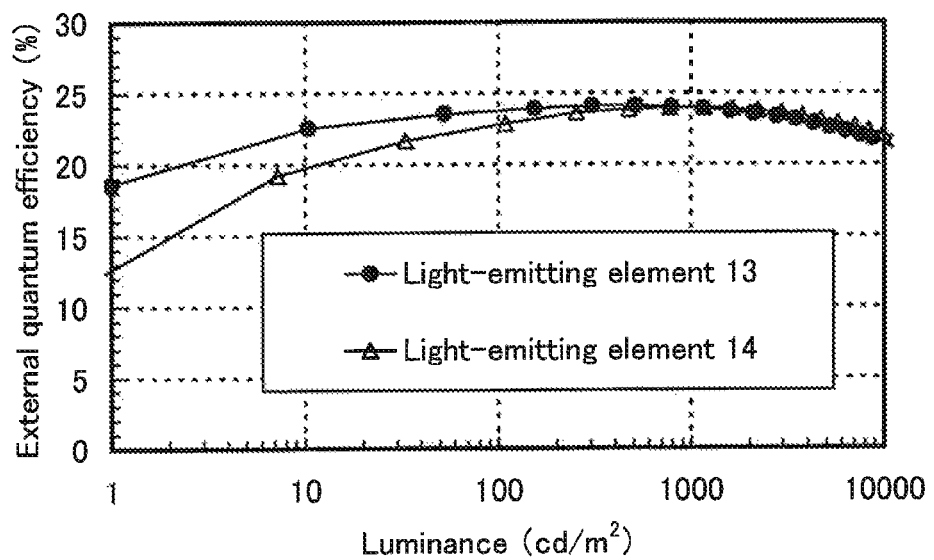
FIG. 53 shows luminance versus external quantum efficiency characteristics of the light-emitting elements of Example 15.

FIG. 50 shows current density versus luminance characteristics of the light-emitting elements 13 and 14. In FIG. 50, the horizontal axis represents current density (mA/cm²) and the vertical axis represents luminance (cd/m²). FIG. 51 shows voltage versus luminance characteristics. In FIG. 51, the horizontal axis represents voltage (V) and the vertical axis represents luminance (cd/m²). FIG. 52 shows luminance versus current efficiency characteristics. In FIG. 52, the horizontal axis represents luminance (cd/m²) and the vertical axis represents current efficiency (cd/A). FIG. 53 shows luminance versus external quantum efficiency characteristics. In FIG. 53, the horizontal axis represents luminance (cd/m²) and the vertical axis represents external quantum efficiency (%).

Further, Table 16 shows the voltage (V), current density (mA/cm²), CIE chromaticity coordinates (x, y), current efficiency (cd/A), power efficiency (lm/W), and external quantum efficiency (%) of the light-emitting elements 13 and 14 at a luminance of around 1200 cd/m².

The light-emitting layer of the light-emitting element 13 includes 2mDBTPDBq-II, PCBNBB, and [Ir(mppr-Me)₂(dpm)] described in Example 14, and the light-emitting layer of the light-emitting element 14 includes 2mDBTPDBq-II, PCCP, and [Ir(mppr-Me)₂(dpm)] described in Example 14. As described in Example 14, the emission spectra of the mixed material of 2mDBTPDBq-II and PCBNBB and the mixed material of 2mDBTPDBq-II and PCCP have large overlaps with the absorption band in the absorption spectrum of [Ir(mppr-Me)₂(dpm)], which is considered to greatly contribute to light emission. The light-emitting elements 13 and 14 are considered to have high energy transfer efficiency and external quantum efficiency because energies transfer by using the overlaps.

Example 15 indicates that when the mixed material including the carbazole compound (PCCP) is used as the host material in the light-emitting layer instead of the mixed material including the aromatic amine compound (PCBNBB), a light-emitting element with high external quantum efficiency can also be obtained.

TABLE 16

| | Votage (V) | Current Density (mA/cm²) | Chromaticity (x, y) | Luminance (cd/m²) | Cunent Efficiency (cd/A) | Power Efficiency (lm/W) | External Quantum Efficiency (%) |
|---|---|---|---|---|---|---|---|
| Light-emitting Element 13 | 3.0 | 1.7 | (0.54, 0.45) | 1200 | 67 | 70 | 24 |
| Light-emitting Element 14 | 3.0 | 1.7 | (0.54, 0.46) | 1200 | 69 | 72 | 24 |

Figure 54:
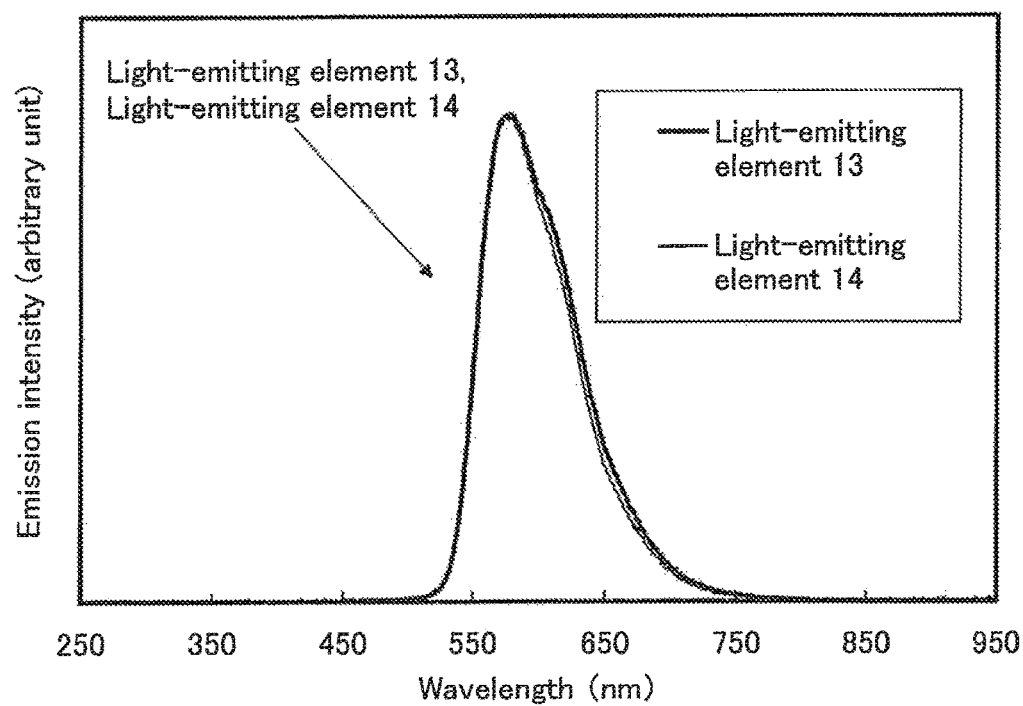
FIG. 54 shows emission spectra of the light-emitting elements of Example 15.

FIG. 54 shows emission spectra of the light-emitting elements 13 and 14 which were obtained by applying a current of 0.1 mA. In FIG. 54, the horizontal axis represents wavelength (nm) and the vertical axis represents emission intensity (arbitrary unit). As shown in Table 16, CIE chromaticity coordinates of the light-emitting element 13 at a luminance of 1200 cd/m² were (x, y)=(0.54, 0.45), and CIE chromaticity coordinates of the light-emitting element 14 at a luminance of 1200 cd/m² were (x, y)=(0.54, 0.46). The results indicate that the light-emitting elements 13 and 14 emit orange light originating from [Ir(mppr-Me)₂(dpm)].

As can be seen from Table 16 and FIGS. 50 to 53, each of the light-emitting elements 13 and 14 has high current efficiency, high power efficiency, and high external quantum efficiency.

The above results indicate that application of one embodiment of the present invention makes it possible to achieve a light-emitting element with high external quantum efficiency.

Reference Example 1

The following shows a synthetic example of an organometallic complex (acetylacetonato)bis(4,6-diphenylpyrimidinato)iridium(III) (another name: bis[2-(6-phenyl-4-pyrimidinyl-κN3)phenyl-κC](2,4-pentanedionato-κ²O,O') iridium(III)) (abbreviation: [Ir(dppm)₂(acac)]), which is used in the above Examples. The structure of [Ir(dppm)₂(acac)] is shown below.

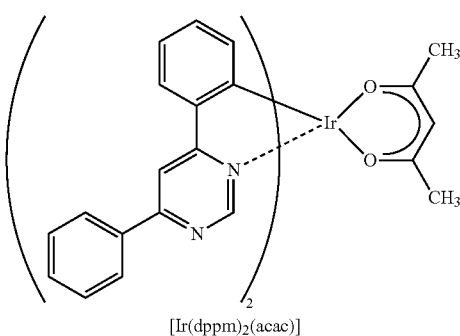

[Ir(dppm)₂(acac)]

⟨Step 1: Synthesis of 4,6-Diphenylpyrimidine (Abbreviation: Hdppm)⟩

First, 5.02 g of 4,6-dichloropyrimidine, 8.29 g of phenylboronic acid, 7.19 g of sodium carbonate, 0.29 g of bis(triphenylphosphine)palladium(II)dichloride (abbreviation: Pd(PPh₃)₂Cl₂), 20 mL of water, and 20 mL of acetonitrile were put into a recovery flask equipped with a reflux pipe, and the air in the flask was replaced with argon. This reaction container was heated by irradiation with microwaves (2.45 GHz, 100 W) for 60 minutes. Here, there were further put 2.08 g of phenylboronic acid, 1.79 g of sodium carbonate, 0.070 g of Pd(PPh₃)₂Cl₂, 5 mL of water, and 5 mL of acetonitrile into the flask, and the mixture was heated again by irradiation with microwaves (2.45 GHz, 100 W) for 60 minutes. After that, water was added to this solution and an organic layer was extracted with dichloromethane. The obtained solution of the extract was washed with water and dried with magnesium sulfate. The solution after drying was filtered. The solvent of this solution was distilled off, and then the obtained residue was purified by silica gel column chromatography using dichloromethane as a developing solvent, so that a pyrimidine derivative Hdppm (yellow white powder, yield of 38%) was obtained. Note that for the irradiation with microwaves, a microwave synthesis system (Discover, manufactured by CEM Corporation) was used. A synthesis scheme (a-1) of Step 1 is shown below.

(a-1)

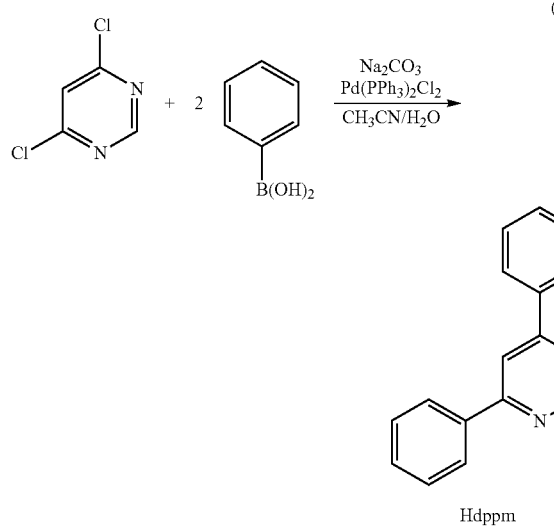

⟨Step 2: Synthesis of Di-μ-chloro-bis[bis(4,6-diphenylpyrimidinato)iridium(III)] (Abbreviation: [Ir(dppm)₂Cl]₂)⟩

Next, 15 mL of 2-ethoxyethanol, 5 mL of water, 1.10 g of Hdppm obtained in Step 1, and 0.69 g of iridium chloride hydrate (IrCl₃.H₂O) were put into a recovery flask equipped with a reflux pipe, and the air in the recovery flask was replaced with argon. After that, irradiation with microwaves (2.45 GHz, 100 W) was performed for 1 hour to cause a reaction. The solvent was distilled off, and then the obtained residue was filtered and washed with ethanol to give a dinuclear complex [Ir(dppm)₂Cl]₂ (reddish brown powder, yield of 88%). A synthesis scheme (a-2) of Step 2 is shown below.

(a-2)

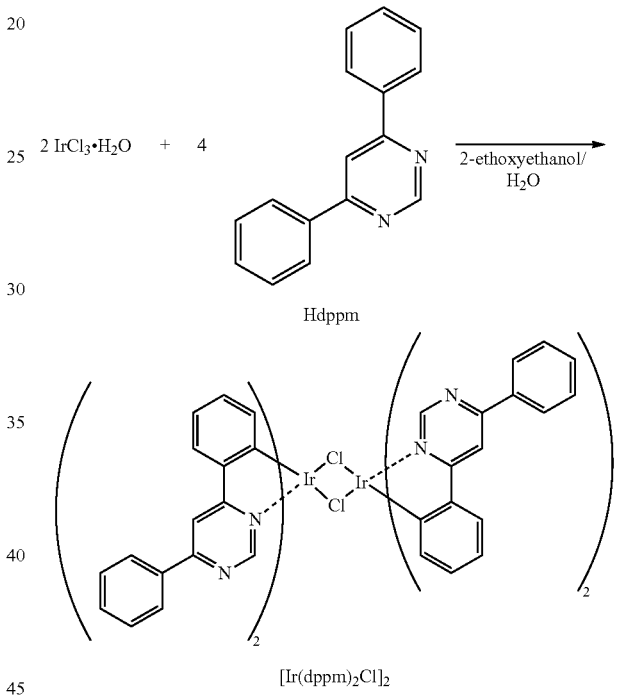

[Ir(dppm)₂Cl]₂

⟨Step 3: Synthesis of (Acetylacetonato)bis(4,6-diphenylpyrimidinaio)iridium(III) (Abbreviation: [Ir(dppm)₂(acac)])⟩

Furthermore, 40 mL of 2-ethoxyethanol, 1.44 g of [Ir(dppm)₂Cl]₂ obtained in Step 2, 0.30 g of acetylacetone, and 1.07 g of sodium carbonate were put into a recovery flask equipped with a reflux pipe, and the air in the recovery flask was replaced with argon. After that, irradiation with microwaves (2.45 GHz, 120 W) was performed for 60 minutes to cause a reaction. The solvent was distilled off, the obtained residue was dissolved in dichloromethane, and filtration was performed to remove insoluble matter. The obtained filtrate was washed with water and then with saturated saline, and was dried with magnesium sulfate. The solution after drying was filtered. The solvent of this solution was distilled off, and then the obtained residue was purified by silica gel column chromatography using dichloromethane and ethyl acetate as a developing solvent in a volume ratio of 50:1. After that, recrystallization was carried out with a mixed solvent of dichloromethane and hexane, so that the objective orange powder (yield of 32%) was obtained. A synthesis scheme (a-3) of Step 3 is shown below.

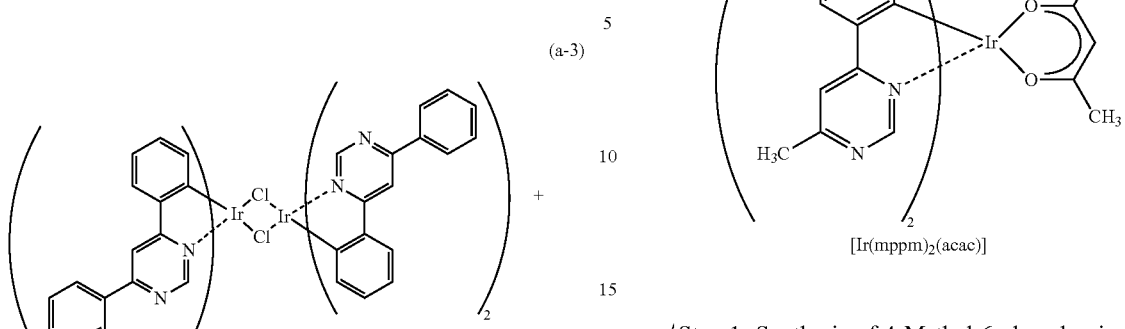

(a-3)

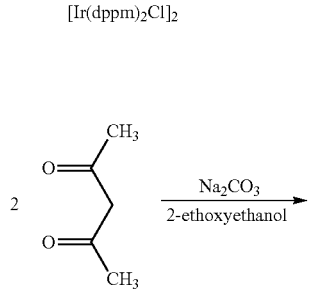

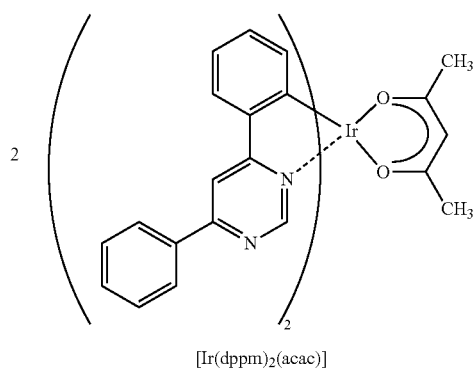

An analysis result by nuclear magnetic resonance spectrometry ($^1$H NMR) of the orange powder obtained in Step 3 is described below. These results revealed that the organometallic complex [Ir(dppm)$_2$(acac)] was obtained.

$^1$H NMR. δ(CDCl$_3$): 1.83 (s, 6H), 5.29 (s, 1H), 6.48 (d, 2H), 6.80 (t, 2H), 6.90 (t, 2H), 7.55-7.63 (m, 6H), 7.77 (d, 2H), 8.17 (s, 2H), 8.24 (d, 4H), 9.17 (s, 2H).

Reference Example 2

The following shows a synthetic example of an organometallic complex (acetylacetonato)bis(6-methyl-4-phenylpyrimidinato)iridium(III) (another name: bis[2-(6-methyl-4-pyrimidinyl-κN3)phenyl-κC](2,4-pentanedionato-κ$^2$O,O')iridium(III)) (abbreviation: [Ir(mppm)$_2$(acac)]), which is used in the above Examples. The structure of [Ir(mppm)$_2$(acac)] is shown below.

⟨Step 1: Synthesis of 4-Methyl-6-phenylpyrimidine (Abbreviation: Hmppm)⟩

First, 4.90 g of 4-chloro-6-methylpyrimidine, 4.80 g of phenylboronic acid, 4.03 g of sodium carbonate, 0.16 g of bis(triphenylphosphine)palladium(II)dichloride (abbreviation: Pd(PPh$_3$)$_2$Cl$_2$), 20 mL of water, and 10 mL of acetonitrile were put into a recovery flask equipped with a reflux pipe, and the air in the flask was replaced with argon. This reaction container was heated by irradiation with microwaves (2.45 GHz, 100 W) for 60 minutes. Here, there were further put 2.28 g of phenylboronic acid, 2.02 g of sodium carbonate, 0.082 g of Pd(PPh$_3$)$_2$Cl$_2$, 5 mL of water, and 10 mL of acetonitrile in the flask, and the mixture was heated again by irradiation with microwaves (2.45 GHz, 100 W) for 60 minutes. After that, water was added to this solution and extraction with dichloromethane was carried out. The obtained solution of the extract was washed with a saturated aqueous solution of sodium carbonate, water, and then with saturated saline, and dried with magnesium sulfate. The solution after drying was filtered. The solvent of this solution was distilled off, and then the obtained residue was purified by silica gel column chromatography using dichloromethane and ethyl acetate as a developing solvent in a volume ratio of 9:1, so that the objective pyrimidine derivative Hmppm (orange oily substance, yield of 46%) was obtained. Note that the irradiation with microwaves was performed using a microwave synthesis system (Discover, manufactured by CEM Corporation). A synthesis scheme (b-1) of Step 1 is shown below.

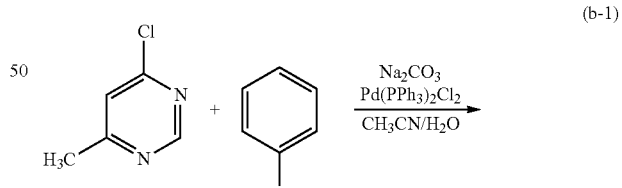

(b-1)

⟨Step 2: Synthesis of Di-μ-chloro-bis[bis(6-methyl-4-phenylpyrimidinato)iridium(III)] (Abbreviation: [Ir(mppm)₂Cl]₂)⟩

Next, 15 mL of 2-ethoxyethanol, 5 mL of water, 1.51 g of Hmppm obtained in Step 1, and 1.26 g of iridium chloride hydrate (IrCl₃·H₂O) were put into a recovery flask equipped with a reflux pipe, and the air in the recovery flask was replaced with argon. After that, irradiation with microwaves (2.45 GHz, 100 W) was performed for 1 hour to cause a reaction. The solvent was distilled off, and then the obtained residue was washed with ethanol and filtered, so that a dinuclear complex [Ir(mppm)₂Cl]₂ (dark green powder, yield of 77%) was obtained. A synthesis scheme (b-2) of Step 2 is shown below.

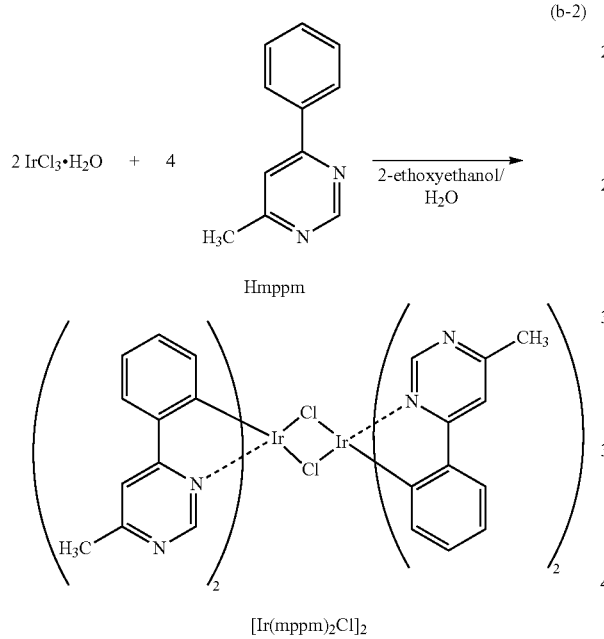

⟨Step 3: Synthesis of (Acetylacetonato)bis(6-methyl-4-phenylpyrimidinato)iridium(III) (Abbreviation: [Ir(mppm)₂(acac)])⟩

Furthermore, 40 mL of 2-ethoxyethanol, 1.84 g of the dinuclear complex [Ir(mppm)₂Cl]₂ obtained in Step 2, 0.48 g of acetylacetone, and 1.73 g of sodium carbonate were put into a recovery flask equipped with a reflux pipe, and the air in the recovery flask was replaced with argon. After that, irradiation with microwaves (2.45 GHz, 120 W) was performed for 60 minutes to cause a reaction. The solvent was distilled off, the obtained residue was dissolved in dichloromethane, and filtration was performed to remove insoluble matter. The obtained filtrate was washed with water and then with saturated saline, and was dried with magnesium sulfate. The solution after drying was filtered. The solvent of this solution was distilled off, and then the obtained residue was purified by silica gel column chromatography using dichloromethane and ethyl acetate as a developing solvent in a volume ratio of 4:1. After that, recrystallization was carried out with a mixed solvent of dichloromethane and hexane, so that the objective yellow powder (yield of 22%) was obtained. A synthesis scheme (b-3) of Step 3 is shown below.

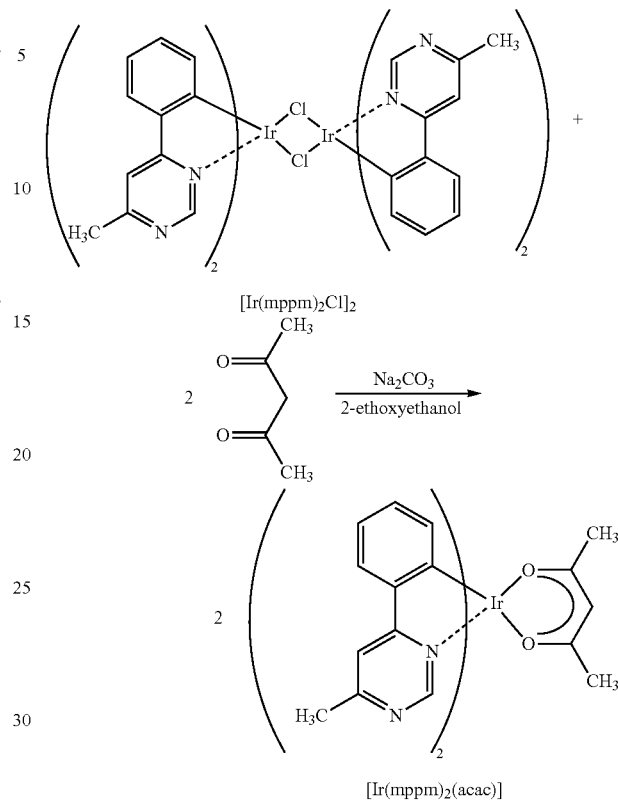

An analysis result by nuclear magnetic resonance spectrometry (¹H NMR) of the yellow powder obtained in Step 3 is described below. These results revealed that the organometallic complex [Ir(mppm)₂(acac)] was obtained.

¹H NMR, δ(CDCl₃): 1.78 (s, 6H), 2.81 (s, 6H), 5.24 (s, 1H), 6.37 (d, 2H), 6.77 (t, 2H), 6.85 (t, 2H), 7.61-7.63 (m, 4H), 8.97 (s, 2H).

Reference Example 3

The following shows a synthetic example of an organometallic complex (acetylacetonato)bis(6-tert-butyl-4-phenylpyrimidinato)iridium(III) (another name; bis[2-(6-tert-butyl-4-pyrimidinyl-κN3)phenyl-κC](2,4-pentanedionato-κ²O,O')iridium(III)) (abbreviation: [Ir(tBuppm)₂(acac)]), which is used in the above Examples. The structure of [Ir(tBuppm)₂(acac)] is shown below.

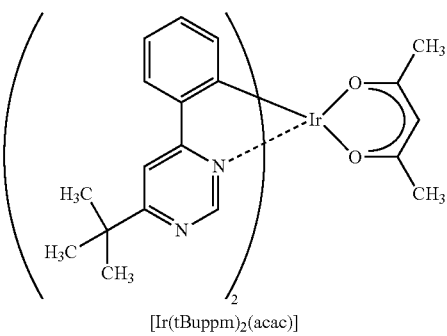

⟨Step 1: Synthesis of 4-tert-Butyl-6-phenylpyrimidine (Abbreviation: HtBuppm)⟩

First, 22.5 g of 4,4-dimethyl-1-phenylpentane-1,3-dione and 50 g of formamide were put into a recovery flask equipped with a reflux pipe, and the air in the flask was replaced with nitrogen. This reaction container was heated, so that the reacted solution was refluxed for 5 hours. After that, this solution was poured into an aqueous solution of sodium hydroxide, and an organic layer was extracted with dichloromethane. The obtained organic layer was washed with water and saturated saline, and dried with magnesium sulfate. The solution after drying was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained. A synthetic scheme (c-1) of Step 1 is shown below.

(c-1)

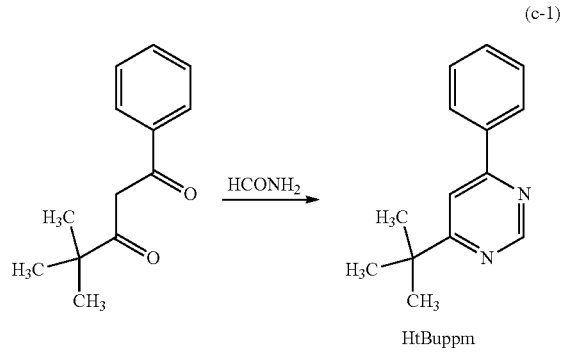

⟨Step 2: Synthesis of Di-μ-chloro-bis[bis(6-tert-butyl-4-phenylpyrimidinato)iridium(III)] (Abbreviation: [Ir(tBuppm)$_2$Cl]$_2$)⟩

Next, 15 mL of 2-ethoxyethanol, 5 mL of water, 1.49 g of HtBuppm obtained in Step 1, and 1.04 g of iridium chloride hydrate (IrCl$_3$·H$_2$O) were put into a recovery flask equipped with a reflux pipe, and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol, so that a dinuclear complex [Ir(tBuppm)$_2$Cl]$_2$ (yellow green powder, yield of 73%) was obtained. A synthesis scheme (c-2) of Step 2 is shown below.

(c-2)

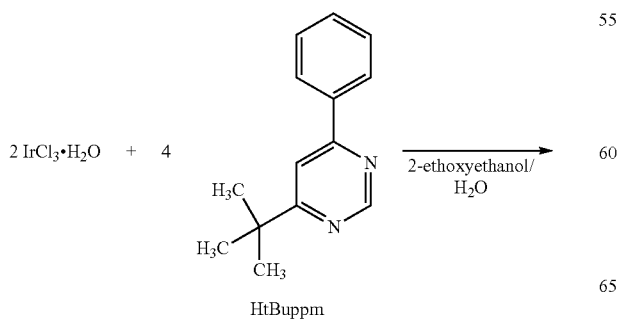

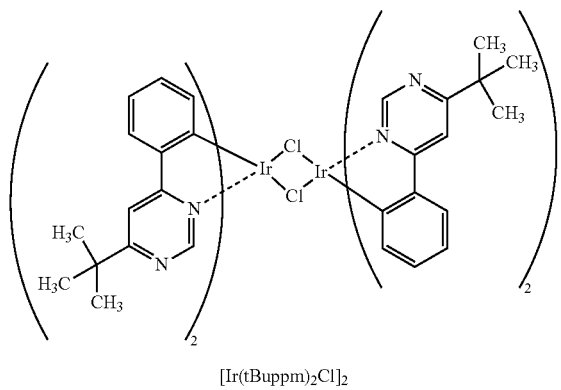

[Ir(tBuppm)$_2$Cl]$_2$

⟨Step 3: Synthesis of (Acetylacetonato)bis(6-tert-butyl-4-phenylpyrimidinato)iridium(III) (Abbreviation; [Ir(tBuppm)$_2$(acac)])⟩

Further, 40 mL of 2-ethoxyethanol, 1.61 g of the dinuclear complex [Ir(tBuppm)$_2$Cl]$_2$ obtained in Step 2, 0.36 g of acetylacetone, and 1.27 g of sodium carbonate were put into a recovery flask equipped with a reflux pipe, and the air in the flask was replaced with argon. After that, irradiation with microwaves (2.45 GHz, 120 W) was performed for 60 minutes to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized with a mixed solvent of dichloromethane and hexane, so that the objective substance was obtained as yellow powder (yield of 68%). A synthesis scheme (c-3) of Step 3 is shown below.

(c-3)

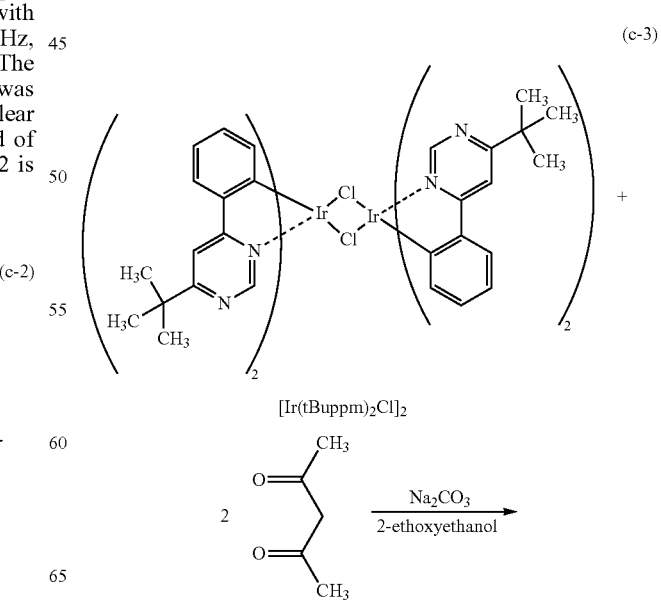

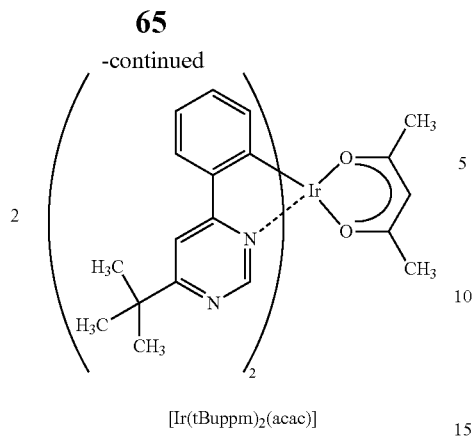

[Ir(tBuppm)₂(acac)]

An analysis result by nuclear magnetic resonance spectrometry (¹H NMR) of the yellow powder obtained in Step 3 is described below. These results revealed that the organometallic complex [Ir(tBuppm)₂(acac)] was obtained.

¹H NMR. δ(CDCl₃): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

Reference Example 4

The following shows a method of synthesizing 2-[3-(dibenzothiophen-4-yl)phenyl]dibenzo[ƒ,h]quinoxaline (abbreviation: 2mDBTPDBq-II) which is used in Examples.

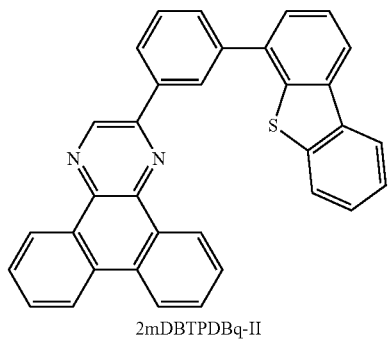 [SMILES: c1cc(-c2cnc3c4ccccc4c4ccccc4c3n2)cc(-c2cccc3c2sc2ccccc23)c1]

2mDBTPDBq-II

⟨Synthesis of 2-[3-(Dibenzothiophen-4-yl)phenyl] dibenzo[ƒ,h]quinoxaline (Abbreviation: 2mDBTPDBq-II)⟩

A synthesis scheme (d-1) of 2-[3-(dibenzothiophen-4-yl) phenyl]dibenzo[ƒ,h]quinoxaline (abbreviation: 2mDBTPDBq-II) is shown below.

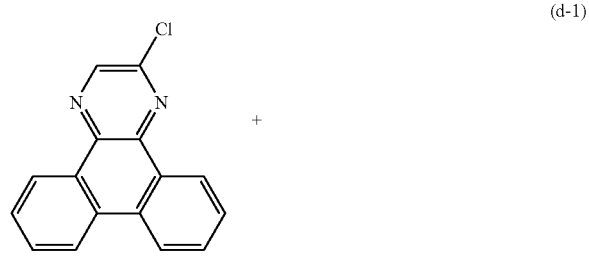

(d-1)

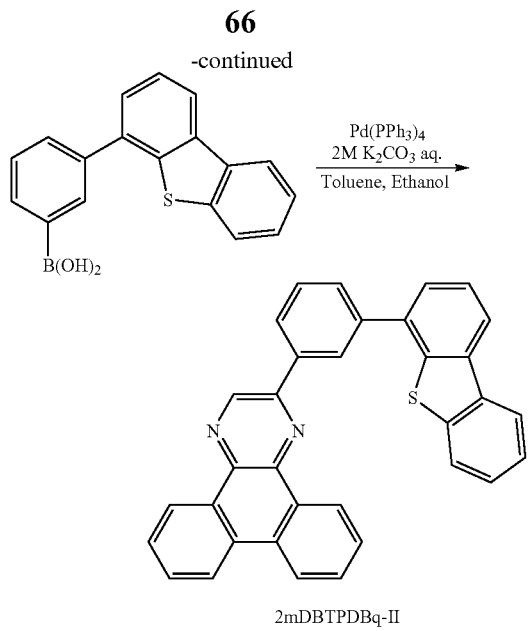

2mDBTPDBq-II

First, 5.3 g (20 mmol) of 2-chlorodibenzo[ƒ,h]quinoxaline, 6.1 g (20 mmol) of 3-(dibenzothiophen-4-yl)phenylboronic acid, 460 mg (0.4 mmol) of tetrakis(triphenylphosphine)palladium(0), 300 mL of toluene, 20 mL of ethanol, and 20 mL of a 2M aqueous solution of potassium carbonate were put in a 2-L three-neck flask. The mixture was degassed by being stirred under reduced pressure, and the air in the three-neck flask was replaced with nitrogen. This mixture was stirred under a nitrogen stream at 100° C. for 7.5 hours. After cooled to room temperature, the obtained mixture was filtered to give a white residue. The obtained residue was washed with water and ethanol in this order, and then dried. The obtained solid was dissolved in about 600 mL of hot toluene, followed by suction filtration through Celite and Florisil, whereby a clear colorless filtrate was obtained. The obtained filtrate was concentrated and purified by silica gel column chromatography using about 700 mL of silica gel. The chromatography was carried out using hot toluene as a developing solvent. Acetone and ethanol were added to the solid obtained here, followed by irradiation with ultrasonic waves. Then, the generated suspended solid was collected by filtration and the obtained solid was dried, so that 7.85 g of white powder was obtained in 80% yield.

The above objective substance was relatively soluble in hot toluene, but was a material that was likely to be precipitated when cooled. Further, the substance was poorly soluble in other organic solvents such as acetone and ethanol. Hence, the utilization of these different degrees of solubility resulted in a high-yield synthesis by a simple method as above. Specifically, after the reaction finished, the mixture was returned to room temperature and the precipitated solid was collected by filtration, whereby most impurities were able to be easily removed. Further, by the column chromatography with hot toluene as a developing solvent, the objective substance, which is likely to be precipitated, was able to be readily purified.

By a train sublimation method, 4.0 g of the obtained white powder was purified. In the purification, the white powder was heated at 300° C. under a pressure of 5.0 Pa with a flow rate of argon gas of 5 mL/min. After the purification, the objective substance was obtained in a yield of 88% as 3.5 g of white powder.

A nuclear magnetic resonance spectrometry ($^1$H NMR) identified this compound as the objective 2-[3-(dibenzothiophen-4-yl)phenyl]dibenzo[f,h]quinoxaline (abbreviation: 2mDBTPDBq-II).

$^1$H NMR data of the obtained substance are shown below.
$^1$H NMR (CDCl$_3$, 300 MHz): δ(ppm)=7.45-7.52 (m, 2H), 7.59-7.65 (m, 2H), 7.71-7.91 (m, 7H), 8.20-8.25 (m, 2H), 8.41 (d, J=7.8 Hz, 1H), 8.65 (d, J=7.5 Hz, 2H), 8.77-8.78 (m, 1H), 9.23 (dd, J=7.2 Hz, 1.5 Hz, 1H), 9.42 (dd, J=7.8 Hz, 1.5 Hz, 1H), 9.48 (s, 1H).

EXPLANATION OF REFERENCE

102: EL layer, 103: first electrode, 108: second electrode, 701: hole-injection layer, 702: hole-transport layer, 703: light-emitting layer, 704: electron-transport layer, 705: electron-injection layer, 706: electron-injection buffer layer, 707: electron-relay layer, 708: composite material layer, 800: first EL layer, 801: second EL layer, 803: charge generation layer, 1100: substrate, 1101; first electrode, 1103; second electrode, 1111: hole-injection layer, 1112: hole-transport layer, 1113: light-emitting layer, 1114a: first electron-transport layer, 1114b: second electron-transport layer, 1115: electron-injection layer.

This application is based on Japanese Patent Application serial no. 2011-031426 filed with Japan Patent Office on Feb. 16, 2011, the entire contents of which are hereby incorporated by reference.

The invention claimed is:

1. A light-emitting element comprising:
a pair of electrodes; and
a light-emitting layer comprising a guest material and a host material between the pair of electrodes,
wherein the guest material is an iridium complex,
wherein the host material is a mixed material comprising a carbazole compound having a carbazol-3-yl group,
wherein a peak of an emission spectrum of the host material overlaps with the lowest-energy-side absorption band in an absorption spectrum of the guest material, and
wherein a difference between an energy value of the peak of the emission spectrum of the host material and an energy value of a peak of the lowest-energy-side absorption band in the absorption spectrum of the guest material is 0.2 eV or less.

2. The light-emitting element according to claim 1,
wherein the mixed material comprises a heterocyclic compound, and
wherein the heterocyclic compound is different from the carbazole compound in the light-emitting layer.

3. The light-emitting element according to claim 1, further comprising:
a hole-injection layer,
wherein the hole-injection layer comprise an aromatic amine compound and an electron acceptor.

4. The light-emitting element according to claim 1, further comprising:
a hole transport layer,
wherein the hole transport layer comprises an aromatic amine compound, and
wherein the aromatic amine compound comprises a fluorenyl group.

5. The light-emitting element according to claim 1,
wherein one of the electrodes comprises ytterbium.

6. The light-emitting element according to claim 1, further comprising:
an electron-injection layer,
wherein the electron-injection layer comprises ytterbium.

7. The light-emitting element according to claim 1,
wherein the lowest-energy-side absorption band is an absorption wavelength corresponding to direct transition from a singlet ground state to a triplet excitation state.

8. The light-emitting element according to claim 1,
wherein a level of a triplet excitation energy of the host material is higher than a level of a triplet excitation energy of the guest material.

9. The light-emitting element according to claim 1,
wherein a fluorescence spectrum of the host material and a phosphorescence spectrum of the host material overlap with the lowest-energy-side absorption band in the absorption spectrum of the guest material.

10. The light-emitting element according to claim 1,
wherein the difference between the energy value of the peak of the emission spectrum of the host material and the energy value of the peak of the lowest-energy-side absorption band in the absorption spectrum of the guest material is 0.1 eV or less.

11. A light-emitting element comprising:
a pair of electrodes; and
a light-emitting layer comprising a guest material and a host material between the pair of electrodes,
wherein the guest material is an iridium complex,
wherein the host material is a mixed material comprising a carbazole compound including a first carbazole ring and a second carbazole ring,
wherein the first carbazole ring at 3-position bonds to the second carbazole ring at 3-position,
wherein a peak of an emission spectrum of the host material overlaps with the lowest-energy-side absorption band in an absorption spectrum of the guest material, and
wherein a difference between an energy value of the peak of the emission spectrum of the host material and an energy value of a peak of the lowest-energy-side absorption band in the absorption spectrum of the guest material is 0.2 eV or less.

12. The light-emitting element according to claim 11,
wherein the mixed material comprises a heterocyclic compound, and
wherein the heterocyclic compound is different from the carbazole compound in the light-emitting layer.

13. The light-emitting element according to claim 11, further comprising:
a hole-injection layer,
wherein the hole-injection layer comprise an aromatic amine compound and an electron acceptor.

14. The light-emitting element according to claim 11, further comprising:
a hole transport layer,
wherein the hole transport layer comprises an aromatic amine compound, and
wherein the aromatic amine compound comprises a fluorenyl group.

15. The light-emitting element according to claim 11,
wherein one of the electrodes comprises ytterbium.

16. The light-emitting element according to claim 11, further comprising:
an electron-injection layer,
wherein the electron-injection layer comprises ytterbium.

17. The light-emitting element according to claim 11,
wherein the lowest-energy-side absorption band is an absorption wavelength corresponding to direct transition from a singlet ground state to a triplet excitation state.

18. The light-emitting element according to claim 11,
wherein a level of a triplet excitation energy of the host material is higher than a level of a triplet excitation energy of the guest material.

19. The light-emitting element according to claim 11,
wherein a fluorescence spectrum of the host material and a phosphorescence spectrum of the host material overlap with the lowest-energy-side absorption band in the absorption spectrum of the guest material.

20. The light-emitting element according to claim 11,
wherein the difference between the energy value of the peak of the emission spectrum of the host material and the energy value of the peak of the lowest-energy-side absorption band in the absorption spectrum of the guest material is 0.1 eV or less.

21. A light-emitting element comprising:
a pair of electrodes; and
a light-emitting layer comprising a guest material and a host material between the pair of electrodes,
wherein the guest material is an iridium complex,
wherein the host material is a mixed material comprising a carbazole compound,
wherein the carbazole compound comprises two carbazole rings directly bonded to each other,
wherein a peak of an emission spectrum of the host material overlaps with the lowest-energy-side absorption band in an absorption spectrum of the guest material, and
wherein a difference between an energy value of the peak of the emission spectrum of the host material and an energy value of a peak of the lowest-energy-side absorption band in the absorption spectrum of the guest material is 0.2 eV or less.

22. The light-emitting element according to claim 21,
wherein the mixed material comprises a heterocyclic compound, and
wherein the heterocyclic compound is different from the carbazole compound in the light-emitting layer.

23. The light-emitting element according to claim 21, further comprising:
a hole-injection layer,
wherein the hole-injection layer comprise an aromatic amine compound and an electron acceptor.

24. The light-emitting element according to claim 21, further comprising:
a hole transport layer,
wherein the hole transport layer comprises an aromatic amine compound, and
wherein the aromatic amine compound comprises a fluorenyl group.

25. The light-emitting element according to claim 21,
wherein one of the electrodes comprises ytterbium.

26. The light-emitting element according to claim 21,
wherein the lowest-energy-side absorption band is an absorption wavelength corresponding to direct transition from a singlet ground state to a triplet excitation state.

27. The light-emitting element according to claim 21,
wherein a level of a triplet excitation energy of the host material is higher than a level of a triplet excitation energy of the guest material.

28. The light-emitting element according to claim 21,
wherein a fluorescence spectrum of the host material and a phosphorescence spectrum of the host material overlap with the lowest-energy-side absorption band in the absorption spectrum of the guest material.

29. The light-emitting element according to claim 21,
wherein the difference between the energy value of the peak of the emission spectrum of the host material and the energy value of the peak of the lowest-energy-side absorption band in the absorption spectrum of the guest material is 0.1 eV or less.

30. A light-emitting element comprising:
a pair of electrodes; and
a light-emitting layer comprising a guest material and a host material between the pair of electrodes,
wherein the guest material is an iridium complex,
wherein the mixed material comprises a carbazole compound and a heterocyclic compound,
wherein a peak of an emission spectrum of the host material overlaps with the lowest-energy-side absorption band in an absorption spectrum of the guest material,
wherein a peak wavelength of the lowest-energy-side absorption band is in a range from 490 nm to 530 nm, and
wherein a difference between an energy value of the peak of the emission spectrum of the host material and an energy value of the peak of the lowest-energy-side absorption band in the absorption spectrum of the guest material is 0.2 eV or less.

31. The light-emitting element according to claim 30, further comprising:
a hole-injection layer,
wherein the hole-injection layer comprise an aromatic amine compound and an electron acceptor.

32. The light-emitting element according to claim 30, further comprising:
a hole transport layer,
wherein the hole transport layer comprises an aromatic amine compound, and
wherein the aromatic amine compound comprises a fluorenyl group.

33. The light-emitting element according to claim 30,
wherein one of the electrodes comprises ytterbium.

34. The light-emitting element according to claim 30,
wherein the lowest-energy-side absorption band is an absorption wavelength corresponding to direct transition from a singlet ground state to a triplet excitation state.

35. The light-emitting element according to claim 30,
wherein a level of a triplet excitation energy of the host material is higher than a level of a triplet excitation energy of the guest material.

36. The light-emitting element according to claim 30,
wherein a fluorescence spectrum of the host material and a phosphorescence spectrum of the host material overlap with the lowest-energy-side absorption band in an absorption spectrum of the guest material.

37. The light-emitting element according to claim 30,
wherein the difference between the energy value of the peak of the emission spectrum of the host material and the energy value of the peak of the lowest-energy-side absorption band in the absorption spectrum of the guest material is 0.1 eV or less.

38. A light-emitting element comprising:
a pair of electrodes; and
a light-emitting layer comprising a guest material and a host material between the pair of electrodes, wherein an absorption spectrum of the guest material comprises a first absorption peak and a second absorption peak, wherein the first absorption peak is located on the lowest-energy-side absorption band in the absorption spectrum of the guest material, wherein the second absorption peak is located on a shorter wavelength than the first absorption peak in the absorption spectrum, wherein the second absorption peak is located next to the first absorption peak, wherein a peak of an emission spectrum of the host material is located on a longer wavelength than the second absorption peak.

39. The light-emitting element according to claim 38, further comprising:
a hole-injection layer,
wherein the hole-injection layer comprise an aromatic amine compound and an electron acceptor.

40. The light-emitting element according to claim 38, further comprising:
a hole transport layer,
wherein the hole transport layer comprises an aromatic amine compound, and
wherein the aromatic amine compound comprises a fluorenyl group.

41. The light-emitting element according to claim 38, wherein one of the electrodes comprises ytterbium.

42. The light-emitting element according to claim 38, wherein the lowest-energy-side absorption band is an absorption wavelength corresponding to direct transition from a singlet ground state to a triplet excitation state.

43. The light-emitting element according to claim 38, wherein a level of a triplet excitation energy of the host material is higher than a level of a triplet excitation energy of the guest material.

44. The light-emitting element according to claim 38, wherein a fluorescence spectrum of the host material and a phosphorescence spectrum of the host material overlap with the lowest-energy-side absorption band in the absorption spectrum of the guest material.

45. The light-emitting element according to claim 38, wherein a difference between an energy value of the peak of the emission spectrum of the host material and an energy value of a peak of the lowest-energy-side absorption band in the absorption spectrum of the guest material is 0.2 eV or less.

46. The light-emitting element according to claim 45, wherein the difference between the energy value of the peak of the emission spectrum of the host material and the energy value of the peak of the lowest-energy-side absorption band in the absorption spectrum of the guest material is 0.1 eV or less.

47. A light-emitting element comprising:
a pair of electrodes; and
a light-emitting layer comprising a guest material and a host material between the pair of electrodes,
wherein an absorption spectrum of the guest material comprises a first absorption peak and a second absorption peak,
wherein the first absorption peak is located on the longest-wavelength-side in the absorption spectrum of the guest material,
wherein the second absorption peak is located on a shorter wavelength side than the first absorption peak in the absorption spectrum,
wherein the second absorption peak is located next to the first absorption peak,
wherein a peak of an emission spectrum of the host material is closer to the first absorption peak than the second absorption peak.

48. The light-emitting element according to claim 47, further comprising:
a hole-injection layer,
wherein the hole-injection layer comprise an aromatic amine compound and an electron acceptor.

49. The light-emitting element according to claim 47, further comprising:
a hole transport layer,
wherein the hole transport layer comprises an aromatic amine compound, and
wherein the aromatic amine compound comprises a fluorenyl group.

50. The light-emitting element according to claim 47, wherein one of the electrodes comprises ytterbium.

51. The light-emitting element according to claim 47, wherein the lowest-energy-side absorption band is an absorption wavelength corresponding to direct transition from a singlet ground state to a triplet excitation state.

52. The light-emitting element according to claim 47, wherein a level of a triplet excitation energy of the host material is higher than a level of a triplet excitation energy of the guest material.

53. The light-emitting element according to claim 47, wherein a fluorescence spectrum of the host material and a phosphorescence spectrum of the host material overlap with the lowest-energy-side absorption band in the absorption spectrum of the guest material.

54. The light-emitting element according to claim 47, wherein a difference between an energy value of a peak of the emission spectrum of the host material and an energy value of a peak of the lowest-energy-side absorption band in the absorption spectrum of the guest material is 0.2 eV or less.

55. The light-emitting element according to claim 54, wherein the difference between the energy value of the peak of the emission spectrum of the host material and the energy value of the peak of the lowest-energy-side absorption band in the absorption spectrum of the guest material is 0.1 eV or less.

* * * * *